United States Patent
Okamoto et al.

(10) Patent No.: US 10,424,665 B2
(45) Date of Patent: Sep. 24, 2019

(54) SEMICONDUCTOR DEVICE AND METHOD OF MANUFACTURING THE SEMICONDUCTOR DEVICE

(71) Applicant: Renesas Electronics Corporation, Koutou-ku, Tokyo (JP)

(72) Inventors: Shinichi Okamoto, Tokyo (JP); Tsutomu Okazaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 5 days.

(21) Appl. No.: 15/690,233

(22) Filed: Aug. 29, 2017

(65) Prior Publication Data

US 2018/0122930 A1    May 3, 2018

(30) Foreign Application Priority Data

Oct. 28, 2016  (JP) ................... 2016-211436

(51) Int. Cl.
*H01L 29/78* (2006.01)
*H01L 27/088* (2006.01)
*H01L 21/8234* (2006.01)

(52) U.S. Cl.
CPC .... *H01L 29/785* (2013.01); *H01L 21/823431* (2013.01); *H01L 21/823462* (2013.01); *H01L 27/0886* (2013.01); *H01L 29/7853* (2013.01)

(58) Field of Classification Search
CPC .............. H01L 27/0886; H01L 29/785; H01L 29/66545; H01L 21/823412; H01L 21/823431; H01L 21/823821; H01L 27/0924; H01L 29/66795; H01L 29/0649; H01L 21/823481; H01L 29/0653; H01L 29/0847; H01L 29/7816; H01L 29/7851; H01L 21/08
See application file for complete search history.

(56) References Cited

U.S. PATENT DOCUMENTS 9,023,720 B2    5/2015  Fuse et al.
2006/0043455 A1  3/2006  Batra et al.
(Continued)

FOREIGN PATENT DOCUMENTS

JP  H01-082672 A  3/1989
JP  2012-049286 A  3/2012

OTHER PUBLICATIONS

Extended European Search Report dated Mar. 21, 2018, in European Patent Application No. EP17190335.4.

*Primary Examiner* — Roy K Potter
(74) *Attorney, Agent, or Firm* — Shapiro, Gabor and Rosenberger, PLLC

(57) ABSTRACT

There is improved performance of a semiconductor device including a fin-type low-withstand-voltage transistor and a fin-type high-withstand-voltage transistor. A low-withstand-voltage transistor is formed on each of a plurality of first fins isolated from each other by a first element isolation film, and a high-withstand-voltage transistor, which has a channel region including tops and side surfaces of a plurality of second fins and a top of a semiconductor substrate between the second fins adjacent to each other, is formed. At this time, a top of a second element isolation film surrounding the second fins including part of the channel region of one high-withstand-voltage transistor is lower than a top of the first element isolation film.

15 Claims, 28 Drawing Sheets

(56) References Cited

U.S. PATENT DOCUMENTS

| | | | |
|---|---|---|---|
| 2011/0260294 A1* | 10/2011 | Oh | H01L 21/76229 257/607 |
| 2013/0134520 A1* | 5/2013 | Maeda | H01L 21/823418 257/368 |
| 2013/0175611 A1* | 7/2013 | Shinohara | H01L 21/02697 257/334 |
| 2014/0151807 A1 | 6/2014 | Chi et al. | |
| 2016/0307803 A1 | 10/2016 | Mun et al. | |

* cited by examiner

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2016-211436 filed on Oct. 28, 2016 including the specification, drawings and abstract is incorporated herein by reference in its entirety.

BACKGROUND

The present invention relates to a semiconductor device and a method of manufacturing the semiconductor device, and more particularly relates to a technique effectively applied to a semiconductor device including a fin field effect transistor.

A fin field effect transistor is known as a field effect transistor that operates at high speed, and allows a reduction in leakage current, power consumption, and size. The fin field effect transistor (FINFET) is, for example, a semiconductor element that has a channel layer including a pattern of a plate-like (wall-like) semiconductor layer protruding above a substrate, and has a gate electrode formed so as to straddle the pattern.

Japanese Unexamined Patent Publication No. Hei01 (1989)-82672 describes that a metal oxide semiconductor field effect transistor (MOSFET) has a plurality of trenches in a main surface, in which a channel is formed, of a semiconductor substrate to expand an effective channel width.

Japanese Unexamined Patent Publication No. 2012-49286 describes that ion implantation is performed to a fin in an oblique direction, thereby the same amount of an impurity is introduced into a side surface portion and an upper planar portion of the fin.

In general, a semiconductor device is required to be reduced in size and improved in degree of integration, and a fin field effect transistor is now the subject of interest as one structure to meet such requirements. A low resistance FET configuring a logic circuit or an FET configuring a flash memory can be formed on a fin. On the other hand, a large current must be applied to a high-withstand-voltage MOSFET used in a circuit, which generates a high voltage applied for write and erase of a flash memory, and the like. Thus, it is difficult to provide a high-withstand-voltage fin MOSFET having a structure similar to that of a low-withstand-voltage transistor.

Specifically, although the low resistance FET and the FET configuring the flash memory can be reduced in size by using the fin structure, the high-withstand-voltage FET is less likely to be reduced in size, which hinders a reduction in size of a semiconductor device.

Other objects and novel features will be clarified from the description of this specification and the accompanying drawings.

A typical one of embodiments disclosed in the present application is briefly summarized as follows.

A semiconductor device of one embodiment includes a low-withstand-voltage transistor provided on a fin, and a high-withstand-voltage transistor having a channel including respective surfaces of a plurality of other fins and a top of a semiconductor substrate between the fins.

A method of manufacturing a semiconductor device according to one embodiment is to form a low-withstand-voltage transistor provided on a fin, and form a high-withstand-voltage transistor having a channel including respective surfaces of a plurality of other fins and atop of a semiconductor substrate between the fins.

According to one embodiment disclosed in the present application, performance of a semiconductor device can be improved.

DETAILED DESCRIPTION

Figure 1:
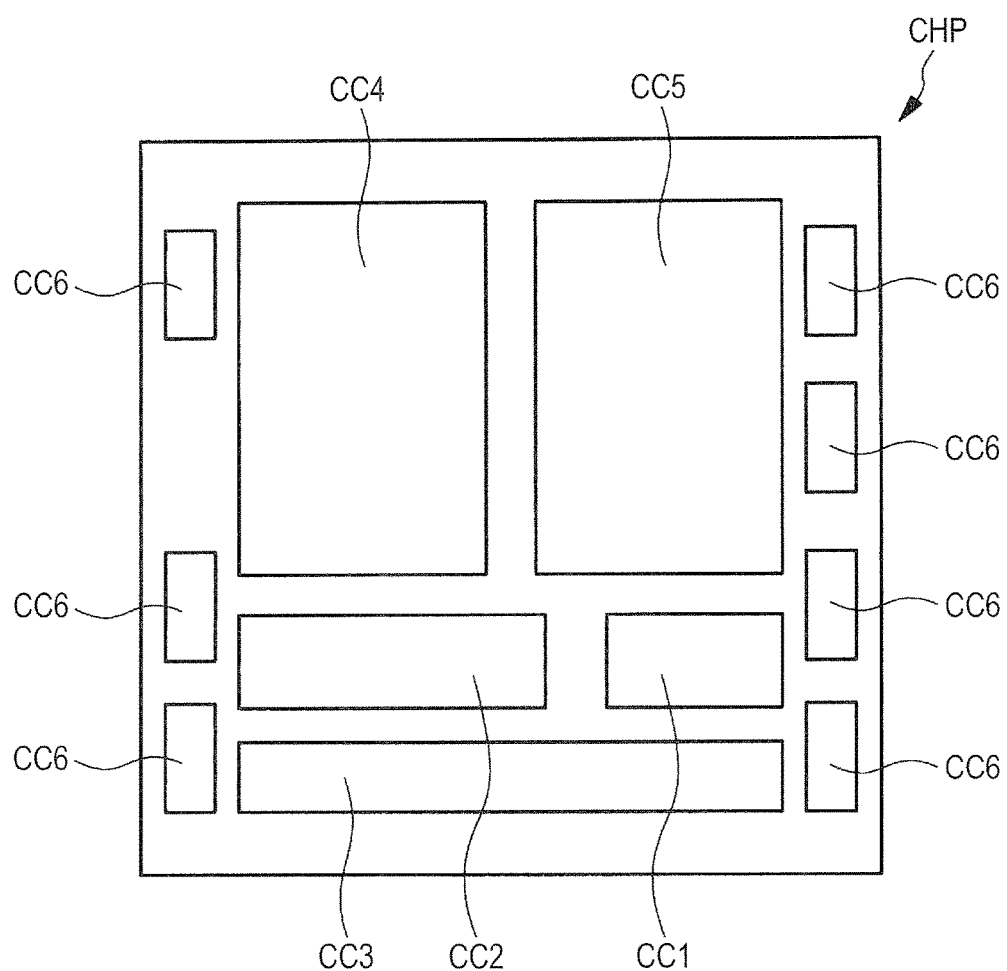
FIG. 1 is a schematic diagram illustrating a layout configuration of a semiconductor chip of a first embodiment of the invention.

Although each of the following embodiments may be dividedly described in a plurality of sections or embodiments for convenience as necessary, they are not unrelated to one another except for the particularly defined case, and are in a relationship where one is a modification, details, supplementary explanation, or the like of part or all of another one. In each of the following embodiments, when the number of elements and the like (including the number, a numerical value, amount, and a range) is mentioned, the number is not limited to a specified number except for the particularly defined case and for the case where the number is principally clearly limited to the mentioned number. In other words, the number may be not less than or not more than the mentioned number. Furthermore, it will be appreciated that in each of the following embodiments, a component (including an element step etc.) of the embodiment is not necessarily indispensable except for the particularly defined case and for the case where the component is considered to be indispensable in principle. Similarly, in each of the following embodiments, when a shape or a positional relationship of a component or the like is described, any configuration substantially closely related to or similar to such a shape or the like should be included except for the particularly defined case and for the case where such a configuration is considered to be not included in principle. The same holds true for each of the numerical value and the range.

Hereinafter, some embodiments will be described in detail with reference to the accompanying drawings. In all drawings for explaining the embodiments, components having the same function are designated by the same reference numeral, and duplicated description is omitted. In the following embodiments, the same or similar portion is not repeatedly described in principle except for a particularly required case.

First Embodiment

Exemplary Layout Configuration of Semiconductor Chip

A semiconductor device having a nonvolatile memory of a first embodiment is described with reference to some drawings. A layout configuration of a semiconductor device (semiconductor chip) having a system including a nonvolatile memory is now described. FIG. 1 is a schematic diagram illustrating an exemplary layout configuration of a semiconductor chip CHP of the first embodiment. In FIG. 1, the semiconductor chip CHP includes a central processing unit (CPU) CC1, a random access memory (RAM) CC2, and an analog circuit CC3. The semiconductor chip CHP further includes an electrically erasable programmable read only memory (EEPROM) CC4, a flash memory CC5, and an input/output (I/O) circuit CC6, and thus configures a semiconductor device.

The CPU (circuit) CC1, which may be referred to as a central processing unit, reads and decodes instructions from a memory device, and performs various types of arithmetic operation and of control based on the instructions.

The RAM (circuit) CC2 is a memory that allows memory information to be randomly read therefrom, i.e., allows randomly stored memory information to be read therefrom, and allows memory information to be newly written thereinto. The RAM CC2 is thus also referred to as random-access memory. A static RAM (SRAM) including a static circuit is used as the RAM.

The analog circuit CC3 processes a voltage signal and a current signal, which each vary continuously over time, i.e., processes analog signals, and includes, for example, an amplifier circuit, a conversion circuit, a modulation circuit, an oscillation circuit, and a power supply circuit.

The EEPROM CC4 and the flash memory CC5 are each one of nonvolatile memories, which allows memory information to be electrically rewritten in write operation and erase operation, and are each also called electrically erasable programmable read only memory. A memory cell of the EEPROM CC4 or the flash memory CC5 is configured by, for example, a metal oxide nitride oxide semiconductor (MONOS) transistor for memory or a metal nitride oxide semiconductor (MNOS) transistor for memory. For example, the EEPROM CC4 and the flash memory CC5 are different from each other in that the EEPROM CC4 is a nonvolatile memory that can be erased in bytes while the flash memory CC5 is a nonvolatile memory that can be erased in word lines. In general, the flash memory CC5 stores programs for various types of processing to be executed by the CPU CC1. On the other hand, the EEPROM CC4 stores various data to be rewritten at a high frequency. The EEPROM CC4 or the flash memory CC5 includes a memory cell array including a plurality of nonvolatile memory cells arranged in a matrix, and further includes an address buffer, a row decoder, a column decoder, a verify sense amplifier circuit, a sense amplifier circuit, a write circuit, and the like.

The I/O circuit CC6, which is an input/output circuit, outputs data from within the semiconductor chip CHP to an external device coupled to the semiconductor chip CHP, or receives data from the external device coupled to the semiconductor chip CHP and sends the data into the semiconductor chip CHP, for example.

The semiconductor device of the first embodiment has a memory cell region and a logic circuit region. The memory cell region has a memory cell array including a plurality of nonvolatile memory cells arranged in a matrix. The logic circuit region has the CPU CC1, the RAM CC2, the analog circuit CC3, the I/O circuit CC6, and an address buffer for the EEPROM CC4 or the flash memory CC5, a row decoder, a column decoder, the verify sense amplifier circuit, the sense amplifier circuit, or the write circuit.

Structure of Semiconductor Device

Figure 2:
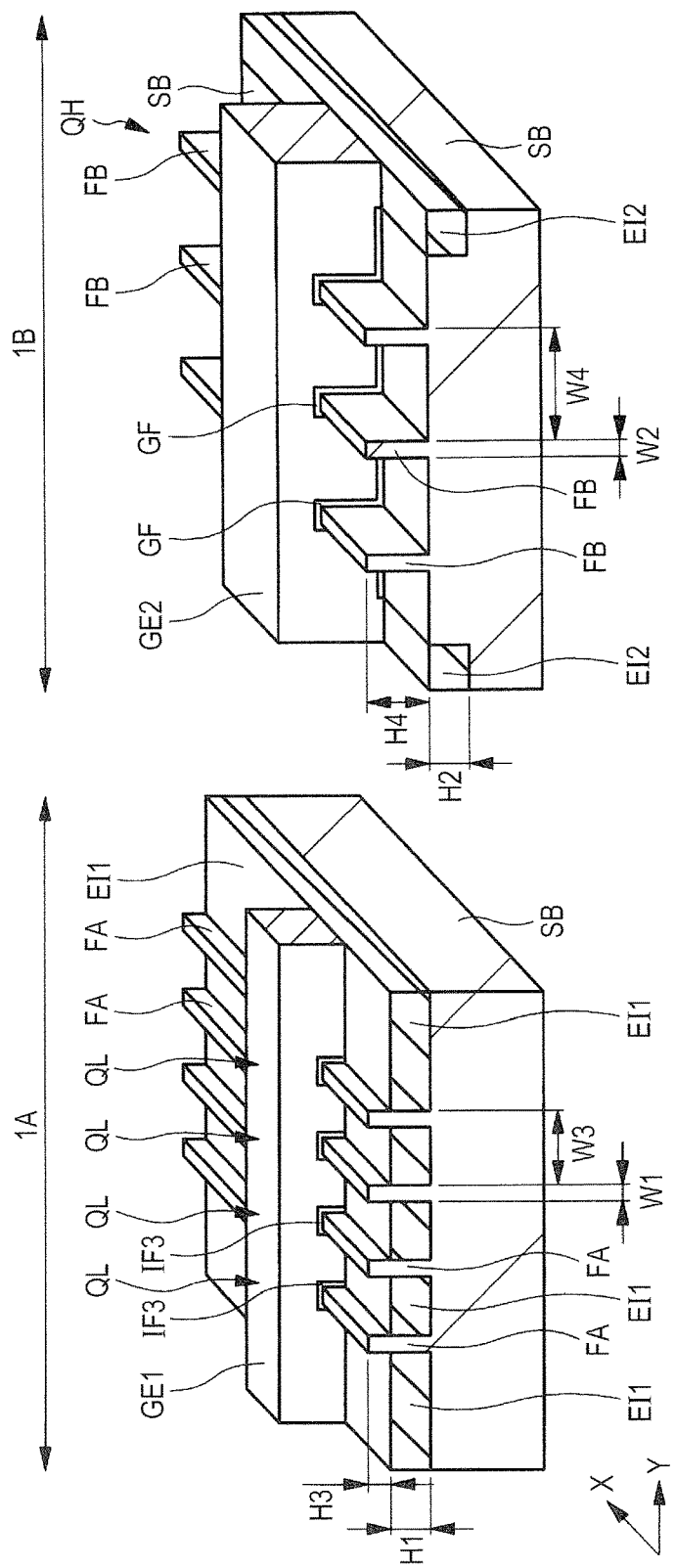
FIG. 2 is a perspective view illustrating the semiconductor device of the first embodiment of the invention.
Figure 3:
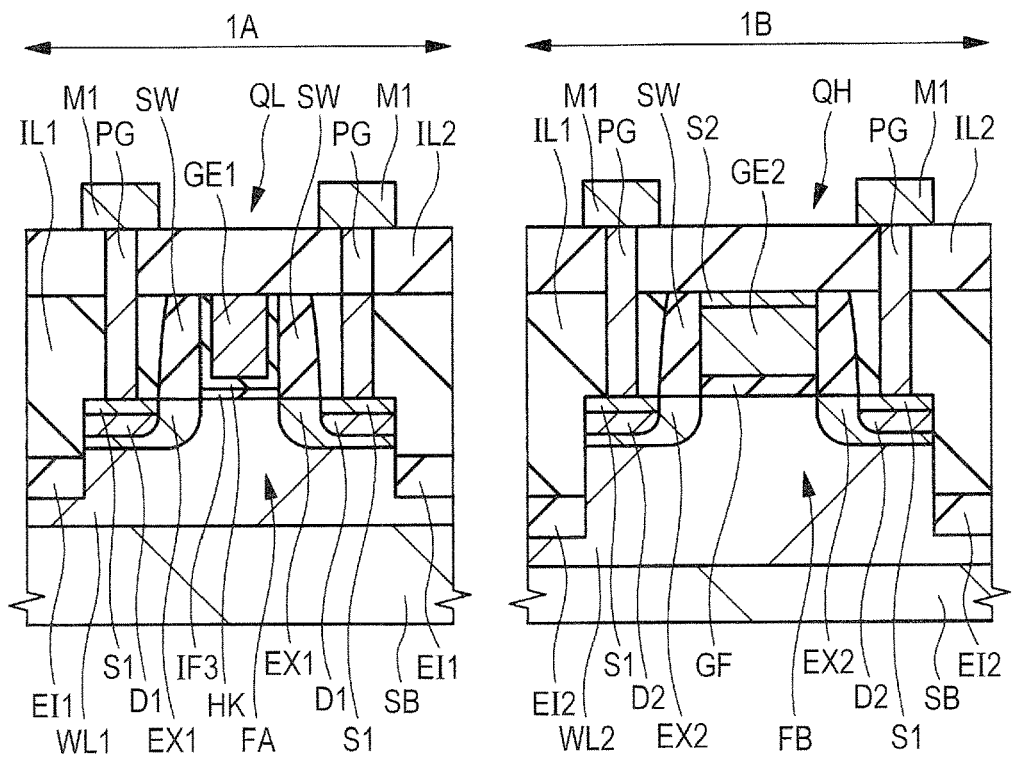
FIG. 3 is a sectional view illustrating the semiconductor device of the first embodiment of the invention.
Figure 4:
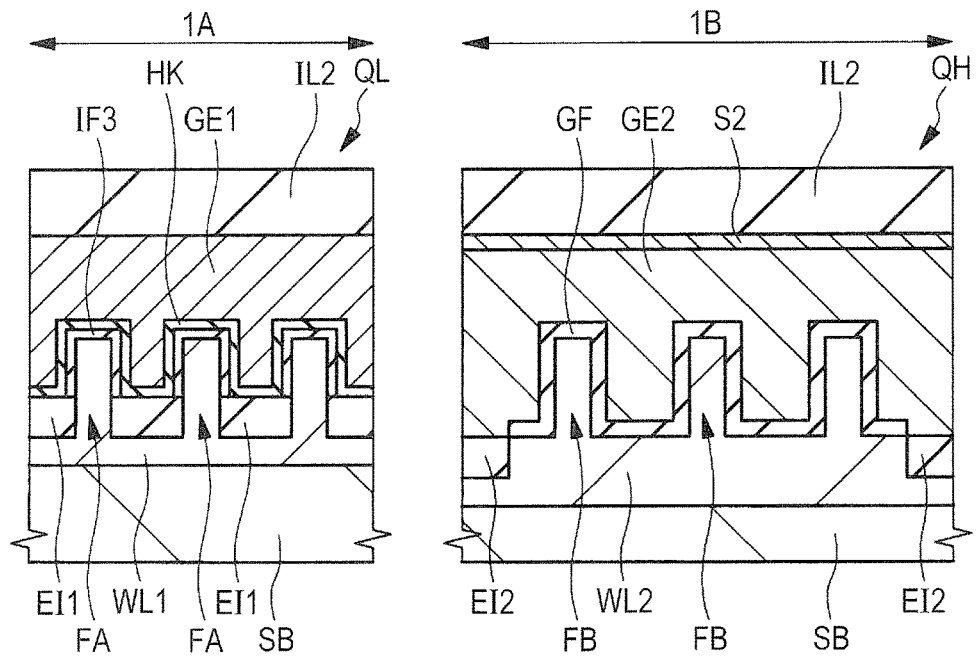
FIG. 4 is a sectional view illustrating the semiconductor device of the first embodiment of the invention.

A structure of the semiconductor device of the first embodiment is described below with reference to FIGS. 2 to 4. FIG. 2 is a perspective view of the semiconductor device of the first embodiment. FIGS. 3 and 4 are each a sectional view of the semiconductor device of the first embodiment. FIGS. 2 to 4 each show a low-withstand-voltage transistor region 1A having a fin-type low-withstand-voltage transistor on its left side and a high-withstand-voltage transistor region 1B having a fin-type high-withstand-voltage transistor on its right side.

FIG. 3 includes cross sections each including one fin along an extending direction (longitudinal direction) of the fin in the low-withstand-voltage transistor region 1A and the high-withstand-voltage transistor region 1B illustrated in FIG. 2. FIG. 4 includes cross sections, each including a plurality of fins and a gate electrode over the fins, along a lateral direction of the fins in the low-withstand-voltage transistor region 1A and the high-withstand-voltage transistor region 1B illustrated in FIG. 2.

FIG. 2 omits sidewalls, source and drain regions, silicide layers, interlayer insulating films on element isolation films and on elements, interconnections, and contact plugs (coupling parts). Although a plurality of elements are probably provided side by side on one fin in a longitudinal direction of the fin, FIG. 3 shows only one transistor on each fin. As illustrated in FIG. 3, although the side surface of the gate electrode GE1 is covered with the high-k film HK as a part of the gate insulating film, FIG. 2 omits the high-k film HK.

As illustrated in FIGS. 2 to 4, the semiconductor device of the first embodiment includes a semiconductor substrate SB. The semiconductor substrate SB is made of, for example, p-type single crystal silicon having a specific resistance of about 1 to 10 Ωcm. The main surface of the semiconductor substrate SB has the low-withstand-voltage transistor region 1A and the high-withstand-voltage transistor region 1B that does not overlap with the low-withstand-voltage transistor region 1A. In region 1A of FIGS. 2 and 4, different numbers of fins are shown for ease in understanding of the drawing. The respective numbers of the fins FA and FB arranged in the Y direction may be larger or smaller than the numbers of the fins FA and FB illustrated in FIG. 2 or 4.

A plurality of fins FA extending in an X direction are arranged at equal intervals in the Y direction over the semiconductor substrate SB in the low-withstand-voltage transistor region 1A. A plurality of fins FB extending in the X direction are arranged at equal intervals in the Y direction over the semiconductor substrate SB in the high-withstand-voltage transistor region 1B. The X direction and the Y direction are each a direction along the main surface of the semiconductor substrate SB, and the X direction is orthogonal to the Y direction. Although the case where both the fins FA and FB in the low-withstand-voltage transistor region 1A and the high-withstand-voltage transistor region 1B extend in the X direction is described herein, the fins FA and FB may extend in different directions from each other.

Each of the fins FA and FB is, for example, a rectangular parallelepiped protrusion (convex portion) selectively protruding from the main surface of the semiconductor substrate SB, and has a wall-like (plate-like) shape. Each of the fins FA and FB, which is a part of the semiconductor substrate SB, is an active region of the semiconductor substrate SB. A space between the adjacent fins FA is filled with an element isolation film EI1, and each fin FA is surrounded by the element isolation film EI1 in planar view. The fin FA is an active region to form a low-withstand-voltage transistor QL. A space between the adjacent fins FB is filled with no element isolation film, and a top, which may be simply referred to as planar portion hereinafter, of the semiconductor substrate SB between the adjacent fins FB is exposed from an element isolation film EI2.

The main surface of the semiconductor substrate SB around the fin FB is also referred to as planar portion herein in addition to that between the adjacent fins FB. In the high-withstand-voltage transistor region 1B, one group including the fins FB arranged in the Y direction is surrounded in planar view by the element isolation film EI2 embedded in a trench formed in the top of the planar portion. The element isolation film EI2 is not provided in a region between the adjacent fins FB and directly below such a region. The fin FB and the planar portion are each an active region to form the high-withstand-voltage transistor QH.

In the low-withstand-voltage transistor region 1A, the lower end portion of the fin FA, i.e., the lower end portion of each side surface of the fin FA is surrounded by the element isolation film EI1 that covers the top (planar portion) of the semiconductor substrate SB between the adjacent fins FA in planar view in the low-withstand-voltage transistor region 1A. In other words, the top of the element isolation film EI1 is located at a height in the middle between the upper end and the lower end of the fin FA. The bottom of the element isolation film EI1 is located at the same height as that of the lower end of the fin FA or the planar portion. However, apart of the fin FA protrudes above the element isolation film EI1. In other words, the region between the adjacent fins is not entirely filled with the element isolation film EI1.

On the other hand, the fin FB is entirely exposed from the element isolation film EI2 in the high-withstand-voltage transistor region 1B. The tops of the fins FA and FB are located at substantially the same height. In addition, the planar portion between the adjacent fins FA and the planar portion between the adjacent fins FB are located at substantially the same height. In other words, the two planar portions around the respective fins FA and FB have substantially the same height. The height referred to in the present application means a distance from the main surface of the semiconductor substrate SB in a direction perpendicular to the main surface of the semiconductor substrate SB, unless otherwise specified. Although the tops of the fins FA and FB can each be described as a main surface of the semiconductor substrate SB, each planar portion and the top of the semiconductor substrate SB having the same height as that of the planar portion are each referred to as the main surface of the semiconductor substrate SB in the first embodiment.

The element isolation film EI1 is an insulating film embedded between the fins FA adjacent to each other, and includes, for example, a silicon oxide film. The element isolation film EI2 is an insulating film embedded in an element isolation trench provided in the planar portion, and includes, for example, a silicon oxide film. The top of the element isolation film EI2 is located at a height substantially equal to the height of the planar portion. Specifically, the top of the element isolation film EI2 is located at a height lower than the top of the element isolation film EI1, and the bottom of the element isolation film EI2 is located at a height lower than the bottom of the element isolation film EI1 and the planar portion. The top of the fin FB is located above the top of the element isolation film EI2. When the top of the element isolation film EI2 excessively retracts in the manufacturing process of the semiconductor device, the top of the element isolation film EI2 is located below the bottom of the element isolation film EI1, below the planar portion between the fins FA adjacent to each other, and below the planar portion around the fins FB.

Each of the fins FA and FB is, for example, a rectangular parallelepiped protrusion protruding from the main surface of the semiconductor substrate SB in a direction perpendicular to the main surface. However, the fins FA and FB may each not necessarily have a rectangular parallelepiped shape, but may have a rectangular shape having rounded corners in sectional view in a short side direction. Although each of the side surfaces of the fins FA and FB may be perpendicular to the main surface of the semiconductor substrate SB, the side surface may have an inclination angle with respect to the main surface of the semiconductor substrate SB. That is, the sectional shape of each of the fins FA and FB is a rectangular parallelepiped or a trapezoid.

A direction, in which the fins FA or FB extend in planar view, is the long side direction (longitudinal direction) of each fin, and the direction orthogonal to the long side direction is the short side direction (lateral direction) of the fin. For example, the fins FA and FB may each have a meandering layout in planar view.

In the low-withstand-voltage transistor region 1A, the gate electrode GE1 is provided over the fins FA with the gate insulating film in between. The gate electrode GE1 extends so as to stride over the fins FA. The gate insulating film includes an insulating film IF3 covering a part of the top and a part of either side surface of each fin FA and a high-k film HK (see FIG. 3) interposed between the insulating film IF3 and the gate electrode GE1. The insulating film IF3 includes, for example, a silicon oxide film, and the high-k film HK is an insulating film made of, for example, HfSiO. The dielectric constant of the high-k film HK as a high dielectric constant film is higher than the dielectric constant of each of silicon oxide and silicon nitride. The high-k film HK is provided so as to cover the side surfaces and the bottom of the gate electrode GE1.

The gate electrode GE1 includes, for example, a first metal film formed on the high-k film HK and a second metal film formed over the high-k film HK with the first metal film in between. The first metal film and the second metal film are not separately shown in the drawings, and the gate electrode GE1 is shown as one metal film. The first metal film is made of, for example, titanium aluminum (TiAl), and the second metal film is made of, for example, aluminum (Al). The gate electrode GE1 being a metal gate electrode mainly includes the second metal film.

The insulating film IF3, the high-k film HK, the gate electrode GE1, the high-k film HK, and the insulating film IF3 are provided in order from a side of one side surface between the side surfaces, which are opposed to each other in the Y direction, of the fins FA. That is, a part of the gate electrode GE1 is embedded between the adjacent fins FA.

A part of the gate electrode GE1 is provided directly over the planar portion with the element isolation film EI1 and the high-k film HK in between in a region between the fins FA adjacent to each other in the Y direction. The planar portion covered with the element isolation film EI1 does not configure the low-withstand-voltage transistor. The top of the element isolation film EI1 is not covered with the insulating film IF3, and is thus in contact with the high-k film HK.

The gate electrode GE2 is provided over the fins FB with a gate insulating film GF in between in the high-withstand-voltage transistor region 1B. The gate electrode GE2 extends so as to stride over the fins FB. The gate insulating film GF includes an insulating film covering a part of the top and a part of either side surface of each fin FB. That insulating film includes, for example, a silicon oxide film. The gate electrode GE2 includes, for example, a polysilicon film. The gate insulating film GF has a thickness larger than the insulating film IF3. Specifically, the insulating film IF3 has a thickness of, for example, 2 to 3 nm, and the gate insulating film GF has a thickness of, for example, 15 nm. The thickness of the gate insulating film GF is larger than the thickness of the stacked film of the insulating film IF3 and the high-k film HK.

The gate insulating film GF, the gate electrode GE2, and the gate insulating film GF are provided between the side surfaces, which are opposed to each other in the Y direction, of the fins FB in order from a one side surface side. That is, a part of the gate electrode GE2 is embedded between the adjacent fins FB.

A part of the gate electrode GE2 is provided directly over the planar portion with the gate insulating film GF in between in a region between the fins FB adjacent to each other in the Y direction. The planar portion covered with the gate electrode GE2 configures a channel region of the high-withstand-voltage transistor QH. The top of the element isolation film EI2 may be covered with the gate electrode GE2.

As illustrated in FIG. 3, a sidewall SW is provided on either side surface of the gate electrode GE1 with the high-k film HK in between, and a sidewall SW is also provided on either side surface of the gate electrode GE2. The sidewall SW includes, for example, a stacked film of a silicon nitride film and a silicon oxide film. However, the silicon nitride film and the silicon oxide film are not separately shown in the drawing.

A well WL1 containing a p-type impurity (for example, boron (B)) is provided in the fin FA in the low-withstand-voltage transistor region 1A. The well WL1 is provided from the top of the fin FA to the inside of the semiconductor substrate SB below the fin FA. A pair of source and drain regions are provided in the top and the side surface of the fin FA exposed from the gate electrode GE1 and the element isolation film EI1. Specifically, a source region and a drain region are provided in the fin FA sandwiching the gate electrode GE1 in the X direction in planar view. In other words, the gate electrode GE1 is sandwiched by the source region and the drain region in planar view.

FIG. 3 shows only the source and drain regions that are each formed in the top of the fin FA, and does not show the source and drain regions that are each formed in the side surface of the fin FA. Each of the source and drain regions includes an extension region EX1 that is an n-type semiconductor region containing a relatively low concentration of an n-type impurity (for example, phosphorus (P) or arsenic (As)), and a diffusion region D1 that is an n-type semiconductor region containing a higher concentration of an n-type impurity (for example, phosphorus (P) or arsenic (As)) than the extension region EX1.

Although the depth of the extension region EX1 is shown to be deeper than the depth of the diffusion region D1, the depth of the diffusion region D1 may be deeper than the depth of the extension region EX1, or the depth of the diffusion region D1 may be equal to the depth of the extension region EX1. Although a level of the diffusion region D1 or the extension region EX1 formed in the top of the fin FA does not reach the height of the top of the element isolation film EI1 in FIG. 3, the level may reach the height of the top of the element isolation film EI1. In an undepicted region, the diffusion region D1 and the extension region EX1 are provided in either side surface of the fin FA so as to extend from the upper end of the side surface of the fin FA to the height of the top of the element isolation film EI1.

Each of the source and drain regions has the extension region EX1 and the diffusion region D1. That is, a pair of extension regions EX1 and a pair of diffusion regions D1 are provided in the fin FA beside the gate electrode GE1. The extension region EX1 is located closer to the gate electrode GE1 than the diffusion region D1 in the X direction. As described above, there are formed the source and drain regions each having a structure including the extension region EX1 having a low impurity concentration and the diffusion region D1 having a high impurity concentration, i.e., a lightly doped drain (LDD) structure. This makes it possible to improve the short channel characteristics of the transistor having such source and drain regions.

The source and drain regions each including the extension region EX1 and the diffusion region D1 and the gate electrode GE1 collectively configure the low-withstand-voltage transistor QL. The low-withstand-voltage transistor QL is formed, for example, in the logic circuit region including the CPU CC1 and the like illustrated in FIG. 1, and is a semiconductor element that is required to operate at high speed compared with the high-withstand-voltage transistor QH. The low-withstand-voltage transistor QL is a metal insulator semiconductor (MIS) type field effect transistor (FET). The low-withstand-voltage transistor QL formed on the fin FA is a fin FET.

The top and the side surfaces of the fin FA that are sandwiched by the pair of source and drain regions in the X direction and covered with the gate electrode GE1 configure the channel region of the low-withstand-voltage transistor QL. Thus, a current flows in the X direction in the channel region between the source and drain regions during conduction of the low-withstand-voltage transistor QL. However, a certain portion of either side surface of the fin FA and the planar portion, which are covered with the element isolation film EI1, do not configure the low-withstand-voltage transistor QL; hence, no current flows in such portions even during conduction of the low-withstand-voltage transistor QL.

The low-withstand-voltage transistors QL are individually provided in the fins FA isolated by the element isolation film EI1. In other words, the low-withstand-voltage transistors QL provided in the respective fins FA arranged in the Y direction share the gate electrode GE1, but do not share the source and drain regions and the channel region, and thus do not configure one transistor. The low-withstand-voltage transistor QL is a FINFET having a channel including only the surface of the fin FA.

A well WL2 containing a p-type impurity (for example, boron (B)) is provided in the fin FB in the high-withstand-voltage transistor region 1B. The well WL2 is provided from the top of the fin FB to the inside of the semiconductor substrate SB below the fin FB. For example, the well WL2 reaches the inside of the semiconductor substrate SB below the element isolation film EI2. A pair of source and drain regions are provided in the top of the fin FB, each side surface of the fin FB, and the planar portion exposed from the gate electrode GE2 and the element isolation film EI2. Specifically, the source region and the drain region are provided in each of the fin FB and the planar portion which sandwich the gate electrode GE2 in the X direction in planar view. In other words, the gate electrode GE2 is sandwiched by the source region and the drain region in planar view.

Specifically, unlike the low-withstand-voltage transistor region 1A, each of the source and drain regions is also provided in the top (planar portion) of the semiconductor substrate SB between the fins FB so that the gate electrode GE2 is sandwiched by the source and drain regions in planar view in the high-withstand-voltage transistor region 1B.

FIG. 3 shows only the source and drain regions that are each formed in the top of the fin FB, and does not show the source and drain regions that are each formed in the side surface of the fin FB and in the planar portion. Each of the source and drain regions includes an extension region EX2 that is an n-type semiconductor region containing a relatively low concentration of an n-type impurity (for example, phosphorus (P) or arsenic (As)), and a diffusion region D2 that is an n-type semiconductor region containing a higher concentration of an n-type impurity (for example, phosphorus (P) or arsenic (As)) than the extension region EX2.

Although the depth of the extension region EX2 is shown to be deeper than the depth of the diffusion region D2, the depth of the diffusion region D2 may be deeper than the depth of the extension region EX2, or the depth of the diffusion region D2 may be equal to the depth of the extension region EX2. Although the diffusion region D2 and the extension region EX2 formed in the top of the fin FB do not reach the height of the planar portion in FIG. 3, the regions D2 and EX2 may reach the height of the planar portion. In an undepicted region, the diffusion region D2 and the extension region EX2 are provided in each side surface of the fin FB so as to extend from the upper end of the side surface of the fin FB to the height of the planar portion.

Each of the source and drain regions formed in the side surface of the fin FB reaches the inside of the semiconductor substrate SB at a position deeper than the planar portion, and is coupled to one of the source and drain regions formed in the top (planar portion) of the semiconductor substrate SB between the fins FB adjacent to each other in the Y direction. That is, the source regions formed in the surfaces of the fins FB arranged in the Y direction are not isolated from each other, but are integrated together via the source regions formed in the planar portions. Similarly, the drain regions formed in the surfaces of the fins FB arranged in the Y direction are not isolated from each other, but are integrated together via the drain regions formed in the planar portions.

Each of the source and drain regions has the extension region EX2 and the diffusion region D2. That is, a pair of extension regions EX2 and a pair of diffusion regions D2 are provided in each of the fin FB and the planar portion beside the gate electrode GE2. The extension region EX2 is located closer to the gate electrode GE1 than the diffusion region D2 in the X direction.

The source and drain regions including the extension region EX2 and the diffusion region D2 and the gate electrode GE2 configure the high-withstand-voltage transistor QH. The high-withstand-voltage transistor QH is formed, for example, in the I/O circuit region CC6 illustrated in FIG. 1, and is a semiconductor element that operates at a higher voltage than the low-withstand-voltage transistor QL, and carries a larger current than the low-withstand-voltage transistor QL. Hence, the high-withstand-voltage transistor QH is required to have a higher withstand voltage performance than the low-withstand-voltage transistor QL. The high-withstand-voltage transistor QH is a MIS type FET.

The top and the side surfaces of the fin FB that are sandwiched by the pair of source and drain regions in the X direction and covered with the gate electrode GE2 configure the channel region of the high-withstand-voltage transistor QH. Thus, a current flows in the X direction in the channel region between the source and drain regions during conduction of the high-withstand-voltage transistor QH.

Unlike the low-withstand-voltage transistor region 1A, since the planar portion between the fins FB also configures the channel region of the high-withstand-voltage transistor QH, a current also flows in the planar portion during conduction of the high-withstand-voltage transistor QH in the high-withstand-voltage transistor region 1B. That is, the high-withstand-voltage transistor QH has a gate width larger than the low-withstand-voltage transistor QL.

As described above, in the high-withstand-voltage transistor region 1B, the high-withstand-voltage transistors QH are not individually provided in the fins FB arranged in the Y direction, the gate electrode GE2 covering the fins FB arranged in the Y direction, the source and drain regions formed in the respective fins FB, and the source and drain regions formed in the respective planar portions configure one high-withstand-voltage transistor QH.

The X direction corresponds to the gate length direction of each of the low-withstand-voltage transistor QL and the high-withstand-voltage transistor QH, and the Y direction corresponds to the gate width direction of each of the low-withstand-voltage transistor QL and the high-withstand-voltage transistor QH. The width in the Y direction of the top of the fin FA is a part of the gate width of the low-withstand-voltage transistor QL, and the width in the Y direction of the top of the fin FB is a part of the gate width of the high-withstand-voltage transistor QH. In a direction in alignment with the Y direction in planar view and along the side surface of the fin FA, the length of the side surface of the fin FA covered with the gate electrode GE1 configures apart of the gate width of the low-withstand-voltage transistor QL. In a direction in alignment with the Y direction in planar view and along the side surface of the fin FB, the length of the side surface of the fin FB covered with the gate electrode GE2 configures a part of the gate width of the high-withstand-voltage transistor QH. The width in the Y direction of the planar portion between the adjacent fins FB is a part of the gate width of the high-withstand-voltage transistor QH.

Hence, the gate width of one low-withstand-voltage transistor QL corresponds to a distance (length) of a region where the top of one fin FA and the side surfaces on both sides of the fin FA are covered with the gate electrode GE1 in a direction in alignment with the Y direction in planar view. On the other hand, the gate width of one high-withstand-voltage transistor QH corresponds to a distance as the total of the sum of the lengths in the Y direction of the tops of the fins FB covered with one gate electrode GE2, the sum of the lengths of the side surfaces on both sides of the respective fins FB covered with the gate electrode GE2, and the sum of the lengths of the respective planar portions covered with the gate electrode GE2 in a direction in alignment with the Y direction in planar view. That is, the high-withstand-voltage transistor QH has a channel including the surfaces of the fins FB and the planar portions between the fins FB, and thus has a longer gate width than the low-withstand-voltage transistor QL.

As illustrated in FIG. 3, the top and the side surfaces of the fin FA having the diffusion regions D1 and the top and the side surfaces of the fin FB having the diffusion regions D2 are each covered with the silicide layer S1. That is, the surfaces of the fins FA and FB exposed from the gate electrodes GE1 and GE2 and the sidewalls SW are covered with the silicide layer S1. The silicide layer S1 includes nickel silicide (NiSi), for example. The silicide layer S1 in the low-withstand-voltage transistor region 1A is provided on the element isolation film EI1. In the high-withstand-voltage transistor region 1B, the top of the diffusion region D2 formed in the planar portion exposed from the gate electrode GE2 and the sidewall SW is also covered with the silicide layer S1.

The top of the gate electrode GE2 is covered with a silicide layer S2. The silicide layer S2 includes nickel silicide (NiSi), for example. On the other hand, the top of the gate electrode GE1 is not covered with a silicide layer.

An interlayer insulating film IL1 mainly including, for example, a silicon oxide film is provided over the fins FA and FB, the silicide layer S1, and the element isolation films EI and EI2. The interlayer insulating film IL1 is planarized at a height substantially equal to the height of the uppermost surface of each of the gate electrodes GE1 and GE2 and the sidewalls SW. An interlayer insulating film IL2 including, for example, a silicon oxide film is provided on the interlayer insulating film IL1, and covers the tops of the gate electrodes GE1 and GE2, the silicide layer S2, and the sidewalls SW.

A plurality of interconnections M1 are provided on the interlayer insulating film IL2, and each interconnection M1 is electrically coupled to the source region or the drain region via a plug PG provided in a contact hole penetrating through the interlayer insulating film IL1. Specifically, the bottom of the plug PG is directly in contact with the top of the silicide layer S1. The respective interconnections M1 are electrically coupled to the source region and the drain region of the low-withstand-voltage transistor QL and to the source region and the drain region of the high-withstand-voltage transistor QH via the silicide layer S1 and the plug PG. The silicide layer S1 reduces a coupling resistance between the plug PG as a coupling part including a metal film mainly containing, for example, tungsten (W) and the source or drain region made of semiconductor.

In an undepicted power supply region of the gate electrode GE1, the plug PG penetrating through the interlayer insulating film IL2 on the gate electrode GE1 is directly coupled to the top of the gate electrode GE1. In an undepicted power supply region of the gate electrode GE2, the plug PG penetrating through the interlayer insulating film IL2 on the gate electrode GE2 is coupled to the top of the gate electrode GE2 via the silicide layer.

Although the first embodiment is described with a case where the low-withstand-voltage transistor QL and the high-withstand-voltage transistor QH are each an n-channel-type transistor, such transistors may each be a p-channel-type transistor. In such a case, the conductivity type of each semiconductor region described in the first embodiment should be changed to a different conductivity type. In the first embodiment, the respective source and drain regions of each transistor exhibit n-type conductivity.

The meaning of "a semiconductor exhibits n-type conductivity", "a conductivity type of a semiconductor is n type", or "a semiconductor is an n-type semiconductor" is that the majority carrier of the semiconductor is electron. The meaning of "a semiconductor exhibits p-type conductivity", "a conductivity type of a semiconductor is p type", or "a semiconductor is a p-type semiconductor" is that the majority carrier of the semiconductor is hole.

Dimensions of the fins are now described. As illustrated in FIG. 2, a width W1 of the fin FA in the lateral direction of the fin FA is, for example, 50 nm in the low-withstand-voltage transistor region 1A. Similarly, a width W2 of the fin FB in the lateral direction of the fin FB is, for example, 50 nm in the high-withstand-voltage transistor region 1B. Such widths W1 and W2 are determined by a thickness of a silicon oxide film to be formed for formation of a hard mask HM1 as described later with reference to FIG. 7. The widths W1 and W2 of the fins FA and FB are each set to 50 nm or less herein, thereby the fins FA and FB can each be completely depleted.

When a first fin FA and a second fin FA are adjacent to each other in the Y direction, a width W3 between a side surface of the first fin FA located on a side far from the second fin FA and a side surface of the second fin FA located on a side close to the first fin FA is 150 nm, for example. That is, the distance between the adjacent fins FA is 100 nm, for example. When a first fin FB and a second fin FB are adjacent to each other in the Y direction, a width W4 between a side surface of the first fin FB located on a side far from the second fin FB and a side surface of the second fin FB located on a side close to the first fin FB is 300 nm, for example. That is, the distance between the adjacent fins FB is 250 nm, for example.

In other words, one of the two adjacent fins FB has a first side surface and a second side surface in the Y direction, the other fin FB has a third side surface and a fourth side surface in the Y direction, the second side surface and the third side surface are opposed to each other, and the distance between the first side surface and the third side surface in the Y direction is referred to as width W4.

Such widths W3 and W4 are each determined by a width in the Y direction of a pattern of a semiconductor film SI1 described later with reference to FIG. 6 and a distance between the semiconductor films SI1 adjacent in the Y direction. Each of the insulating film IF3 and the gate insulating film GF may be formed by either a deposition process or an oxidation process. The insulating film IF3 and the gate insulating film GF are formed by the oxidation process (for example, a thermal oxidation process). As a result, the fins FA and FB of a completed semiconductor device also have the widths W1 and W2, respectively. In the first embodiment, the high-withstand-voltage transistor QH having the gate electrode GE2 is formed so as to straddle the plurality of fins FB, thereby a large gate width of the high-withstand-voltage transistor QH is provided. The width W4 is preferred to be relatively small from the viewpoint of increasing the gate width and the channel area of the high-withstand-voltage transistor QH.

The height H3 of the fin FA above the element isolation film EI1 is, for example, 100 nm. The height (depth, thickness) H1 of the element isolation film EI1 and a height (depth, thickness) H2 of the element isolation film EI2 are each 300 nm, for example. The height (H1+H3) from the lower end to the upper end of the fin FA is 400 nm, for example. The height H4 from the lower end to the upper end of the fin FB is 350 nm, for example. Thus, the height of the fin FB is probably lower than the height of the fin FA. This is due to, for example, the following manufacturing process of the semiconductor device. That is, as will be described later with reference to FIG. 16, the top of the interlayer insulating film IL2 is retracted by performing dry etching on the high-withstand-voltage transistor region 1B, and the top of the fin FB is accordingly somewhat retracted.

Each of the heights H1 to H4 referred to herein does not mean a distance from the main surface of the semiconductor substrate SB, but means a distance (length) in a direction perpendicular to the main surface of the semiconductor substrate SB. The height H1 is a distance from the top to the bottom of the element isolation film EI1, the height H2 is a distance from the top to the bottom of the element isolation film EI2, the height H3 is a distance from the top of the fin FA to the top of the element isolation film EI1, and the height H4 is a distance from the top to the lower end of the fin FB.

As described above, although the overall height (H1+H3) of the fin FA is substantially equal to the overall height H4 of the fin FB, the height H3 of the fin FA exposed from the element isolation film EI1 is lower than the height H4 of the fin FB exposed from the element isolation film EI2. This means that the width of the region that serves as the channel region of the low-withstand-voltage transistor QL between the upper end and the lower end of the side surface of the fin FA is smaller than the width of the region that serves as the channel region of the high-withstand-voltage transistor QH between the upper end and the lower end of the side surface of the fin FB. In other words, when one fin FA and one fin FB are focused, the gate width of the high-withstand-voltage transistor QH along the surface of the fin FB is larger than the gate width of the low-withstand-voltage transistor QL along the surface of the fin FA.

Manufacturing Process of Semiconductor Device

A method of manufacturing the semiconductor device of the first embodiment is described below with reference to FIGS. 5 to 29. FIGS. 5 to 29 are each a sectional view of the semiconductor device of the first embodiment during a formation process of the semiconductor device. Each of FIGS. 5 to 19 illustrates the low-withstand-voltage transistor region 1A on its left side and the high-withstand-voltage transistor region 1B on its right side. FIGS. 5 to 18 each illustrate a section along the Y direction (see FIG. 2), i.e., along the lateral direction of the fin. FIGS. 19 to 29 each illustrate a section along the X direction (see FIG. 2), i.e., along the longitudinal direction of the fin.

Figure 5:
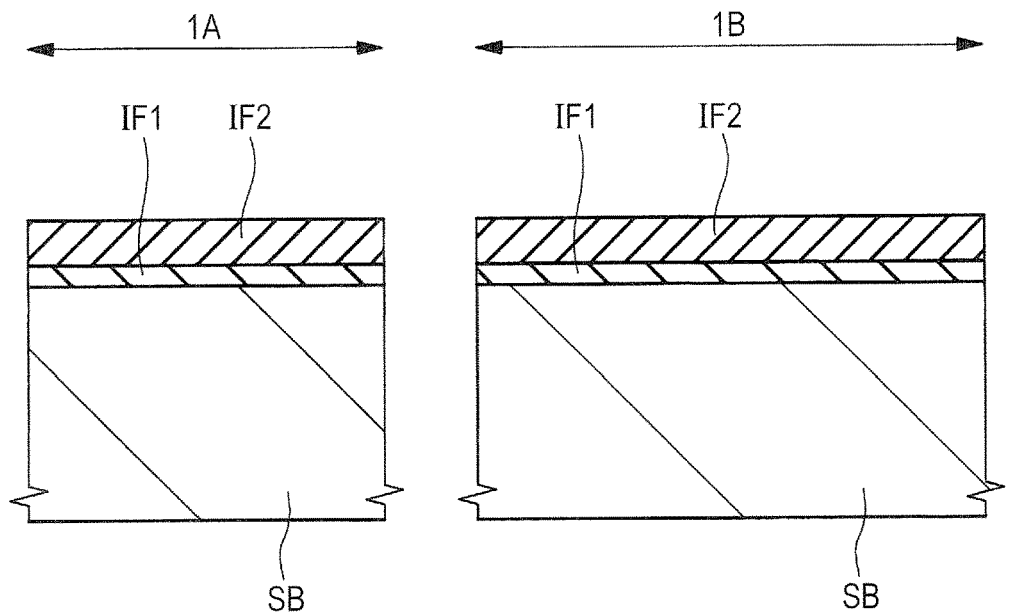
FIG. 5 is a sectional view of the semiconductor device of the first embodiment of the invention during a manufacturing process of the semiconductor device.

First, as illustrated in FIG. 5, the semiconductor substrate SB is provided, and the insulating films IF1 and IF2 are formed in order on the main surface of the semiconductor substrate SB. The semiconductor substrate SB is made of p-type single-crystal silicon having a specific resistance of about 1 to 10 Ωcm, for example. The insulating film IF1 includes, for example, a silicon oxide film, and can be formed by an oxidation process or a chemical vapor deposition (CVD) process, for example. The insulating film IF1 has a thickness of about 2 to 10 nm. The insulating film IF2 includes, for example, a silicon nitride film, and has a thickness of about 20 to 100 nm. The insulating film IF2 is formed by a CVD process, for example.

Figure 6:
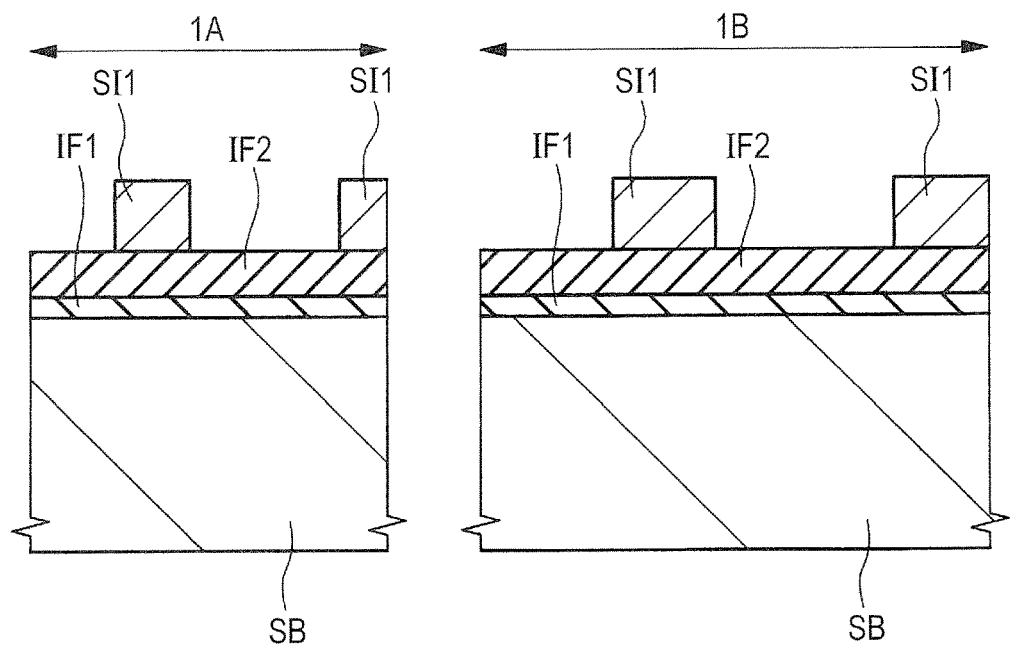
FIG. 6 is a sectional view of the semiconductor device during the manufacturing process following FIG. 5.

Subsequently, as illustrated in FIG. 6, the semiconductor films SI1 is formed on the insulating film IF2. The semiconductor film SI1 includes, for example, an amorphous silicon film, and is formed by a CVD process, for example. The semiconductor film SI1 has a thickness of 20 to 200 nm, for example.

Subsequently, the semiconductor film SI1 is processed using a photolithography technique and an etching process. Consequently, a plurality of patterns of the semiconductor film SI1 extending in the X direction are formed side by side in the Y direction on the insulating film IF2 in each of the low-withstand-voltage transistor region 1A and the high-withstand-voltage transistor region 1B. FIG. 6 is a sectional view including the patterns of the semiconductor film SI1 along a lateral direction of each pattern of the semiconductor film SI1. The semiconductor film SI1 is a dummy pattern to be removed in a later step.

Figure 7:
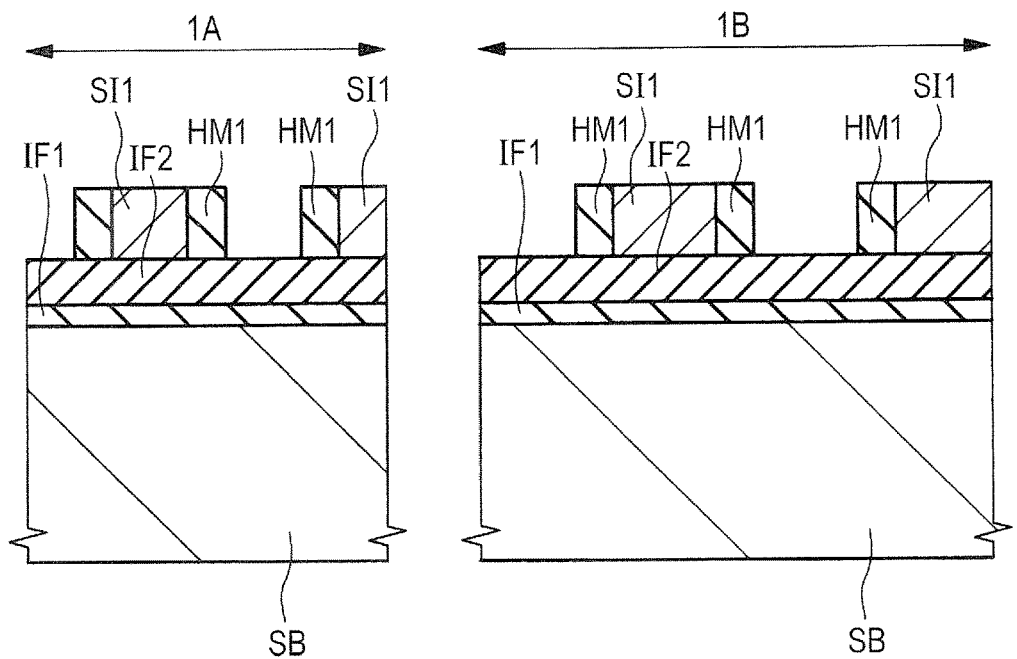
FIG. 7 is a sectional view of the semiconductor device during the manufacturing process following FIG. 6.

Subsequently, as illustrated in FIG. 7, hard masks HM1 are formed so as to cover the respective side surfaces of the semiconductor films SI1. For example, a silicon oxide film having a thickness of, for example, 50 nm is formed on the semiconductor substrate SB by a CVD process, and is then subjected to dry etching being anisotropic etching. As a result, the tops of the insulating film IF2 and each semiconductor film SI1 are exposed to form the hard masks HM1 including the silicon oxide film remaining on the side surfaces of the semiconductor films SI1. Each of the hard masks HM1 does not completely fill the space between the adjacent semiconductor films SI1. The hard mask HM1 is annularly formed so as to enclose the semiconductor film SI1.

Figure 8:
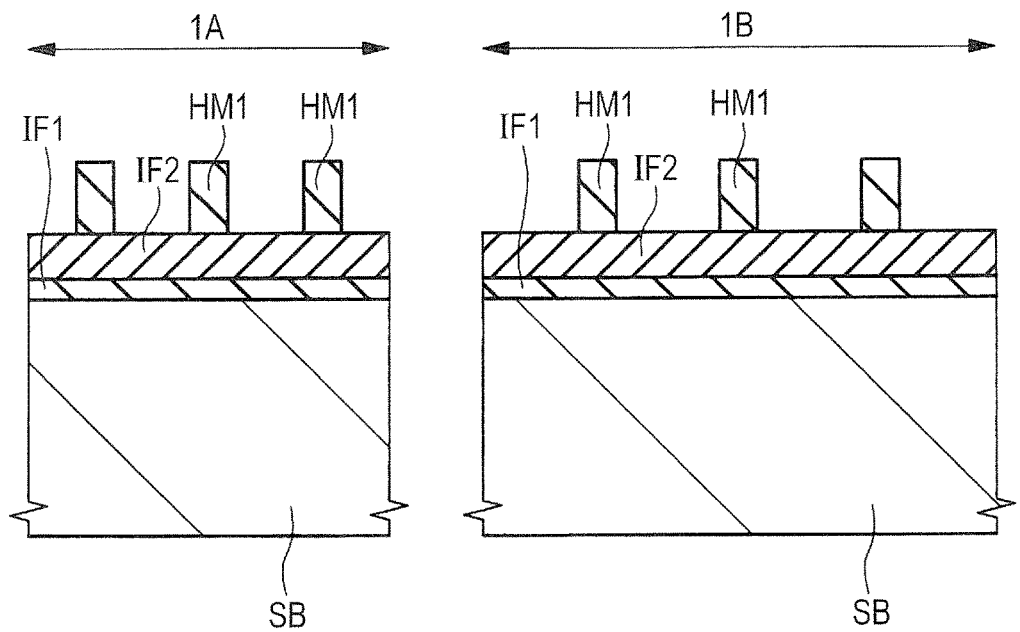
FIG. 8 is a sectional view of the semiconductor device during the manufacturing process following FIG. 7.

Subsequently, as illustrated in FIG. 8, the semiconductor films SI1 are removed by a wet etching process. Subsequently, part of the hard mask HM1 is removed using a photolithography technique and an etching process. Specifically, portions of the hard mask HM1, which extend in the X direction, are left while other portions, i.e., portions extending in the Y direction, thereof are removed. Consequently, the hard mask HM1 does not have the annular structure, and includes only a pattern extending in the X direction. Specifically, a plurality of hard masks HM1 as patterns extending in the X direction are arranged in the Y direction on the insulating film IF2.

For example, a distance between the hard masks HM1 adjacent to each other in the Y direction is 100 nm in the low-withstand-voltage transistor region 1A, and a distance between the hard masks HM1 adjacent to each other in the Y direction is 250 nm in the high-withstand-voltage transistor region 1B. The width of the hard mask HM1 in the Y direction is, for example, 50 nm.

Figure 9:
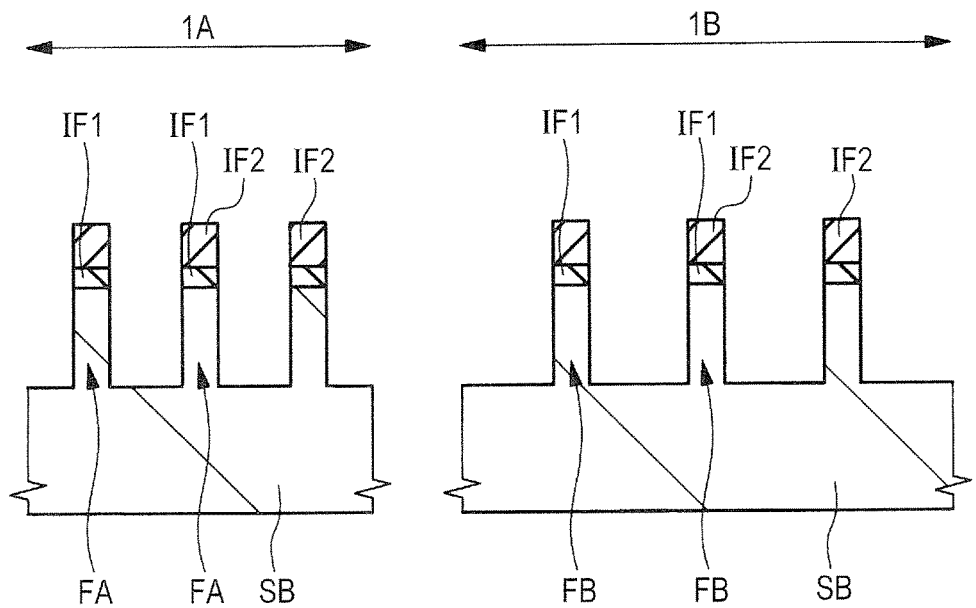
FIG. 9 is a sectional view of the semiconductor device during the manufacturing process following FIG. 8.

Subsequently, as illustrated in FIG. 9, the insulating films IF2 and IF1 and the semiconductor substrate SB are subjected to anisotropic dry etching using the hard masks HM1 as a mask. Consequently, patterns as part of the semiconductor substrate SB processed into a shape of plates (walls), i.e., the fins FA and FB are formed directly under the hard masks HM1. That is, a plurality of fins FA are formed in the low-withstand-voltage transistor region 1A, and a plurality of fins FB are formed in the high-withstand-voltage transistor region 1B.

The semiconductor substrate SB in a region exposed from the hard masks HM1 is dug from its main surface by 300 to 350 nm, thereby the fins FA and FB are formed so as to have a height of 300 to 350 nm from the main surface of the semiconductor substrate SB. Specifically, for example, the semiconductor substrate SB is dug from its main surface by a distance of 300 nm. The hard masks HM1 are also removed by the dry etching step. The hard masks HM1 may be removed by polishing as described with reference to FIG. 11.

Figure 10:
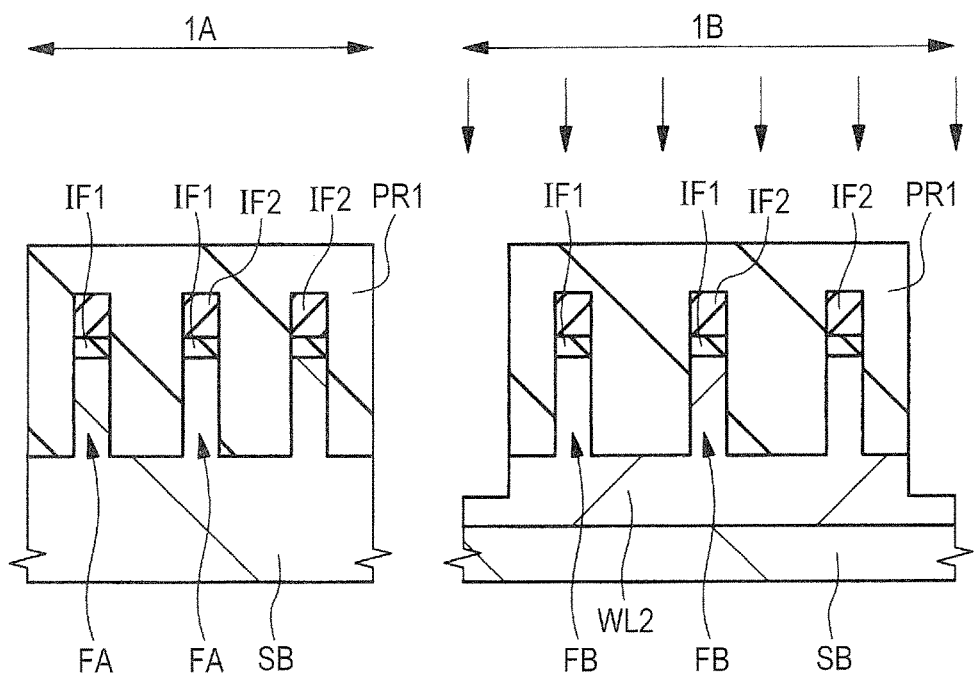
FIG. 10 is a sectional view of the semiconductor device during the manufacturing process following FIG. 9.

Subsequently, as illustrated in FIG. 10, a photoresist film PR1 is formed over the semiconductor substrate SB so as to entirely cover the fins FA and FB and the insulating films IF1 and IF2. The photoresist film PR1 covers the entire main surface of the semiconductor substrate SB in the low-withstand-voltage transistor region 1A, and covers a part of the main surface of the semiconductor substrate SB in the high-withstand-voltage transistor region 1B. In the high-withstand-voltage transistor region 1B, the photoresist film PR1 covers the main surface, which includes the planar portions between the fins FB adjacent to each other in the Y direction, of the semiconductor substrate SB around the fins FB, and exposes the main surface of the semiconductor substrate SB that surrounds one region including the fins FB in planar view.

Subsequently, the main surface of the semiconductor substrate SB in the high-withstand-voltage transistor region 1B exposed from the photoresist film PR1 is etched back by, for example, dry etching using the photoresist film PR1 as a mask (protective mask). As a result, a part of the main surface of the semiconductor substrate SB retracts to the back side opposite to the main surface of the semiconductor substrate SB. The main surface of the semiconductor substrate SB retracts by such an etch back step by a length of 300 nm, for example. In other words, a trench having a depth of about 300 nm is formed in a part of the main surface (planar portion) of the semiconductor substrate SB in the high-withstand-voltage transistor region 1B. Such a trench is an isolation trench to be filled with an element isolation film later.

Figure 11:
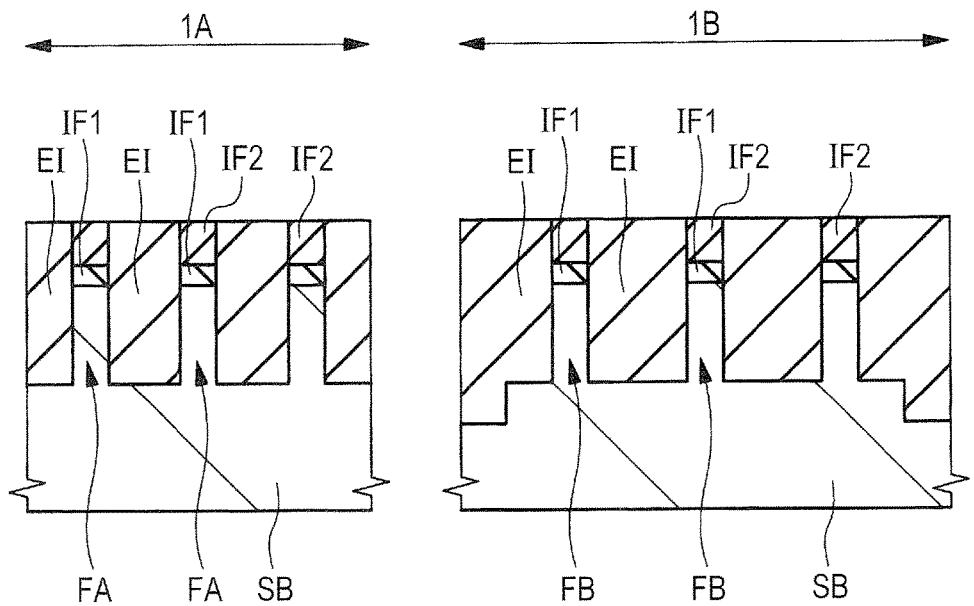
FIG. 11 is a sectional view of the semiconductor device during the manufacturing process following FIG. 10.

Subsequently, as illustrated in FIG. 11, the photoresist film PR1 is removed, and then an insulating film EI including a silicon oxide film or the like is deposited on the semiconductor substrate SB so as to completely embed the fins FA and FB and the insulating films IF1 and IF2. As a result, the space between the adjacent fins FA and the inside of the isolation trench are completely filled with the insulating film EI. Subsequently, the top of the insulating film EI is polished by a chemical mechanical polishing (CMP) process to expose the top of the insulating film IF2 in each of the low-withstand-voltage transistor region 1A and the high-withstand-voltage transistor region 1B.

Figure 12:
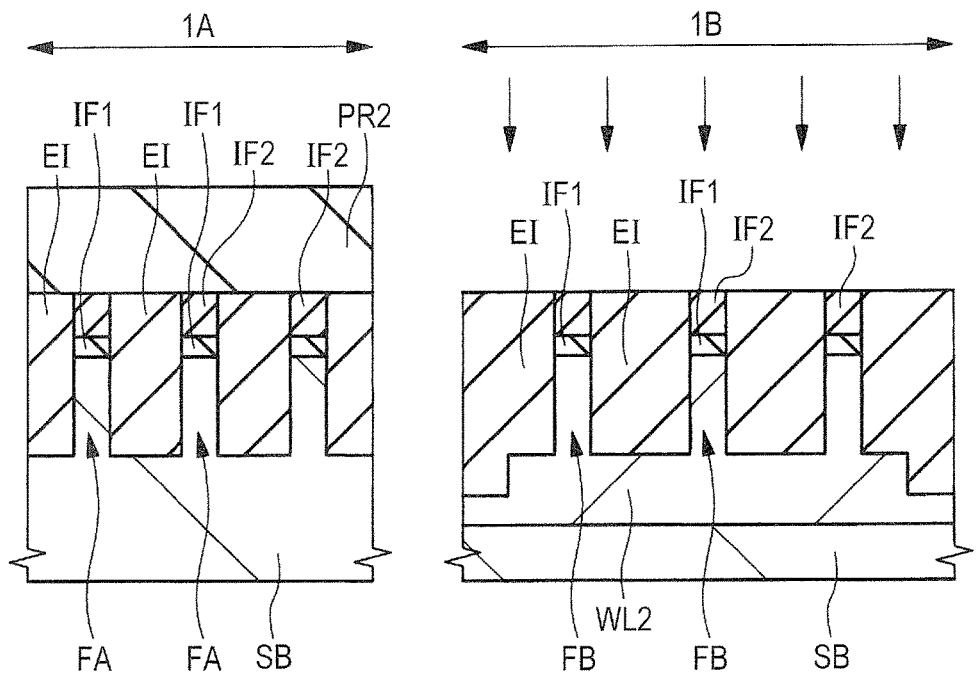
FIG. 12 is a sectional view of the semiconductor device during the manufacturing process following FIG. 11.

Subsequently, as illustrated in FIG. 12, a photoresist film PR2 is formed so as to cover the tops of the insulating films EI and IF2 in the low-withstand-voltage transistor region 1A. The photoresist film PR2 does not cover the high-withstand-voltage transistor region 1B.

Subsequently, ion implantation is performed on the main surface of the semiconductor substrate SB in the high-withstand-voltage transistor region 1B including the insides of the fins FB using the photoresist film PR2 as a mask (implantation blocking mask). As a result, the impurity is introduced into the main surface of the semiconductor substrate SB, and thus the p-type well WL2 is formed in each fin FB and in each planar portion.

In addition, impurity implantation is also performed on the channel region in order to control the threshold voltage of a high-withstand-voltage transistor formed later in the high-withstand-voltage transistor region 1B. Specifically, impurity implantation is performed on the channel region by implanting a p-type impurity (for example, boron (B)) into the top of the semiconductor substrate SB in the high-withstand-voltage transistor region 1B. In this step, the impurity is implanted into the surface of the semiconductor substrate SB in a direction perpendicular to the main surface of the semiconductor substrate SB.

The well WL2 is formed by implanting a p-type impurity (for example, boron (B)). The well WL2 is formed spreading over the inside of each fin FB, the main surface, including the planar portions between the adjacent fins FB, of the semiconductor substrate SB, and the bottom of the trench (isolation trench) formed in the main surface of the semiconductor substrate SB.

The well WL2 is formed by performing a plurality of implantation steps instead of one implantation step, i.e., by performing multistep implantation. Specifically, for example, the following steps are performed, i.e., a first implantation step of introducing an impurity into the main surface, including the bottom portion of the trench and each planar portion, of the semiconductor substrate SB and into the lower end of each fin FB, a second implantation step of introducing an impurity into the middle portion between the upper end and the lower end of the fin FB, and a third implantation step of introducing an impurity into the upper end (upper part) of the fin FB. Such three implantation steps may be performed in an order different from the above-described order. In addition, the multistep implantation may be performed in less than or more than three steps.

Figure 13:
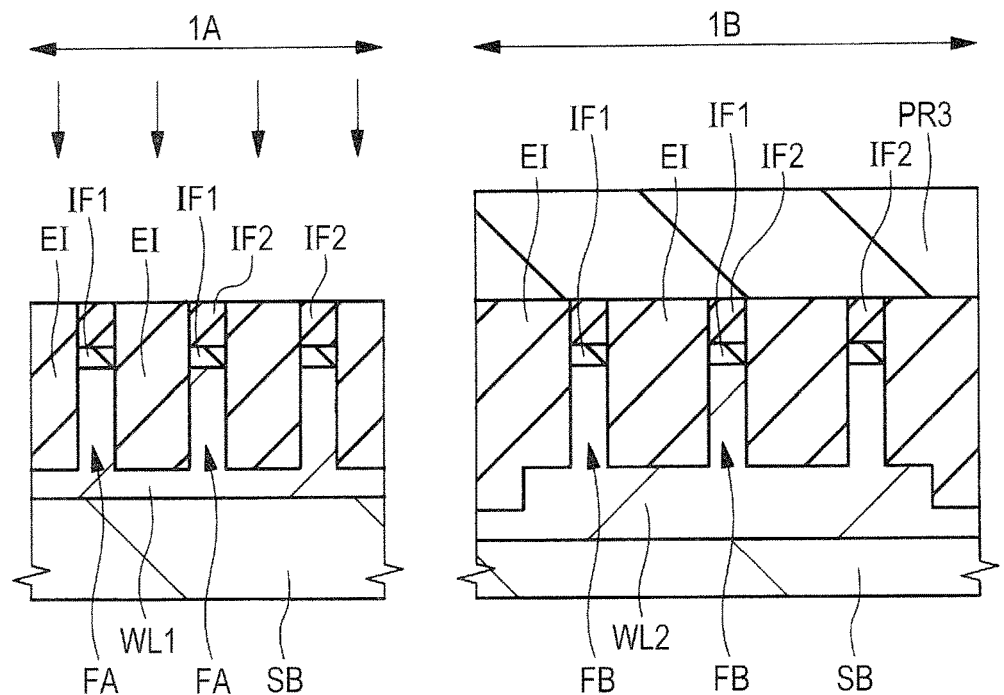
FIG. 13 is a sectional view of the semiconductor device during the manufacturing process following FIG. 12.

Subsequently, as illustrated in FIG. 13, the photoresist film PR2 is removed, and then a photoresist film PR3 is formed so as to cover the tops of the insulating films EI and IF2 in the high-withstand-voltage transistor region 1B. The photoresist film PR3 does not cover the low-withstand-voltage transistor region 1A. Subsequently, ion implantation is performed on the main surface of the semiconductor substrate SB in the low-withstand-voltage transistor region 1A including the inside of each fin FA using the photoresist film PR3 as a mask (implantation blocking mask). As a result, an impurity is introduced into the main surface of the semiconductor substrate SB, thereby the p-type well WL1 is formed in the fin FA and in the planar portion.

In addition, impurity implantation is also performed on the channel region in order to control the threshold voltage of a low-withstand-voltage transistor formed later in the low-withstand-voltage transistor region 1A. Specifically, impurity implantation is performed on the channel region by implanting a p-type impurity (for example, boron (B)) into the top of the semiconductor substrate SB in the low-withstand-voltage transistor region 1A. In this step, the impurity is implanted into the surface of the semiconductor substrate SB in a direction perpendicular to the main surface of the semiconductor substrate SB.

The well WL1 is formed by implanting a p-type impurity (for example, boron (B)). The well WL1 is formed spreading over the inside of each fin FA and the main surface, including the planar portions between the adjacent fins FA, of the semiconductor substrate SB.

The well WL1 is formed by performing a plurality of implantation steps instead of one implantation step, i.e., by performing multistep implantation. Specifically, for example, the following steps are performed, i.e., a first implantation step of introducing an impurity into the main surface, including each planar portion, of the semiconductor substrate SB and into the lower end of each fin FA, a second implantation step of introducing an impurity into the middle portion between the upper end and the lower end of the fin FA, and a third implantation step of introducing an impurity into the upper end (upper part) of the fin FA. Such three implantation steps may be performed in an order different from the order as described above. In addition, the multistep implantation may be performed in less than or more than three steps. Further, the step of forming the well WL1 described with reference to FIG. 13 may be performed before the step of forming the well WL2 described with reference to FIG. 12.

Figure 14:
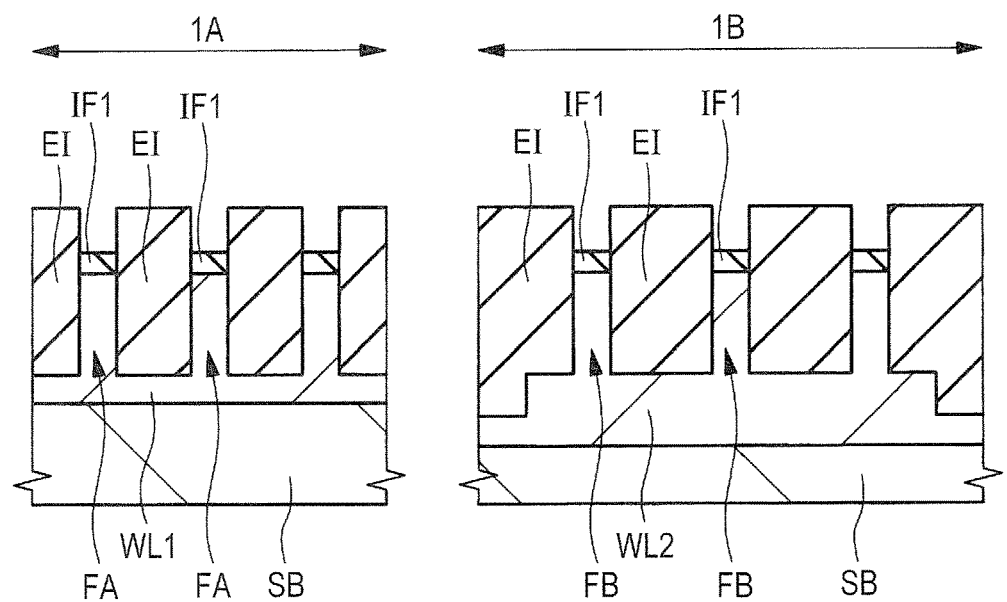
FIG. 14 is a sectional view of the semiconductor device during the manufacturing process following FIG. 13.

Subsequently, as illustrated in FIG. 14, the photoresist film PR3 is removed, and then the insulating film IF2 is removed by wet etching. As a result, the top of the insulating film IF1 is exposed.

Figure 15:
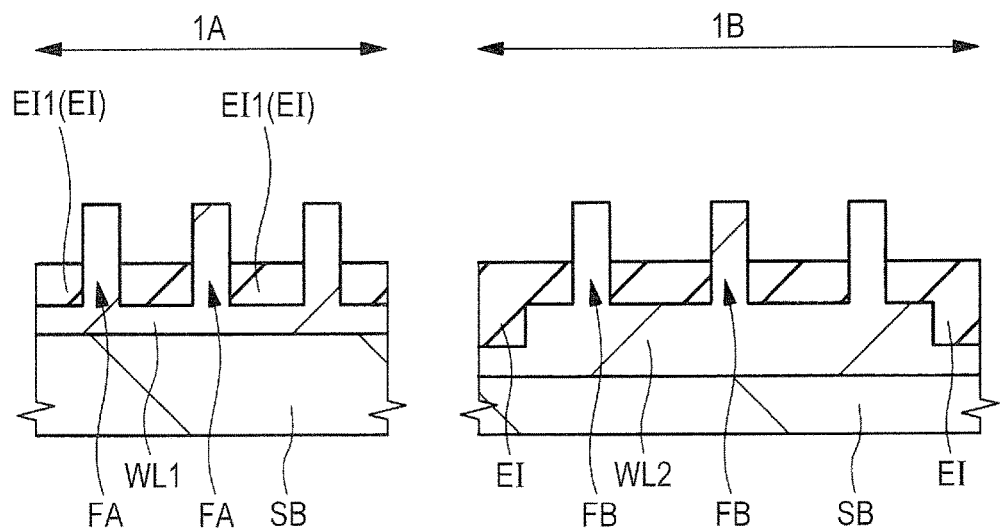
FIG. 15 is a sectional view of the semiconductor device during the manufacturing process following FIG. 14.

Subsequently, as illustrated in FIG. 15, the tops of the insulating film IF1 and the insulating film EI are subjected to etching treatment so that the top of the insulating film EI is retracted (lowered) in a direction perpendicular to the main surface of the semiconductor substrate SB. As a result, a part of the insulating film EI and the insulating film IF1 are removed to expose a part of each side surface and the top of each of the fins FA and FB.

In the etching treatment, wet etching or dry etching is performed. A case where dry etching is performed is described as an example. Through the etching step, the top of the insulating film EI is retracted to a back side of the semiconductor substrate SB below the top of each of the fins FA and FB, and thus the upper portions of the fins FA and FB protrude upward from the top of the insulating film EI. The length of each of the fins FA and FB above the insulating film EI in a direction (height direction, vertical direction) perpendicular to the main surface of the semiconductor substrate SB is 100 nm, for example. Through this step, the element isolation film EI1 including the insulating film EI is formed in the low-withstand-voltage transistor region 1A.

Figure 16:
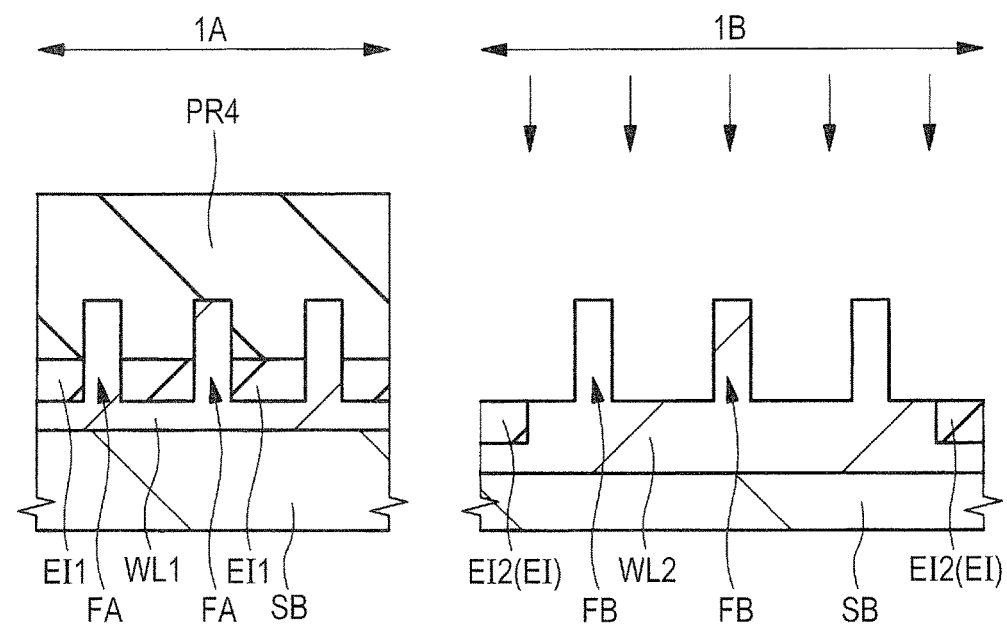
FIG. 16 is a sectional view of the semiconductor device during the manufacturing process following FIG. 15.

Subsequently, as illustrated in FIG. 16, a photoresist film PR4 is formed so as to cover the element isolation film EI1 and the fins FA in the low-withstand-voltage transistor region 1A. The photoresist film PR4 does not cover the high-withstand-voltage transistor region 1B.

Subsequently, the top of the insulating film EI in the high-withstand-voltage transistor region 1B is retracted by performing dry etching using the photoresist film PR4 as a mask. As a result, the main surface, including the planar portions between the adjacent fins FB, of the semiconductor substrate SB is exposed. Specifically, the insulating film EI is left only in the trench formed in the main surface of the semiconductor substrate SB to form the element isolation film EI2 including the insulating film EI filling the trench.

In such a dry etching process, etching is performed under a condition with etching selectivity to silicon in order to prevent the top of the fin FB from being retracted so that the height of the fin FB is lowered.

Figure 17:
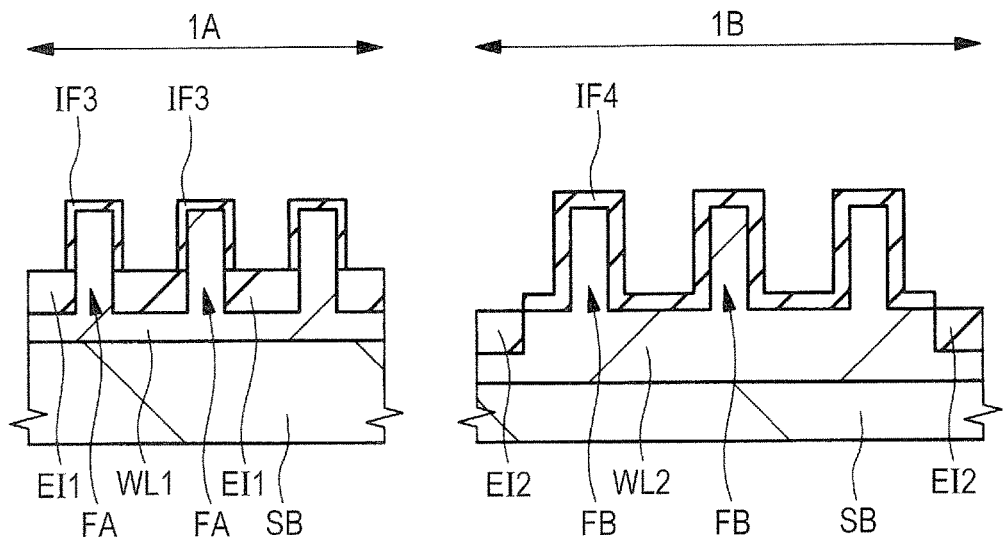
FIG. 17 is a sectional view of the semiconductor device during the manufacturing process following FIG. 16.

Subsequently, as illustrated in FIG. 17, the insulating film IF3 is formed so as to cover the tops and side surface portions, which are exposed from the element isolation film EI1, of the fins FA. Further, an insulating film IF4 is formed so as to cover the tops and the side surfaces of the fins FB and the main surface, including the planar portions between the fins FB, of the semiconductor substrate SB in the high-withstand-voltage transistor region 1B. Each of the insulating films IF3 and IF4 can be formed by a thermal oxidation process or a CVD process, for example. The insulating films IF3 and IF4 are formed by the thermal oxidation process.

Specifically, the insulating film IF4 is formed in each of the low-withstand-voltage transistor region 1A and the high-withstand-voltage transistor region 1B, and then the insulating film IF4 is removed from the low-withstand-voltage transistor region 1A, and then the insulating film IF3 having a thickness smaller than that of the insulating film IF4 is formed in the low-withstand-voltage transistor region 1A. The insulating film IF3 includes a silicon oxide film having a thickness of about 2 to 3 nm, for example. The insulating film IF4 includes a silicon oxide film having a thickness of about 15 nm, for example.

Figure 18:
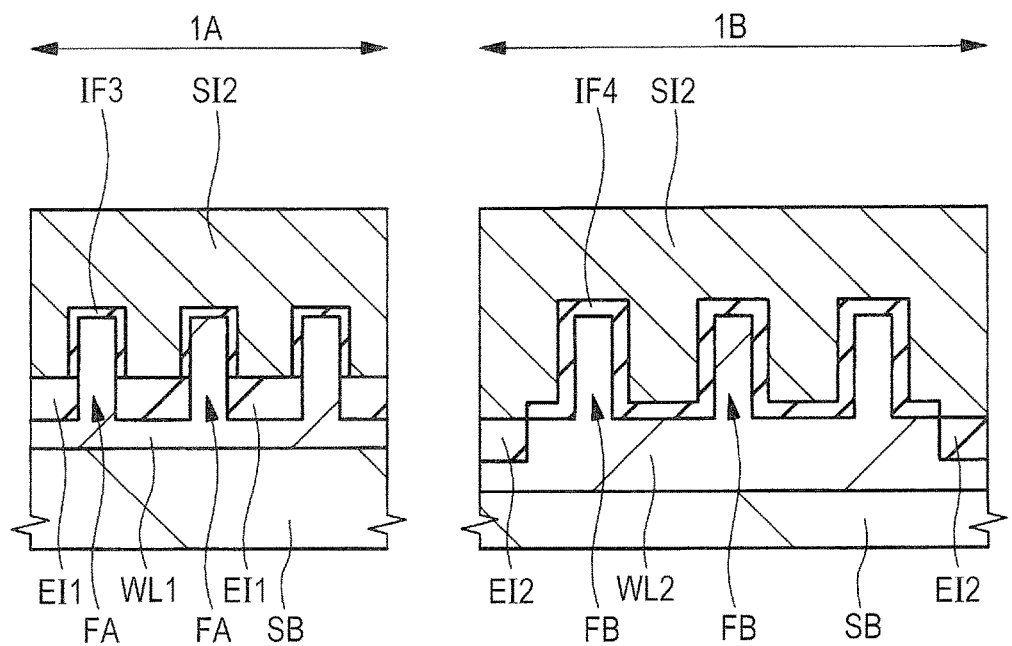
FIG. 18 is a sectional view of the semiconductor device during the manufacturing process following FIG. 17.

Subsequently, as illustrated in FIG. 18, a semiconductor film SI2 having a thickness equal to or larger than the height of each of the fins FA and FB is deposited on the insulating films IF3 and IF4 by a CVD process, for example. Subsequently, the top of the semiconductor film SI2 is planarized by a CMP process or the like.

Figure 19:
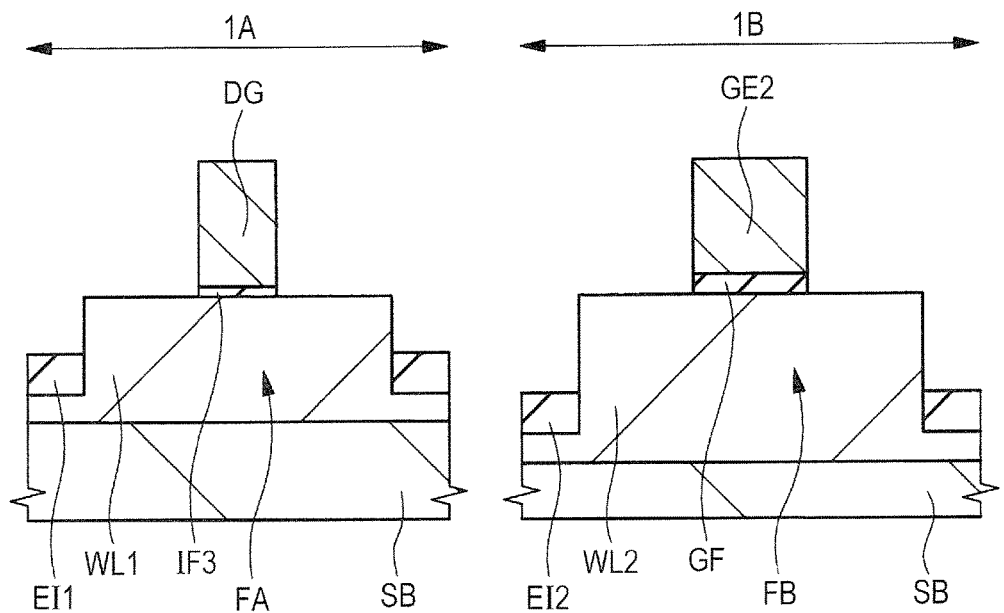
FIG. 19 is a sectional view of the semiconductor device during the manufacturing process following FIG. 18.

Subsequently, as illustrated in FIG. 19, an undepicted photoresist film is formed so as to cover a part of the top of each of the fins FA and FB. The photoresist film is formed so as to cover a part of each of the fins FA arranged in the Y direction (the depth direction in the drawing) and cover a part of each of the fins FB arranged in the Y direction. Specifically, the photoresist film includes a resist pattern extending in the Y direction in each of the low-withstand-voltage transistor region 1A and the high-withstand-voltage transistor region 1B. The top of the other part of the fin FA partly covered with the resist pattern is exposed from the photoresist film in a region beside the resist pattern. The top of the other part of the fin FB partly covered with the resist pattern is exposed from the photoresist film in a region beside the resist pattern.

Subsequently, a part of each of the semiconductor film SI2, the insulating film IF3, and the insulating film IF4 is removed by etching with the photoresist film as a mask, so that the tops of the element isolation films EI1 and EI2 and the surfaces of the fins FA and FB are exposed. Specifically, a part of the top and a part of each side surface of the fin FA are exposed from the insulating film IF3 and the semiconductor film SI2, and a part of the top and a part of each side surface of the fin FB are exposed from the insulating film IF4 and the semiconductor film SI2.

Consequently, a dummy gate electrode DG including the semiconductor film SI2 is formed over the fin FA. Specifically, a part of the top and a part of each side surface of the fin FA are covered with the dummy gate electrode DG with the insulating film IF3 in between above the element isolation film EI1 in the low-withstand-voltage transistor region 1A. The dummy gate electrode DG does not remain in a semiconductor device to be completed later, and is a pseudo electrode to be replaced with a metal gate electrode including a metal film in a later step. Through this etching step, the gate electrode GE2 including the semiconductor film SI2 and the gate insulating film GF including the insulating film IF4 are formed on the fin FB. Specifically, in the high-withstand-voltage transistor region 1B, a part of the top and a part of each side surface of each fin FB and a part of each planar portion are continuously covered with a stacked film including the gate insulating film GF and the gate electrode GE2.

In the described case, the insulating film IF3 covering the surface of the fin FA exposed from the dummy gate electrode DG is removed in the etching step and the subsequent cleaning step, and thus the surface of the fin FA is exposed.

However, the top and the side surfaces of the fin FA may remain to be covered with the insulating film IF3. Similarly, the surface of the fin FB may remain to be covered with the gate insulating film GF.

Figure 20:
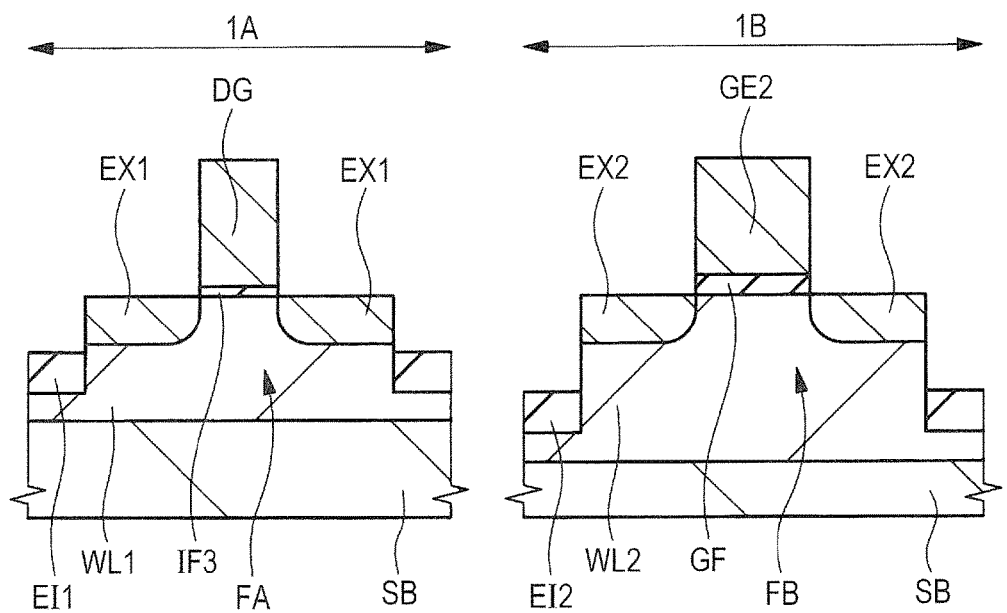
FIG. 20 is a sectional view of the semiconductor device during the manufacturing process following FIG. 19.

Subsequently, as illustrated in FIG. 20, the dummy gate electrode DG, the gate electrode GE2, and the element isolation films EI1 and EI2 are used as a mask to perform ion implantation on the tops and the side surfaces of each of the fins FA and FB and on the tops of the planar portions in the high-withstand-voltage transistor region 1B. Consequently, a pair of extension regions EX1 being n-type semiconductor regions are formed in the top and the side surfaces of each fin FA in the low-withstand-voltage transistor region 1A, and a pair of extension regions EX2 being n-type semiconductor regions are formed in the top and the side surfaces of each fin FB and in each planar portion in the high-withstand-voltage transistor region 1B. The extension regions EX1 and EX2 can each be formed by implanting an n-type impurity (for example, phosphorus (P) or arsenic (As)). In this step, the impurity is implanted into the surface of the semiconductor substrate SB in a direction perpendicular to the main surface of the semiconductor substrate SB or in a direction oblique to the perpendicular direction.

The pair of extension regions EX1 are provided in the fin FA so as to sandwich the dummy gate electrode DG in the X direction in planar view. The pair of extension regions EX2 are provided in the fin FB and the planar portion so as to sandwich the gate electrode GE2 in the X direction in planar view.

The extension regions EX1 formed in each of the fins FA arranged in the Y direction are separated from each other in the low-withstand-voltage transistor region 1A. This is because the extension region EX1 is not formed in the semiconductor substrate SB covered with the element isolation film EI1. On the other hand, the extension regions EX2 formed in the fins FB arranged in the Y direction are integrally coupled together via the extension regions EX2 formed in the main surface (planar portions) of the semiconductor substrate SB between the adjacent fins FB in the high-withstand-voltage transistor region 1B. That is, the extension region EX2 in the fin FB and the extension region EX2 in the planar portion are continuously provided.

Figure 21:
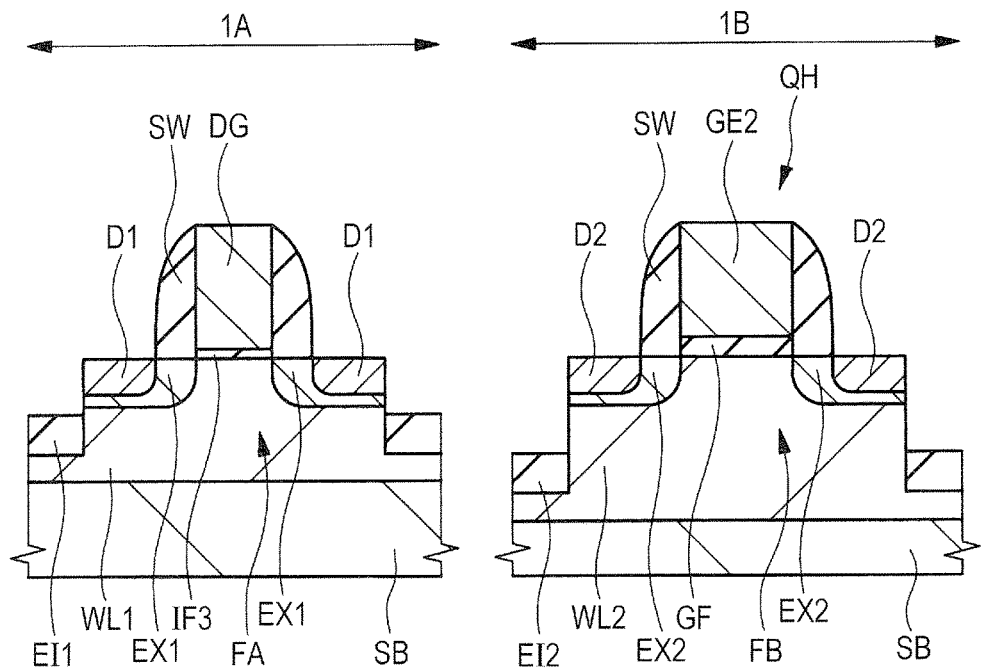
FIG. 21 is a sectional view of the semiconductor device during the manufacturing process following FIG. 20.

Subsequently, as illustrated in FIG. 21, an insulating film is formed on the semiconductor substrate SB by a CVD process, for example. The insulating film mainly includes a silicon nitride film, for example. The insulating film covers the surfaces of the element isolation films EI1 and EI 2, the fins FA and FB, the dummy gate electrode DG, and the gate electrode GE2. Subsequently, a part of the insulating film is removed by dry etching to expose the surfaces of the element isolation films EI1 and EI2 and the fins FA and FB. At this time, the sidewall SW including the insulating film is formed on each of the side surfaces of the dummy gate electrode DG and the gate electrode GE2.

Subsequently, the dummy gate electrode DG, the gate electrode GE2, the sidewalls SW, and the element isolation films EI1 and EI2 are used as a mask to perform ion implantation on the tops and the side surfaces of the fins FA and FB and on the tops of the planar portions in the high-withstand-voltage transistor region 1B. Consequently, a pair of diffusion regions D1 being n-type semiconductor regions are formed in the top and each side surface of each fin FA in the low-withstand-voltage transistor region 1A, and a pair of diffusion regions D2 being n-type semiconductor regions are formed in the top and each side surface of each fin FB and in each planer portion in the high-withstand-voltage transistor region 1B. The diffusion regions D1 and D2 can be formed by implanting an n-type impurity (for example, phosphorus (P) or arsenic (As)). In this step, the impurity is implanted into the surface of the semiconductor substrate SB in a direction perpendicular to the main surface of the semiconductor substrate SB.

The pair of diffusion regions D1 are formed in the fin FA so as to sandwich the pattern including the dummy gate electrode DG and the sidewalls SW covering the side surfaces of the dummy gate electrode DG in the X direction in planar view. The pair of diffusion regions D2 are formed in the fin FB and in the planar portion so as to sandwich the pattern including the gate electrode GE2 and the sidewalls SW covering the side surfaces of the gate electrode GE2 in the X direction in planar view.

The diffusion regions D1 formed in the fins FA arranged in the Y direction are separated from each other in the low-withstand-voltage transistor region 1A. This is because the diffusion region D1 is not formed in the semiconductor substrate SB covered with the element isolation film EI1. On the other hand, the diffusion regions D2 formed in the fins FB arranged in the Y direction are integrally coupled together via the diffusion regions D2 formed in the main surface (planar portions) of the semiconductor substrate SB between the adjacent fins FB in the high-withstand-voltage transistor region 1B. That is, the diffusion region D2 in the fin FB and the diffusion region D2 in the planar portion are continuously provided.

Ion implantation is performed with a higher impurity concentration in the step of forming the diffusion regions D1 and D2 than in the ion implantation step performed to form the extension regions EX1 and EX2. Subsequently, activation heat treatment is performed to diffuse the impurity and the like in the semiconductor substrate SB. As a result, the impurities contained in the diffusion regions D1 and D2, the extension regions EX1 and EX2, and the like are thermally diffused.

Consequently, the source and drain regions including the diffusion regions D1 and the extension regions EX1 are formed, while the source and drain regions including the diffusion regions D2 and the extension regions EX2 are formed. In the high-withstand-voltage transistor region 1B, the source and drain regions, which include the extension regions EX2 and the diffusion regions D2 formed in the fins FB and in the planar portions between the fins FB, and the gate electrode GE2 configure the high-withstand-voltage transistor QH. The high-withstand-voltage transistor QH is a FINFET having a channel (channel layer, channel region) including the tops and the side surfaces of the fins FB and the planar portions. Although the extension regions EX1 and EX2 are formed deeper than the diffusion regions D1 and D2, respectively, the diffusion regions D1 and D2 may be formed deeper than the extension regions EX1 and EX2, respectively, or may be formed at depths equal to those of the extension regions EX1 and EX2, respectively.

Figure 22:
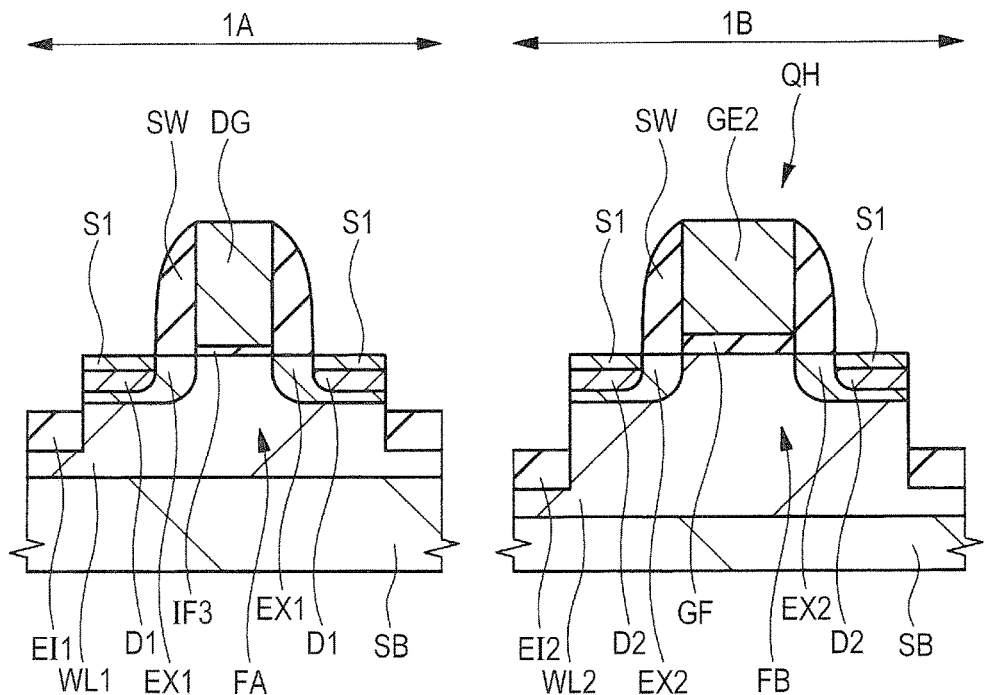
FIG. 22 is a sectional view of the semiconductor device during the manufacturing process following FIG. 21.

Subsequently, as illustrated in FIG. 22, a silicide layer is formed so as to cover the source and drain regions using a known salicide (self align silicide) process. First, a metal film is formed so as to cover the fins FA and FB and the planar portions around the respective fins FB. The metal film includes, for example, a NiPt film deposited by a sputtering process. Subsequently, heat treatment is performed on the semiconductor substrate SB to react the metal film with the surfaces of the fins FA and FB and with the surfaces of the planar portions around the respective fins FB. As a result, the silicide layer S1 including a nickel silicide (NiSi) film is formed so as to cover the tops and the side surfaces of the diffusion regions D1 and D2, and the tops of the dummy gate electrode DG and the gate electrode GE2. That is, the surfaces of the fins FA and FB and the planar portions between the adjacent fins FB are covered by the silicide layer S1.

Figure 23:
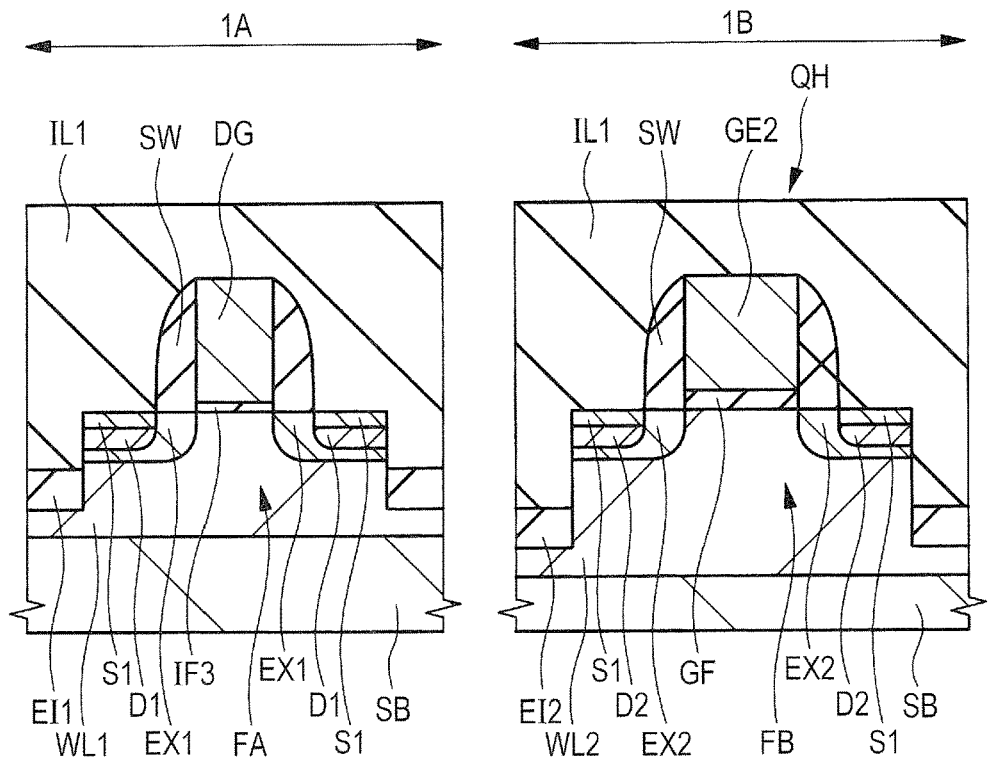
FIG. 23 is a sectional view of the semiconductor device during the manufacturing process following FIG. 22.

Subsequently, as illustrated in FIG. 23, an undepicted liner film including, for example, a silicon nitride film and the interlayer insulating film IL1 including a silicon oxide film are formed in order over the main surface of the semiconductor substrate SB. The liner film and the interlayer insulating film IL1 can be formed by a CVD process, for example. The interlayer insulating film IL1 has a thickness larger than the total of the height of the fin FB above the element isolation film EI2 and the height of a stacked body including the gate insulating film GF and the gate electrode GE2.

Figure 24:
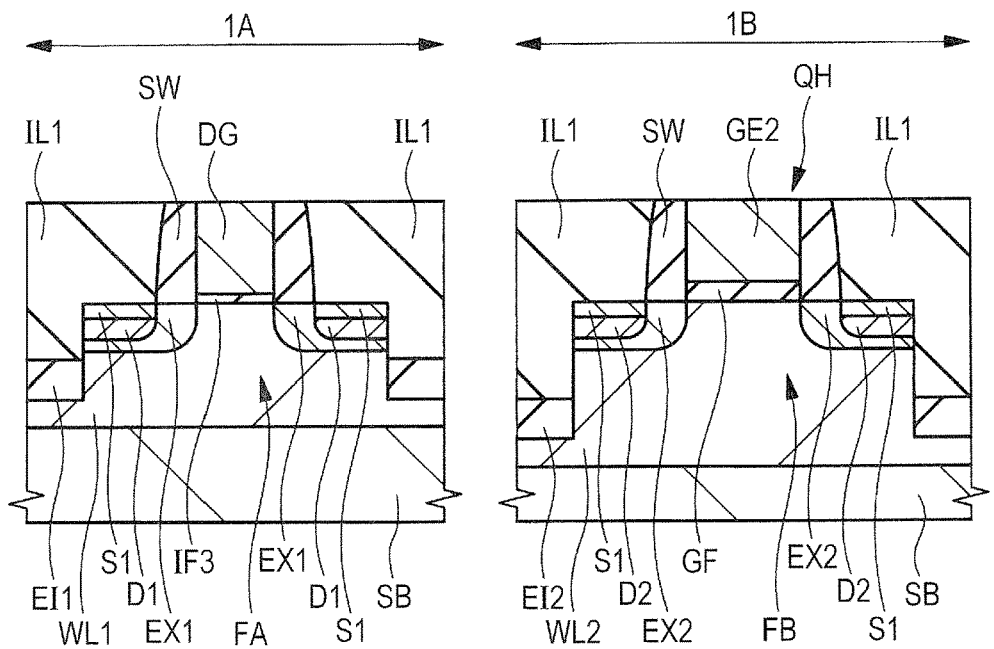
FIG. 24 is a sectional view of the semiconductor device during the manufacturing process following FIG. 23.

Subsequently, as illustrated in FIG. 24, the top of the interlayer insulating film. IL1 is planarized using a CMP process, for example. The tops of the dummy gate electrode DG and the gate electrode GE2 are exposed through the planarization step. That is, the silicide layers S1 covering the tops of the dummy gate electrode DG and the gate electrode GE2 are removed.

Figure 25:
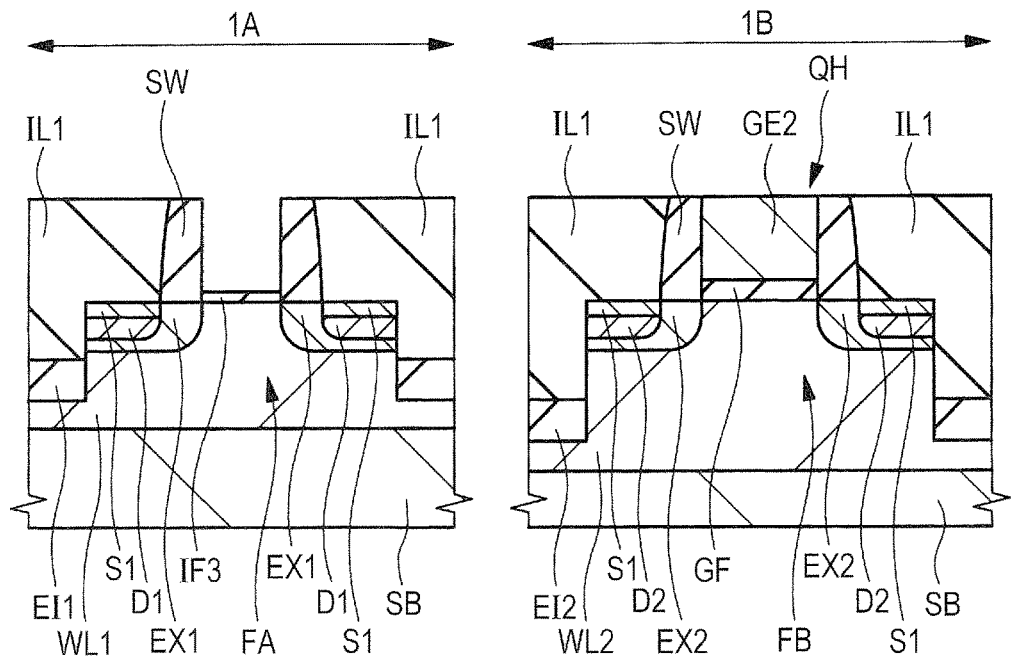
FIG. 25 is a sectional view of the semiconductor device during the manufacturing process following FIG. 24.

Subsequently, as illustrated in FIG. 25, the dummy gate electrode DG is removed by an etching process while the gate electrode GE2 is covered with an undepicted photoresist film. Consequently, a trench is formed in a region that is directly over the insulating film IF3 and sandwiched between the sidewalls SW, i.e., a region in which the dummy gate electrode DG has been provided in the low-withstand-voltage transistor region 1A.

Figure 26:
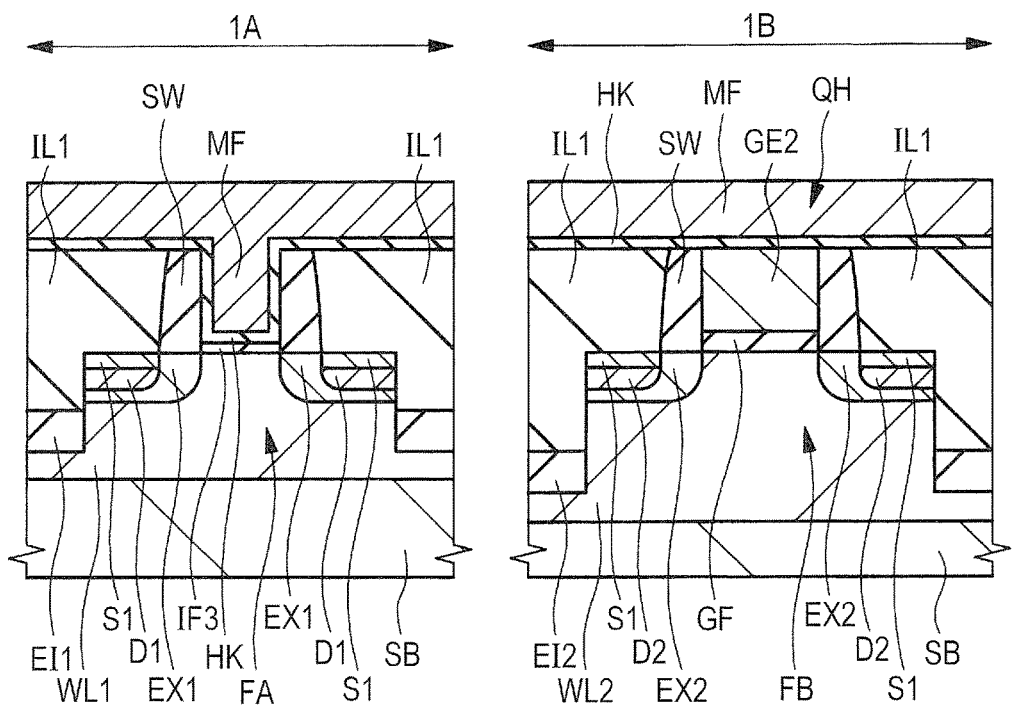
FIG. 26 is a sectional view of the semiconductor device during the manufacturing process following FIG. 25.

Subsequently, as illustrated in FIG. 26, the high-k film HK, which is a high dielectric constant film made of, for example, HfSiO, and a metal film MF are formed in order over the semiconductor substrate SB. The metal film MF includes, for example, a first metal film formed on the high-k film HK and a second metal film formed on the high-k film HK with the first metal film in between. The first metal film and the second metal film are not separately shown in the drawing, and the metal film MF is shown as one metal film. The first metal film is made of, for example, titanium aluminum (TiAl), and the second metal film is made of, for example, aluminum (Al). The metal film MF mainly includes the second metal film.

Figure 27:
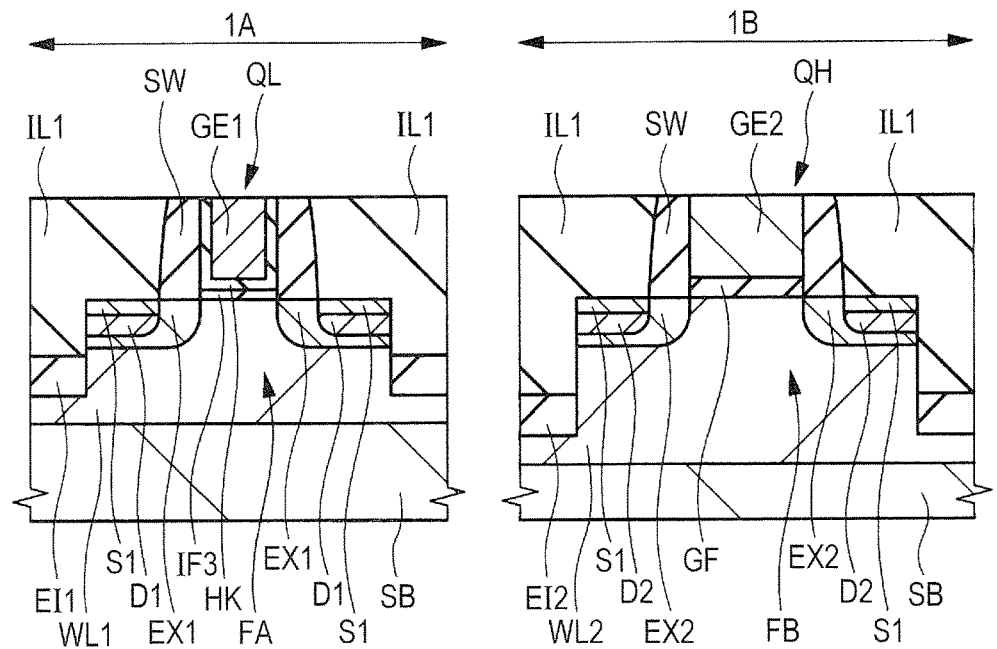
FIG. 27 is a sectional view of the semiconductor device during the manufacturing process following FIG. 26.

Subsequently, as illustrated in FIG. 27, the excess high-k film HK and the excess metal film MF on the sidewall SW and on the interlayer insulating film IL1 are removed by polishing using the CMP process, for example. As a result, the tops of the gate electrode GE2, the sidewalls SW, and the interlayer insulating film IL1 are exposed. A gate electrode GE1, which is a metal gate electrode including the metal film MF embedded in the trench directly over the insulating film IF3, is formed through the polishing step. The source and drain regions including the extension regions EX1 and the diffusion regions D1 formed in each fin FA and the gate electrode GE1 configure the low-withstand-voltage transistor QL in the low-withstand-voltage transistor region 1A. The insulating film IF3 and the high-k film HK configure the gate insulating film of the low-withstand-voltage transistor QL.

Figure 28:
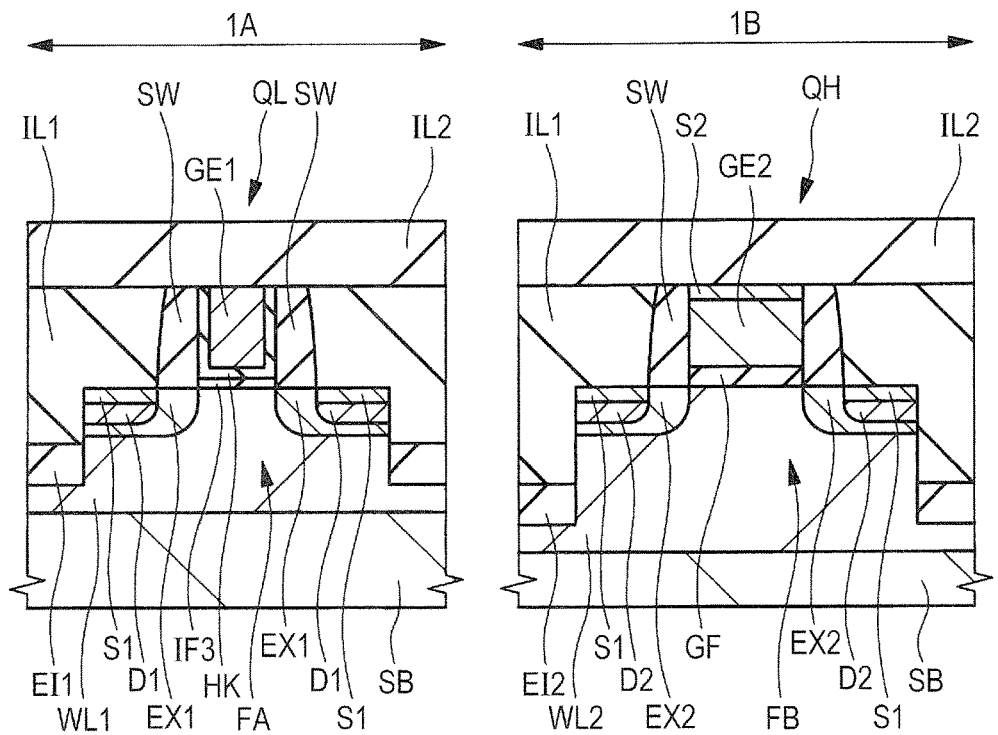
FIG. 28 is a sectional view of the semiconductor device during the manufacturing process following FIG. 27.

Subsequently, as illustrated in FIG. 28, the silicide layer S2 is formed on the top of the gate electrode GE2 using a known salicide process while the top of the gate electrode GE1 is protected by an undepicted insulating film. The silicide layer S2 is formed through a process similar to the formation process of the silicide layer S1, and includes, for example, a nickel silicide (NiSi) film. Subsequently, the interlayer insulating film IL2 including, for example, a silicon oxide film is formed on the interlayer insulating film IL1 using a CVD process, for example. Subsequently, the top of the interlayer insulating film IL2 is planarized by a CMP process, for example. The top of the undepicted insulating film that protects the top of the gate electrode GE2, the top of the silicide layer S2, and the top of the interlayer insulating film IL1 are covered with the interlayer insulating film IL2.

Subsequently, a plurality of contact holes (coupling holes) penetrating through the interlayer insulating films IL1 and IL2 are formed using a photolithography technique and a dry etching process. A part of the top of the silicide layer S1 directly over each of the source and drain regions is exposed at the bottom portion of the contact hole in each of the low-withstand-voltage transistor region 1A and the high-withstand-voltage transistor region 1B. In this step, a contact hole, which penetrates through the interlayer insulating film IL2, is formed in an undepicted region so as to expose the top of the gate electrode GE1 and the top of the silicide layer S2 on the gate electrode GE2.

Subsequently, a conductive plug (coupling part) PG mainly made of tungsten (W) is formed as a conductive component for coupling in each contact hole. The plug PG has a stacked structure of a barrier conductor film (for example, a titanium film, a titanium nitride film, or a stacked film thereof) and a main conductor film (for example, a tungsten film) located on the barrier conductor film.

The plug PG is electrically coupled to each of the source and drain regions of the low-withstand-voltage transistor QL and to each of the source and drain regions of the high-withstand-voltage transistor QH via the silicide layer S1. In an undepicted region, some of the plugs PG is directly coupled to the top of the gate electrode GE1, and some of the other plugs PG is electrically coupled to the gate electrode GE2 via the silicide layer S2 on the gate electrode GE2.

Figure 29:
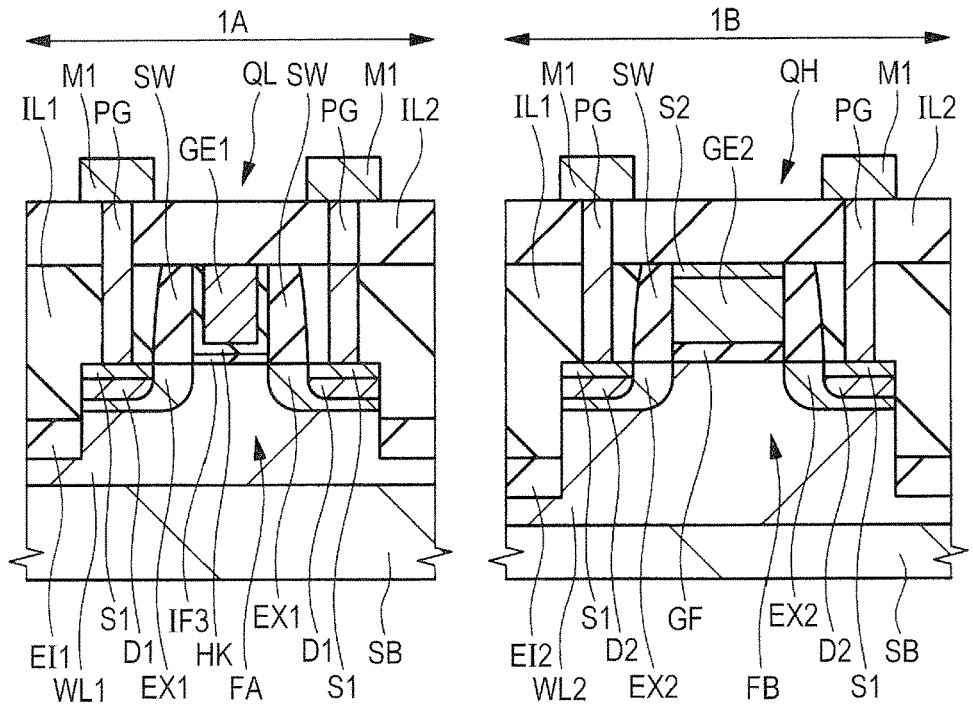
FIG. 29 is a sectional view of the semiconductor device during the manufacturing process following FIG. 28.

Subsequently, as illustrated in FIG. 29, an interconnection M1 is formed on the interlayer insulating film IL2. The interconnection M1 has a stacked structure of a barrier conductor film (for example, a titanium nitride film, a tantalum film, or a tantalum nitride film) and a main conductor film (copper film) formed on the barrier conductor film. In FIG. 29, the barrier conductor film and the main conductor film forming the interconnection M1 are shown in an integrated manner for simplification of the drawing. The same holds true for the plug PG. The semiconductor device of the first embodiment is substantially completed through the above-described steps.

The interconnection M1 can be formed by, for example, a so-called single damascene process. Specifically, an interlayer insulating film having an interconnection trench is formed on the interlayer insulating film IL2, and a metal film is embedded in the interconnection trench, thereby the interconnection M1 can be formed. In the drawing, however, the interlayer insulating film beside the interconnection M1 is omitted.

Although it has been described that the gate electrode GE1 of the low-withstand-voltage transistor QL is formed of a metal film and the high-k film HK is formed under the gate electrode GE1, the gate electrode GE1 may be formed of a polysilicon film. In such a case, the high-k film HK may not be formed. In that case, the dummy gate electrode DG illustrated in FIG. 19 should not be removed in the manufacturing process but be left as the gate electrode GE1 made of the polysilicon film to form the low-withstand-voltage transistor QL having such a gate electrode GE1. When the metal gate electrode is not formed, it is not necessary to perform the steps described with reference to FIGS. 24 to 28.

Effects of First Embodiment

Figure 50:
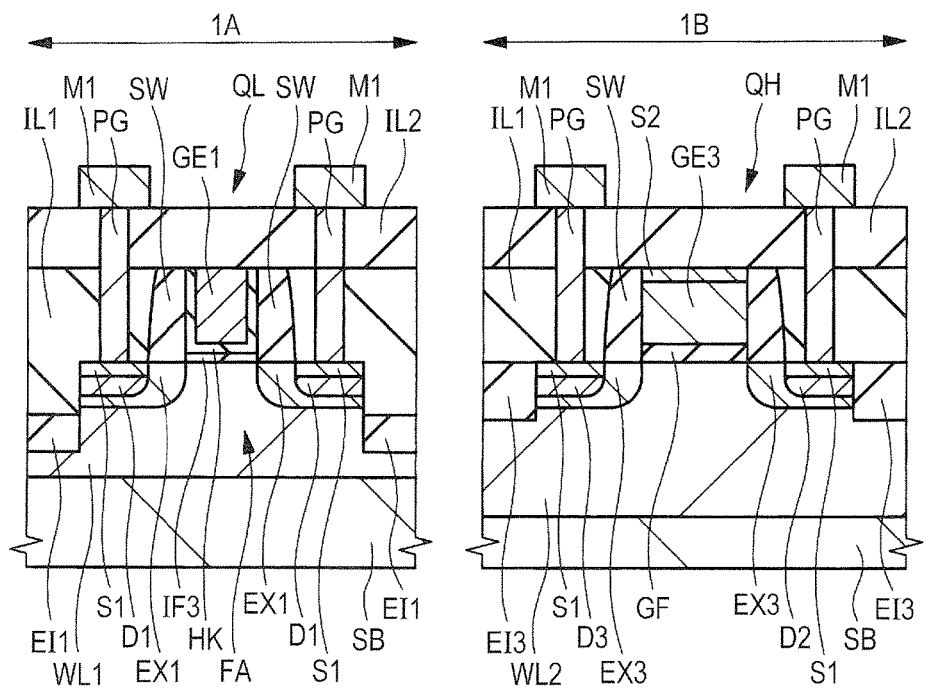
FIG. 50 is a sectional view of a semiconductor device of a comparative example.

Effects of the semiconductor device and the manufacturing method of the first embodiment are described below with reference to FIG. 50 illustrating a semiconductor device of a comparative example. FIG. 50 is a sectional view illustrating the semiconductor device of the comparative example. FIG. 50 shows a low-withstand-voltage transistor QL formed in the low-withstand-voltage transistor region 1A and a high-withstand-voltage transistor QH1 formed in the high-withstand-voltage transistor region 1B. FIG. 50 shows a cross section along the gate length direction of each of the low-withstand-voltage transistor QL and the high-withstand-voltage transistor QH1.

The low-withstand-voltage transistor QL of the comparative example illustrated in FIG. 50 is a FINFET and has the same structure as the low-withstand-voltage transistor QL (see FIG. 3) of the first embodiment. On the other hand, the high-withstand-voltage transistor QH1 of the comparative example illustrated in FIG. 50 is not a FINFET, but an FET including source and drain regions formed in the main surface of a flat semiconductor substrate SB, a channel region between the source and drain regions, and a gate electrode GE3 over the channel region, i.e., a so-called planar type FET.

As illustrated in FIG. 50, the MISFET is formed on the fin FA, and thus a FINFET having a channel region including the top and the side surfaces of the fin FA can be formed in the low-withstand-voltage transistor region 1A. The FINFET has a three-dimensional channel region, and thus achieves a low-withstand-voltage transistor QL having a large gate width, a large channel area, and a small areal occupancy in planar view. Hence, the fin-type low-withstand-voltage transistor QL is formed instead of the planar-type, thereby a size of the low-withstand-voltage semiconductor element can be reduced.

On the other hand, the high-withstand-voltage transistor is an element that operates at a high voltage, carries a large current, and requires a high withstand voltage compared with the low-withstand-voltage transistor QL. This is because the high-withstand-voltage transistor is an element used for supplying a high voltage to a memory cell, for example, for write or erase of a flash memory, or an element used for input/output of a power supply voltage between the semiconductor device and an external device. Hence, the high-withstand-voltage transistor must have a channel region having a large area. The high-withstand-voltage transistor is probably formed on one fin to increase the area of the channel region of the high-withstand-voltage transistor.

However, even if a high-withstand-voltage transistor including one fin and a gate electrode straddling the fin is formed, the high-withstand-voltage transistor is difficult to be reduced in size. This is because the high-withstand-voltage transistor must have a larger gate width than the low-withstand-voltage transistor QL, and even if the high-withstand-voltage transistor is formed on one fin, the gate width is substantially not increased. Specifically, the fin can be formed with a limited height. It is therefore difficult to greatly increase the channel area and the gate width of the FINFET on the side surface of one fin. Hence, the width of the top of the fin in the gate width direction should be increased to increase the gate width of the high-withstand-voltage transistor on one fin, and thus only a small advantage is given by providing the fin-type high-withstand-voltage transistor.

It is therefore difficult to reduce a size of the semiconductor device by using the high-withstand-voltage transistor having the fin structure formed on one fin. Therefore, as illustrated in FIG. 50, even if the low-withstand-voltage transistor QL can be formed as a FINFET so as to be reduced in size, the high-withstand-voltage transistor QH1 is formed as a planar-type MISFET having the source and drain regions and the channel region in the main surface of the flat semiconductor substrate SB, and thus the high-withstand-voltage transistor QH1 cannot be reduced in size. That is, existence of the high-withstand-voltage transistor QH1 hinders a reduction in size of the entire semiconductor device.

The main surface, in which the source and drain regions and the channel layer of the high-withstand-voltage transistor QH1 are formed, of the semiconductor substrate SB in the high-withstand-voltage transistor region 1B is located at the same height as that of the top of the fin FA. An element isolation film EI3 is provided in a trench that surrounds the high-withstand-voltage transistor QH1 in planar view and is formed in the main surface of the semiconductor substrate SB in the high-withstand-voltage transistor region 1B. Each of the source and drain regions of the high-withstand-voltage QH1 has an extension region EX3 and a diffusion region D3.

In the first embodiment, therefore, as illustrated in FIGS. 2 and 3, a high-withstand-voltage transistor QH having the gate electrode GE2 straddling a plurality of fins FB is formed in the high-withstand-voltage transistor region 1B, and the main surface (planar portions) of the semiconductor substrate SB between the fins FB is not covered with the element isolation film and used as the channel region of the high-withstand-voltage transistor QH. Consequently, the high-withstand-voltage transistor QH has a channel region including the tops and the side surfaces of the fins FB and the plurality of planar portions adjacent to the respective fins FB.

Hence, the high-withstand-voltage transistor QH of the first embodiment can have a long gate width along the tops and the side surfaces of the fins FB and along the planar portions adjacent to the respective fins FB. That is, a high-withstand-voltage transistor QH, which has a large channel area and a large effective gate width as compared with the comparative example, can be provided in a three-dimensional region without increasing the areal occupancy of one high-withstand-voltage transistor QH in planar view. Specifically, the high-withstand-voltage transistor QH has a small areal occupancy and a large channel area and a large gate width as compared with the high-withstand-voltage transistor formed on one fin surrounded by the element isolation film or the planar-type high-withstand-voltage transistor QH1 (see FIG. 50).

In the first embodiment, therefore, the size of the high-withstand-voltage transistor QH can be reduced without impairing the performance and reliability of the high-withstand-voltage transistor QH. Hence, since the high-withstand-voltage transistor QH can be reduced in size in addition to the low-withstand-voltage transistor QL, performance of the semiconductor device can be improved.

In the first embodiment, each of the fins FA and FB has a sufficient width in the Y direction (the lateral direction of the fin FA or FB) to allow each of the fins FA and FB to be depleted during operation of the FINFET. That is, the width in the Y direction of each of the fins FA and FB is 50 nm or less. Hence, the fins FA and FB can be completely depleted. It is therefore possible to easily control the threshold voltage of each fin field effect transistor.

In the high-withstand-voltage transistor region 1B, a plurality of trenches are probably formed in the main surface of the semiconductor substrate SB rather than forming the fin FB protruding above the main surface of the semiconductor substrate SB to provide the gate width of the high-withstand-voltage transistor having the gate insulating film straddling the plurality of trenches. In the semiconductor device of the first embodiment having the low-withstand-voltage transistor QL being the FINFET, however, it is preferred that the fins FB are also formed in the high-withstand-voltage transistor region 1B in accordance with the low-withstand-voltage transistor region 1A from the viewpoint of compatibility of a transistor formation process, advantageously leading to a simple manufacturing process. Specifically, the low-withstand-voltage transistor QL and the high-withstand-voltage transistor QH can be formed together through a FINFET formation process.

Since the fins FA and FB formed in the same process are provided in the low-withstand-voltage transistor region 1A and the high-withstand-voltage transistor region 1B, respectively, the tops of the fins FA and FB have substantially the same height, and the planar portion around the fin FA has a height substantially equal to the height of the planar portion around the fin FB. The formation position of the element isolation film EI1 covering a part of each side surface of the fin FA is higher than the formation position of the element isolation film EI2 in the trench formed in the planar portion of the high-withstand-voltage transistor region 1B.

Second Embodiment

Figure 30:
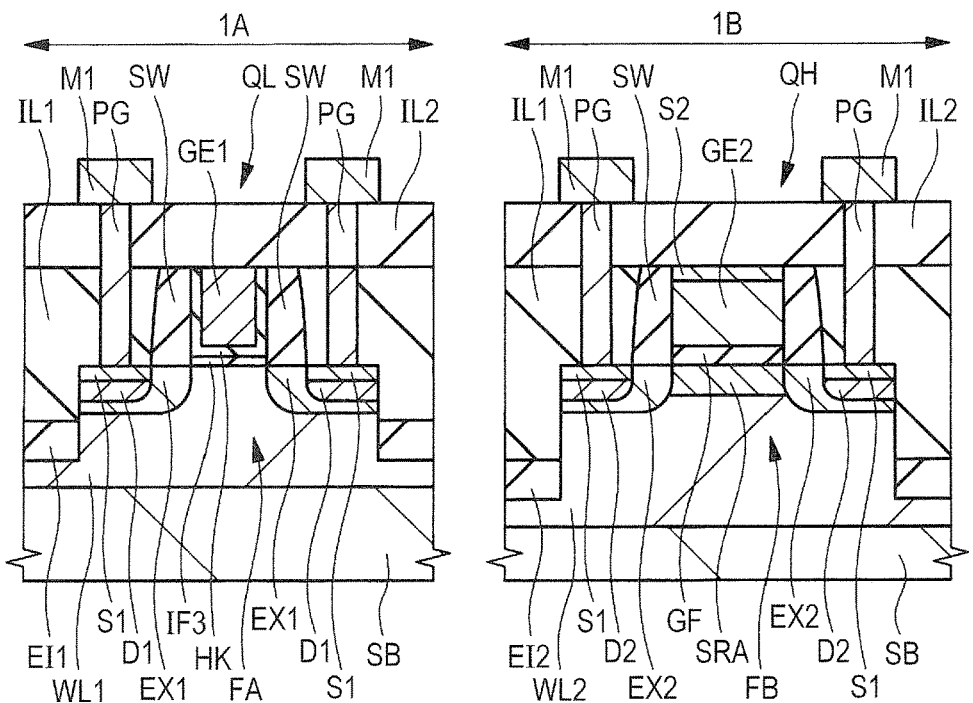
FIG. 30 is a sectional view of a semiconductor device of a second embodiment of the invention.
Figure 31:
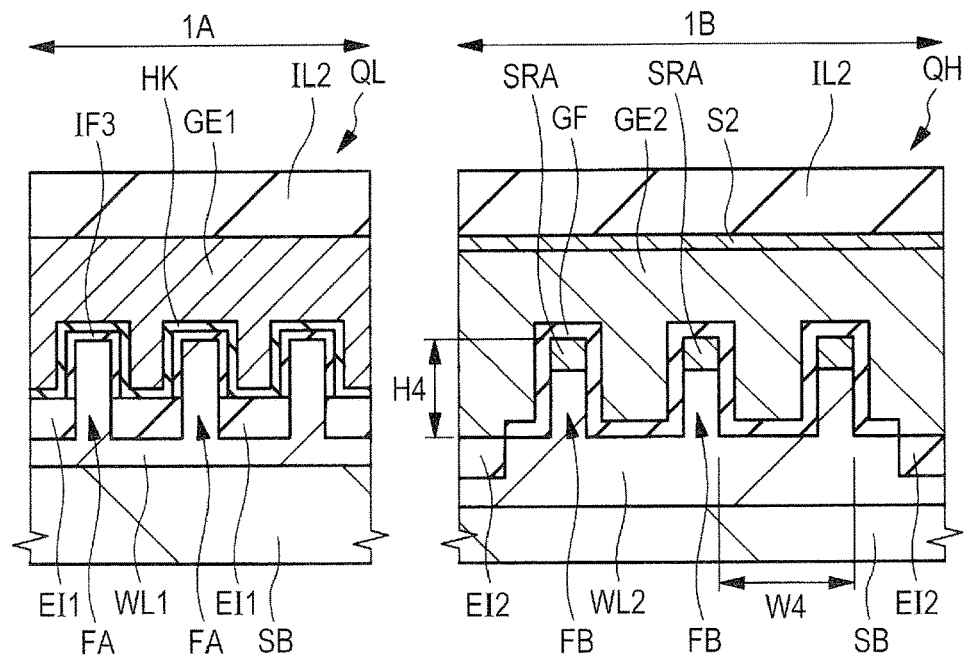
FIG. 31 is a sectional view of the semiconductor device of the second embodiment of the invention.
Figure 32:
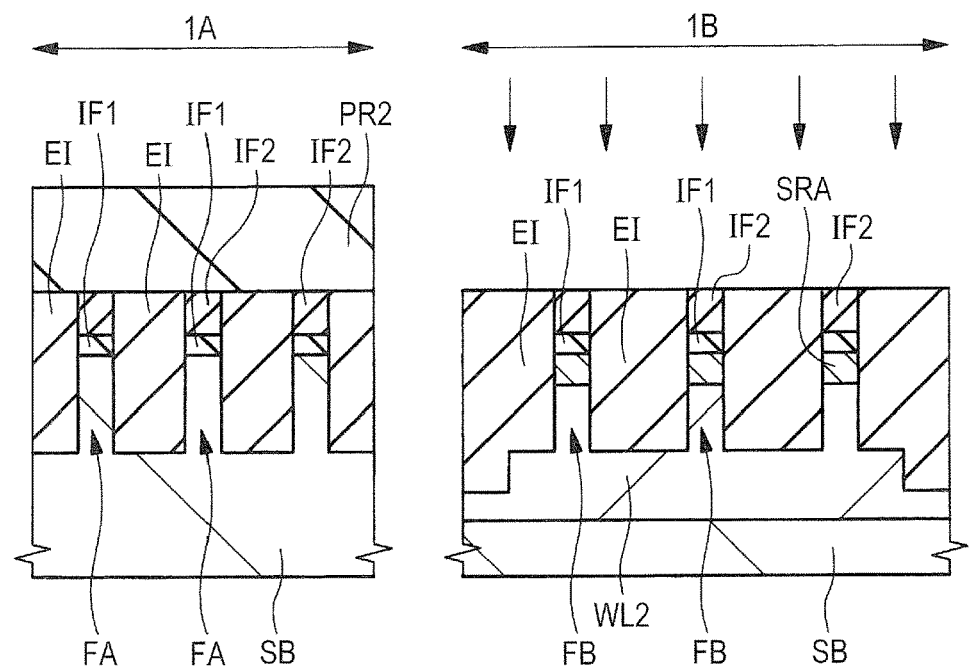
FIG. 32 is a sectional view of the semiconductor device of the second embodiment of the invention during a manufacturing process of the semiconductor device.
Figure 33:
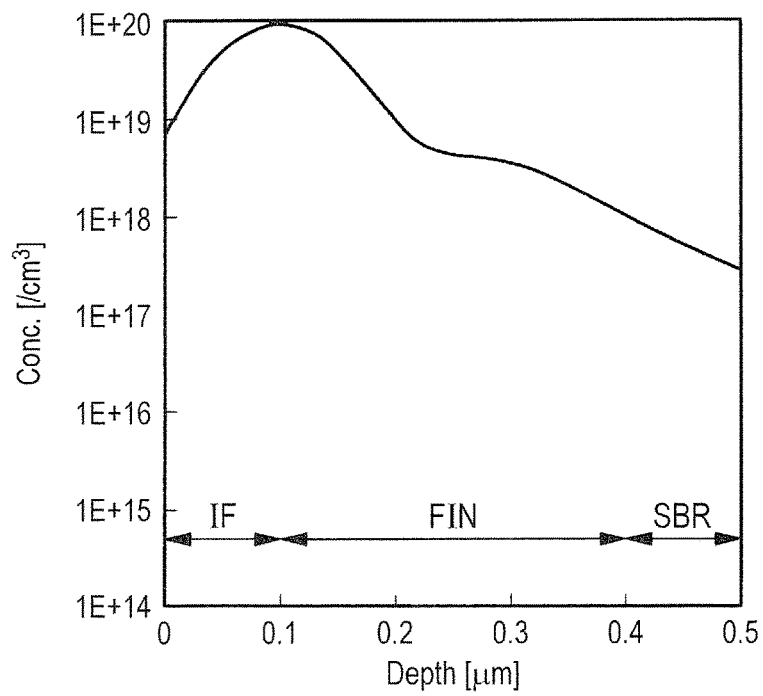
FIG. 33 is a graph showing an impurity concentration in a semiconductor substrate of the second embodiment of the invention.

A semiconductor device of a second embodiment and a method of manufacturing the semiconductor device are described below with reference to FIGS. 30 to 33. FIGS. 30 and 31 are each a sectional view of the semiconductor device of the second embodiment. FIG. 32 is a sectional view of the semiconductor device of the second embodiment during a manufacturing process of the semiconductor device. FIG. 33 is a graph showing an impurity concentration in the semiconductor substrate of the second embodiment. FIG. 30 is a sectional view along the longitudinal direction of the fin as in FIG. 3, and FIG. 31 is a sectional view along the lateral direction of the fin as in FIG. 4. The impurity referred to in the second embodiment means a p-type impurity.

A kink phenomenon occurs in current characteristics due to different operations between a MISFET in the upper end portion of the fin and a MISFET in the planar portion in a high-withstand-voltage transistor having a channel region including the surface of the fin and the planar portion as with the high-withstand-voltage transistor of the first embodiment. A measure to prevent occurrence of such a kink phenomenon is now described.

In the following description, the interior of the fin is divided into three portions (regions) in a direction (height direction) perpendicular to the main surface of the semiconductor substrate. Specifically, each fin has a lower end portion, a middle portion, and an upper end portion in a height direction above the planar portion. That is, each fin has the upper end portion and the lower end portion, and has the middle portion between the upper and lower end portions. Hereinafter, the semiconductor substrate under the fin may be referred to as a planar portion or substrate portion. The upper end portion of the fin referred to in the present application is a region including the top of the fin.

As illustrated in FIGS. 30 and 31, the semiconductor device of the second embodiment has a shape similar to that of the semiconductor device described in the first embodiment, and includes a low-withstand-voltage transistor QL and a high-withstand-voltage transistor QH. However, the semiconductor device of the second embodiment is different from the semiconductor device of the first embodiment in that in the high-withstand-voltage transistor QH, the concentration of the p-type impurity (for example, boron (B)) in the channel region in the upper end portion of the fin FB is higher than that in the channel region in each of the middle portion of the fin FB, the lower end portion of the fin FB, and the planar portion of the substrate SB.

That is, a semiconductor region SRA having a higher p-type impurity concentration than the well WL2 is provided in the semiconductor substrate SB in the upper end portion of the fin FB. The semiconductor region SRA is not provided in the middle portion and the lower end portion of the fin FB, and in the planar portion of the semiconductor substrate SB and also in the low-withstand-voltage transistor region 1A.

Such a semiconductor region SRA can be formed by an ion implantation step performed to form the channel region as described with reference to FIG. 12. Specifically, the ion implantation step performed to form the channel region includes a plurality of ion implantation steps, and the semiconductor region SRA can be formed by some of the ion implantation steps.

Specifically, as illustrated in FIG. 32, implantation is performed to form the channel region after or before the formation step of the well WL2 as described with reference to FIG. 12 in the manufacturing process of the semiconductor device of the second embodiment. The photoresist film PR2 is used as a mask so that a p-type impurity (for example, boron (B)) is implanted by an ion implantation process to a main surface side of the semiconductor substrate SB in the high-withstand-voltage transistor region 1B. The ion implantation is performed in a direction perpendicular to the main surface of the semiconductor substrate SB.

At this time, the impurity ions pass through the insulating films IF1 and IF2 and reach the upper end portion of the fin FB. In the ion implantation, the implantation energy is reduced to prevent the impurity ions from being introduced into the semiconductor substrate SB below the upper end portion of the fin FB. Subsequent steps are performed in the same way as the steps described with reference to FIGS. 12 to 29, thereby the semiconductor device of the second embodiment illustrated in FIGS. 30 and 31 is substantially completed.

FIG. 33 shows a graph showing a relationship between the depth (horizontal axis) and the concentration (vertical axis) of the p-type impurity in a predetermined region of the semiconductor device of the second embodiment. The graph of FIG. 33 shows distribution of the p-type impurity immediately after formation of the semiconductor region SRA illustrated in FIG. 32. FIG. 33 shows an insulating film region IF having the insulating films IF2 and IF1, a fin region FIN having the fin FB, and the substrate region SBR indicating the planar portion of the semiconductor substrate SB below the fin FB in order from the left side along the horizontal axis. Specifically, along the horizontal axis, a depth range of 0 to 0.1 μm corresponds to the insulating film region IF, a depth range of 0.1 to 0.4 μm corresponds to the fin region FIN, and a depth range of 0.4 to 0.5 μm corresponds to the substrate region SBR. The same holds true for FIGS. 38, 43, and 47 used in the later description.

As illustrated in FIG. 33, the uppermost portion of the fin FB has the highest concentration of the p-type impurity in the semiconductor substrate SB including the inside of the fin FB, and the p-type impurity concentration gradually decreases from the upper end of the fin FB to a back side of the semiconductor substrate SB. Specifically, directly below the gate electrode GE2, the impurity concentration in the semiconductor substrate SB gradually decreases from the top of the fin FB to the bottom side opposite to the top of the semiconductor substrate SB.

In other words, the average (first concentration) of the impurity concentration of the upper end portion of the fin FB is higher than the average (second concentration) of the impurity concentration of the middle portion of the fin FB, the second concentration is higher than the average (third concentration) of the impurity concentration of the lower end portion of the fin FB, and the third concentration is higher than the average (fourth concentration) of the impurity concentration of the planar portion. Such concentration distribution of the impurity in the semiconductor substrate SB is given not only during the manufacturing process illustrated in FIG. 32 but also in the completed semiconductor device.

Figure 34:
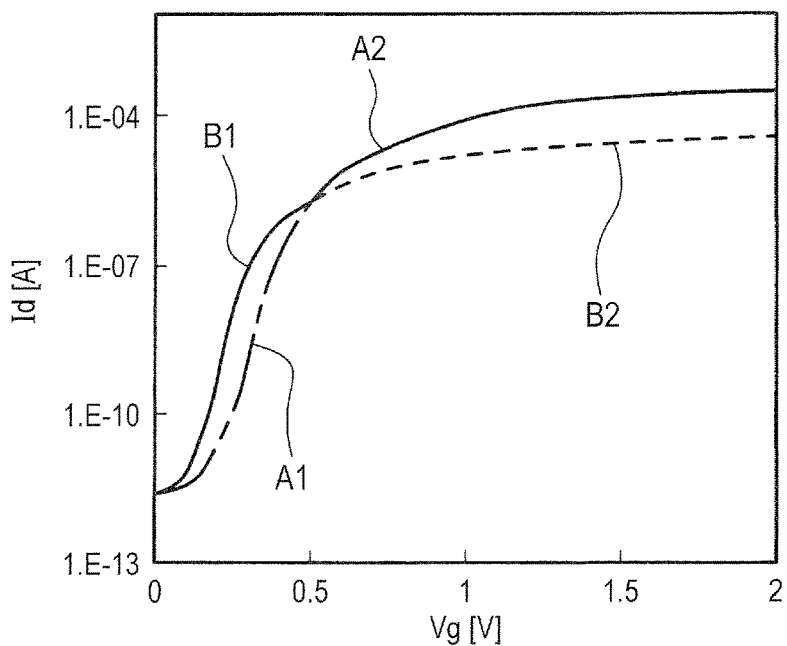
FIG. 34 includes graphs each showing a relationship between a gate voltage and a drain current of a high-withstand-voltage transistor of a comparative example.

Effects of the second embodiment are now described with reference to FIG. 34. FIG. 34 includes graphs each showing a relationship between a gate voltage (horizontal axis) applied to a high-withstand-voltage transistor as a semiconductor device of a comparative example, and a drain current (vertical axis) flowing through the high-withstand-voltage transistor. The withstand voltage transistor as the semiconductor device of the comparative example is a high-withstand-voltage transistor that has the channel region including the top and the side surfaces of the fin and the planar portion between the adjacent fins, and has a substantially uniform impurity concentration distribution from the upper end of each fin to the planar portion, for example.

FIG. 34 shows a graph of actual current-voltage characteristics by a solid line. In addition, FIG. 34 shows a graph B2 of current-voltage characteristics of one transistor, which has a channel region including the upper end of each fin, of the high-withstand-voltage transistor, by a broken line, and shows a graph A1 of current-voltage characteristics of another transistor, which has a channel region including a region other than the upper end of the fin, by a one-dot chain line.

The high-withstand-voltage transistor having the channel region including the top and the side surfaces of the fin and the planar portion between the adjacent fins may exhibit current-voltage characteristics of a combination of two types of transistors due to a structure having fins protruding above the semiconductor substrate as part of the channel region. Specifically, as shown by the solid line graph in FIG. 34, when a voltage is applied to the high-withstand-voltage transistor while the voltage is gradually increased from zero, a current first flows as indicated by a solid line graph B1, and then as the applied voltage is further increased, the current suddenly increases at the point where the graph B1 intersects with the graph A1, and a current flows as shown in the graph A2.

In this way, when the applied voltage is gradually increased, the current value suddenly varies, resulting in a step in the graph of current-voltage characteristics. Such a phenomenon is called kink phenomenon, and a waveform of the graph having such a step is referred to as hump waveform. The kink phenomenon is found when gate voltage dependence of a drain current is measured, in which the drain current varies at a certain voltage value so as to form an irregular hump shape, leading to formation of a stepwise waveform (hump waveform). When the current varies irregularly in this way, operation of the semiconductor device is difficult to be controlled. It is therefore important to prevent occurrence of the kink phenomenon and make the graph of the current-voltage characteristics to be smooth from the viewpoint of improving the performance and reliability of the semiconductor device.

The kink phenomenon in the high-withstand-voltage transistor occurs due to a fact that the upper end portion of the fin has a threshold voltage lower than any other region because an electric field tends to be concentrated at the upper end portion, and is thus turned on before other regions when a voltage is applied to the high-withstand-voltage transistor. Specifically, the graphs B1 and B2 in FIG. 34 show the current-voltage characteristics of the transistor having the channel region including the upper end of the fin, and the graphs A1 and A2 show the current-voltage characteristics of a transistor having the channel region including a region other than the upper end of the fin. The high-withstand-voltage transistor, which has the channel region including the top and the side surfaces of the fin and the planar portion between the adjacent fins, thus exhibits such current-voltage characteristics as a combination of the characteristics of the two types of transistors, causing the kink phenomenon as described above.

In the second embodiment, therefore, as described with reference to FIGS. 30 to 32, the semiconductor region SRA being a channel region having a high impurity concentration is formed in the upper end portion of the fin FB to increase the threshold voltage of the transistor having a channel region including the upper end portion of the fin FB. As a result, the threshold voltage of the entire channel region can be equalized between the upper end portion of the fin FB and any other region. In such a case, the waveform of the graph of the current-voltage characteristics becomes similar to the shape of the waveform including the graphs A1 and A2.

In the second embodiment, although the threshold voltage of the high-withstand-voltage transistor QH is increased, occurrence of the kink phenomenon can be prevented. In addition, even if the semiconductor region SRA is formed, only the threshold voltage of the transistor in the upper end portion of the fin FB increases, and a substantially unvaried current flows through the transistor in the on state. Hence, the effect described in the first embodiment can also be given in the second embodiment unlike the comparative example (see FIG. 50). That is, the high-withstand-voltage transistor QH having a large channel area, which has the channel region including the planar portions and the surfaces of the fins FB, is formed to increase an effective gate width so that a size of the semiconductor device is reduced.

In the second embodiment, therefore, it is possible to improve the performance and reliability of the semiconductor device by reducing a size of the semiconductor device and suppressing occurrence of the kink phenomenon.

Third Embodiment

Figure 35:
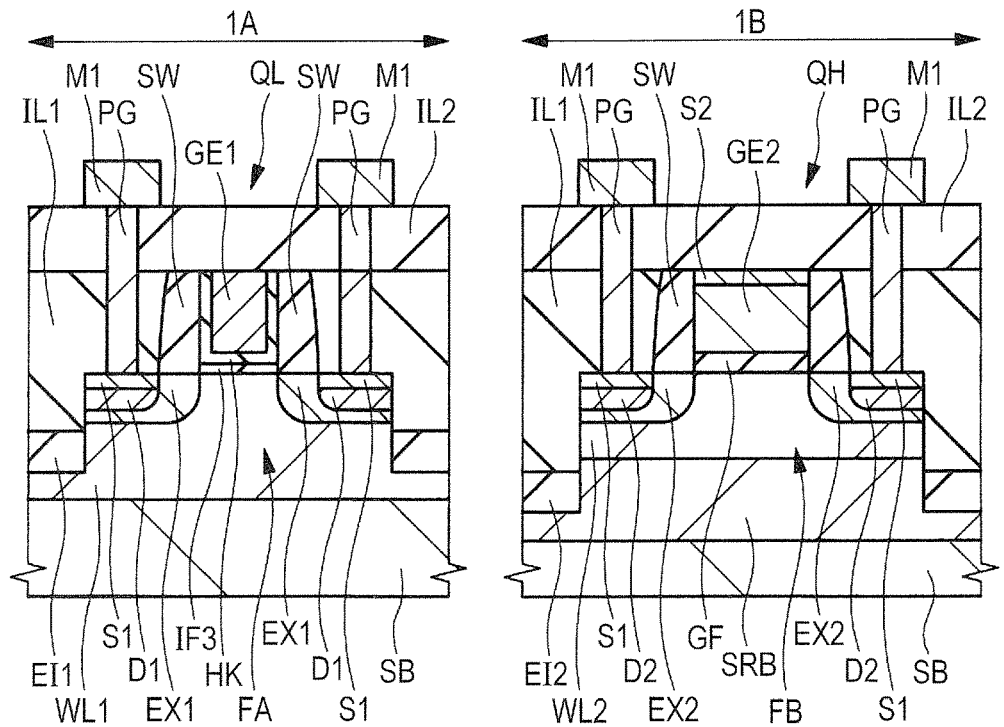
FIG. 35 is a sectional view of a semiconductor device of a third embodiment of the invention.
Figure 36:
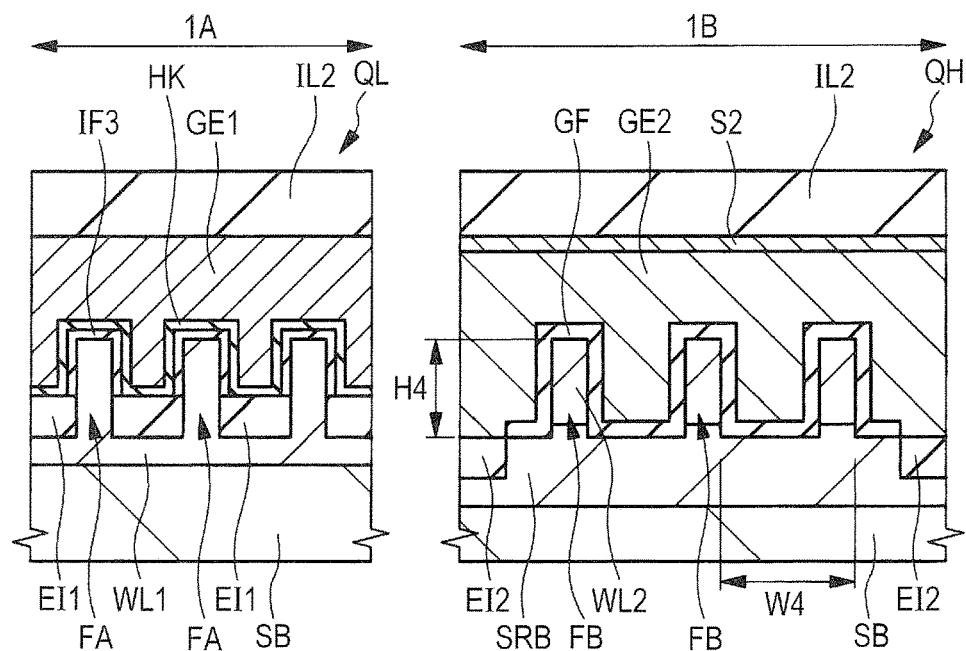
FIG. 36 is a sectional view of the semiconductor device of the third embodiment of the invention.
Figure 37:
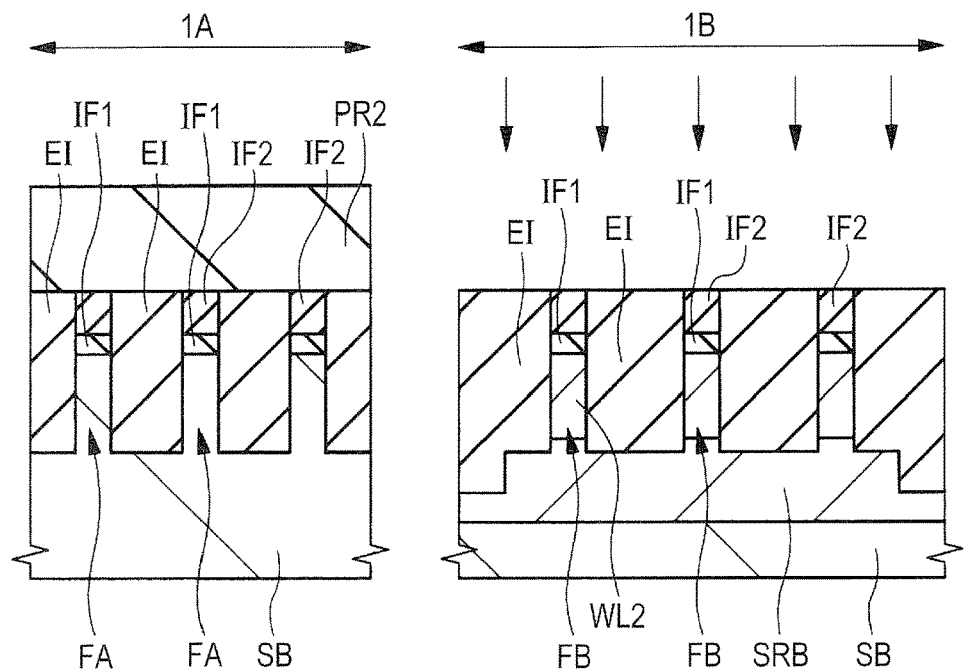
FIG. 37 is a sectional view of the semiconductor device of the third embodiment of the invention during a manufacturing process of the semiconductor device.
Figure 38:
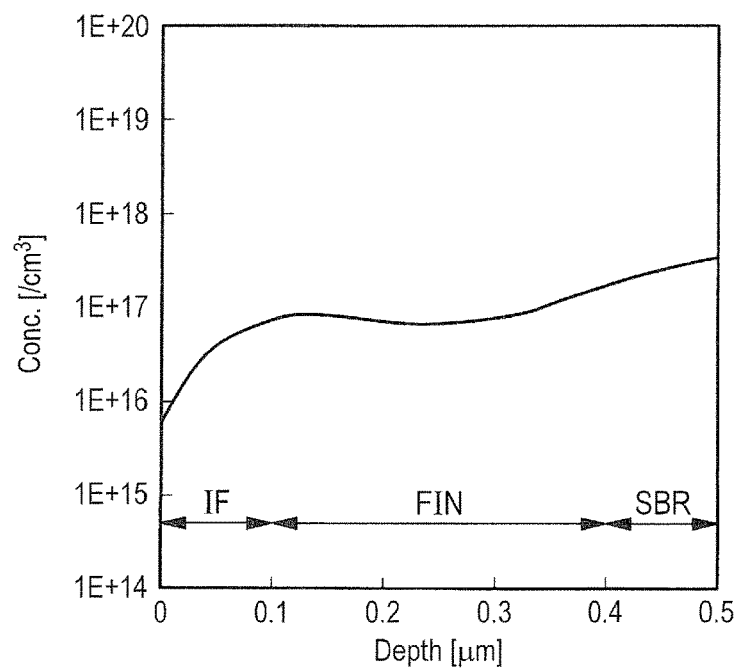
FIG. 38 is a graph showing an impurity concentration in a semiconductor substrate of the third embodiment of the invention.

A semiconductor device of a third embodiment and a method of manufacturing the semiconductor device are described below with reference to FIGS. 35 to 38. FIGS. 35 and 36 are each a sectional view of the semiconductor device of the third embodiment. FIG. 37 is a sectional view of the semiconductor device of the third embodiment during a manufacturing process of the semiconductor device. FIG. 38 is a graph showing an impurity concentration in the semiconductor substrate of the third embodiment. FIG. 35 is a sectional view along the longitudinal direction of the fin as in FIG. 3, and FIG. 36 is a sectional view along the lateral direction of the fin as in FIG. 4. The impurity referred to in the third embodiment means a p-type impurity.

A kink phenomenon occurs in current characteristics due to different operations between a MISFET in the upper end portion of the fin and a MISFET in the planar portion in a high-withstand-voltage transistor having a channel region including the surface of the fin and the planar portion as with the high-withstand-voltage transistor of the first embodiment. A measure to prevent occurrence of such a kink phenomenon is now described. In the following description, the interior of the fin is divided into an upper end portion, a middle portion, and a lower end portion in a direction (height direction) perpendicular to the main surface of the semiconductor substrate.

As illustrated in FIGS. 35 and 36, the semiconductor device of the third embodiment has a shape similar to that of the semiconductor device described in the first embodiment, and includes a low-withstand-voltage transistor QL and a high-withstand-voltage transistor QH. In the high-withstand-voltage transistor QH of the third embodiment, however, a relationship H4/W4>0.5 exists between the width W4 and the height H4. In other words, the height H4 is larger than the value of a half of the width W4. Specifically, the height of the fin FB and the distance between the adjacent fins FB are in a relationship where the height of the fin FB is relatively high, and the distance between the adjacent fins FB is relatively small.

The semiconductor device of the third embodiment is different from the semiconductor device of the first embodiment in that in the high-withstand-voltage transistor QH, the concentration of the p-type impurity (for example, boron (B)) in the channel region in each of the lower end portion of the fin FB and the planar portion is higher than that in the channel region in each of the upper end portion and the middle portion of the fin FB.

Specifically, a semiconductor region SRB having a higher p-type impurity concentration than the well WL2 is provided in the semiconductor substrate SB in each of the lower end portion of the fin FB and the planar portion. The semiconductor region SRB is not provided in each of the upper end portion and the middle portion of the fin FB and also in the low-withstand-voltage transistor region 1A.

Such a semiconductor region SRB can be formed by an ion implantation step performed to form the channel region as described with reference to FIG. 12. Specifically, the ion implantation step performed to form the channel region includes a plurality of ion implantation steps, and the semiconductor region SRB can be formed by some of the ion implantation steps.

Specifically, as illustrated in FIG. 37, implantation is performed to form the channel region after or before the formation step of the well WL2 described with reference to FIG. 12 in the manufacturing process of the semiconductor device of the third embodiment. The photoresist film PR2 is used as a mask so that a p-type impurity (for example, boron (B)) is implanted by an ion implantation process to a main surface side of the semiconductor substrate SB in the high-withstand-voltage transistor region 1B. The ion implantation is performed in a direction perpendicular to the main surface of the semiconductor substrate SB.

At this time, the impurity ions pass through the insulating films EI, IF1, and IF2 and reach the lower end portion of the fin FB and the planar portion. In the ion implantation, the implantation energy is controlled to be relatively high to prevent the impurity ions from being introduced into the middle portion and the upper end portion of the fin FB. Subsequent steps are performed in the same way as the steps described with reference to FIGS. 12 to 29, thereby the semiconductor device of the third embodiment illustrated in FIGS. 35 and 36 is substantially completed.

FIG. 38 shows a graph showing a relationship between the depth (horizontal axis) and the concentration (vertical axis) of the p-type impurity in a predetermined region of the semiconductor device of the third embodiment. The graph of FIG. 38 shows distribution of the p-type impurity immediately after formation of the semiconductor region SRB illustrated in FIG. 37.

As illustrated in FIG. 38, the lower end portion of the fin FB and the planar portion of the semiconductor substrate SB each have a particularly high p-type impurity concentration in the semiconductor substrate SB including the inside of the fin FB. In other words, each of the average (third concentration) of the impurity concentration of the lower end portion of the fin FB and the average (fourth concentration) of the impurity concentration of the planar portion are higher than each of the average (first concentration) of the impurity concentration of the upper end portion of the fin FB and the average (second concentration) of the impurity concentration of the middle portion of the fin FB. Such concentration distribution of the impurity in the semiconductor substrate SB is given not only during the manufacturing process illustrated in FIG. 37 but also in the completed semiconductor device.

Figure 39:
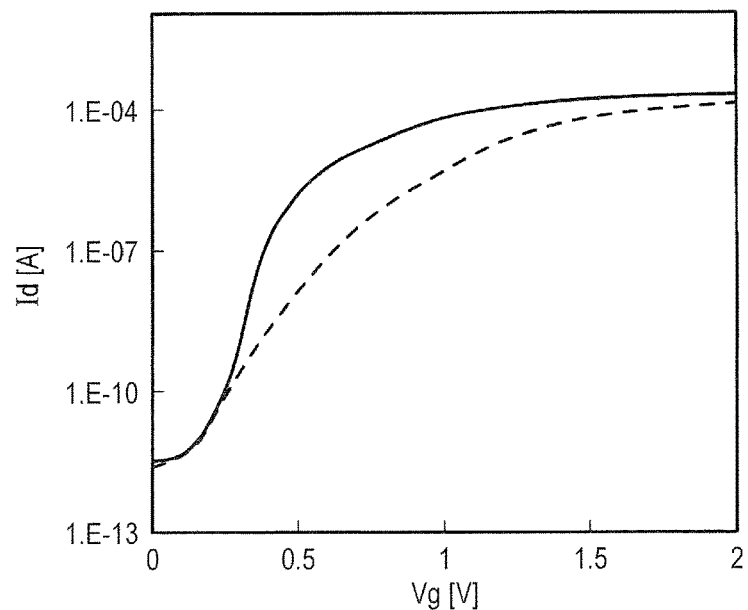
FIG. 39 includes graphs each showing a relationship between a gate voltage and a drain current of a high-withstand-voltage transistor of the third embodiment of the invention.

Effects of the third embodiment are now described with reference to FIG. 39. FIG. 39 includes graphs each showing a relationship between a gate voltage (horizontal axis) applied to the high-withstand-voltage transistor QH (see FIG. 35) as the semiconductor device of the third embodiment, and a drain current (vertical axis) flowing through the high-withstand-voltage transistor QH.

FIG. 39 shows a graph of the current-voltage characteristics of the high-withstand-voltage transistor QH of the third embodiment by a solid line. In addition, FIG. 39 shows, by a broken line, a graph of the current-voltage characteristics of one high-withstand-voltage transistor QH having a channel region including only the planar portion.

The high-withstand-voltage transistor having the channel region including the fin and the planar portion probably exhibits current-voltage characteristics of a combination of two types of transistors, i.e., a transistor having a channel region including the surface of the fin and a transistor having a channel region including the planar portion. This is because the two types of transistors have different threshold characteristics.

When a kink phenomenon occurs, for example, the entire graph shown by the broken line in FIG. 39 is shifted to the left side of the drawing, thereby the transistor (broken line graph) having the channel region including the planar portion is probably turned on before the transistor (solid line graph) having the channel region including the surface of the fin. Subsequently, as the gate voltage is increased, the current characteristics are changed at a predetermined voltage value, so that the current of the high-withstand-voltage transistor varies along the characteristics of the transistor (solid line graph) having the channel region including the surface of the fin. In this way, a kink phenomenon occurs.

In a possible method of suppressing occurrence of the kink phenomenon in the high-withstand-voltage transistor, the threshold voltage of one of the transistor having the channel region including the planar portion and the transistor having the channel region including the surface of the fin is increased, thereby the current waveform of the entire high-withstand-voltage transistor is made closer to the waveform of the current characteristics of the other transistor.

In a high-withstand-voltage transistor in which a width W4 between the side surfaces of the adjacent fins and a fin height H4 have a relationship given by an expression of H4/W4>0.5, the distance between the fins is small and the fin height is relatively high, and thus a small current flows through the planar portion while a large current flows through the fin in the high-withstand-voltage transistor.

In order to prevent occurrence of the kink phenomenon in such a high-withstand-voltage transistor, the threshold voltage of the transistor having the channel region including the planar portion is preferably increased so that the waveform of the current flowing through the entire high-withstand-voltage transistor is made close to the waveform of the current characteristics of the transistor having the channel region including the fin surface. This is because the current flowing through the entire high-withstand-voltage transistor, in which the width W4 between the side surfaces of the adjacent fins and the fin height H4 have the relationship given by the expression of H4/W4>0.5, mainly contains a current flowing through the fin, and a current flowing through the channel region of the planar portion is inherently small. Hence, when the threshold voltage of the transistor having the channel region including the planar portion is increased, it is possible to prevent performance of the high-withstand-voltage transistor from being greatly deteriorated and to easily suppress occurrence of the kink phenomenon.

In other words, since the current flowing through the entire high voltage transistor is dominated by the current flowing on the surface of the fin, the threshold voltage of the transistor having the channel region including the planar portion is increased rather than the threshold voltage of the transistor having the channel region including the surface of the fin, thereby it is possible to prevent the threshold characteristics of the entire high-withstand-voltage transistor from being deteriorated.

In the third embodiment, as described with reference to FIGS. 35 to 38, the semiconductor region SRB having an impurity concentration higher than that of the well WL2 is provided in the lower end portion of the fin FB and in the planar portion to increase the threshold voltage of the transistor having the channel region including the planar portion. As illustrated in FIG. 39, this increases the value of the voltage (threshold voltage) at which the transistor having the channel region including the planar portion is turned on. As a result, the entire graph of the broken line is shifted to the right side of the drawing. Hence, it is possible to prevent the graph of the solid line from intersecting with the graph of the broken line in the drawing, i.e., to prevent occurrence of the kink phenomenon.

Although the threshold voltage of the transistor in the planar portion is increased due to formation of the semiconductor region SRB illustrated in FIG. 35, the current flowing through the high-withstand-voltage transistor QH is not greatly decreased during the on state of that transistor. Hence, the effect described in the first embodiment can also be given in the third embodiment. That is, the high-withstand-voltage transistor QH having the channel region including the surfaces of the fins FB and the planar portions is formed to increase the effective gate width so that a size of the semiconductor device is reduced.

First Modification

Figure 40:
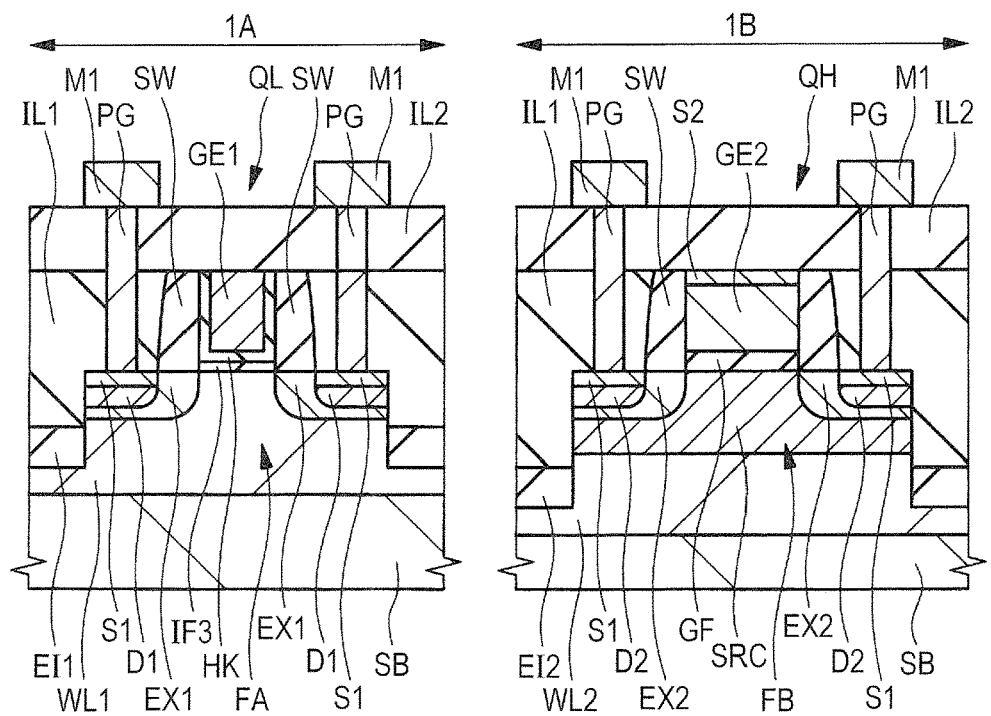
FIG. 40 is a sectional view of a semiconductor device of a first modification of the third embodiment of the invention.
Figure 41:
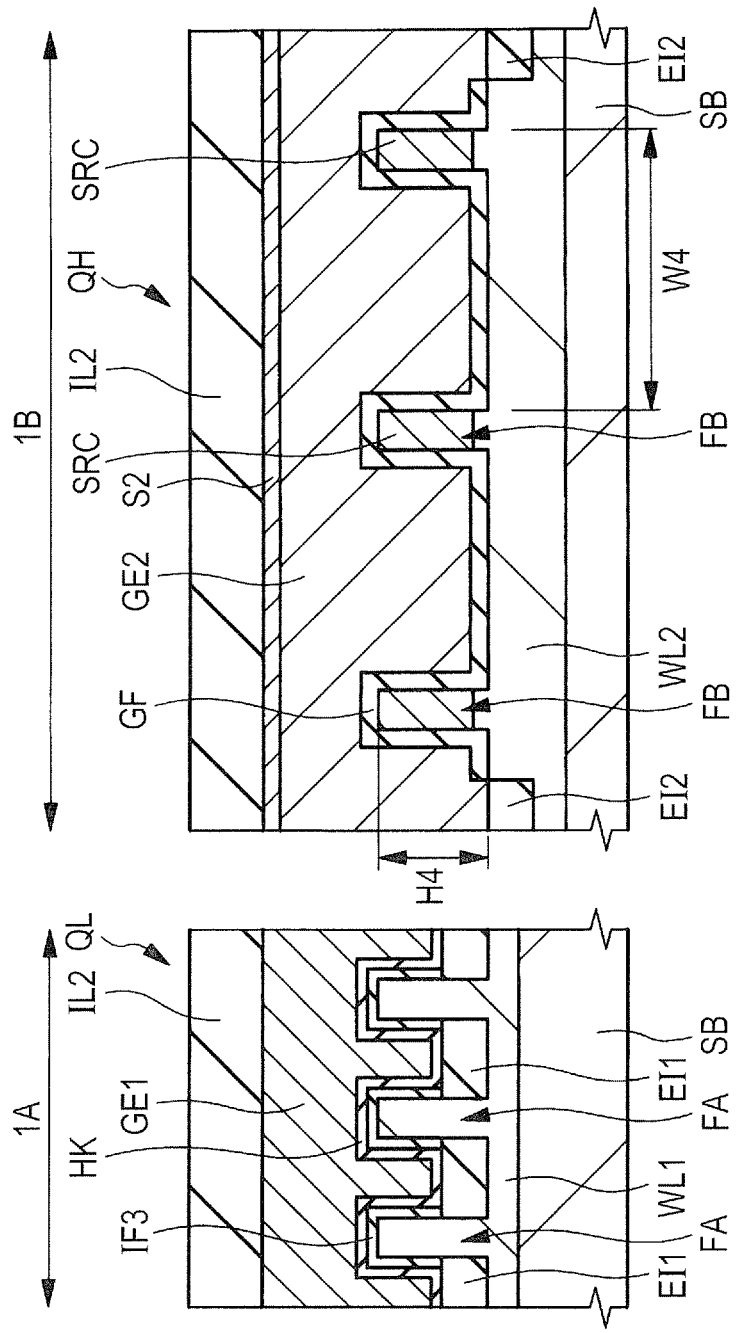
FIG. 41 is a sectional view of the semiconductor device of the first modification of the third embodiment of the invention.
Figure 42:
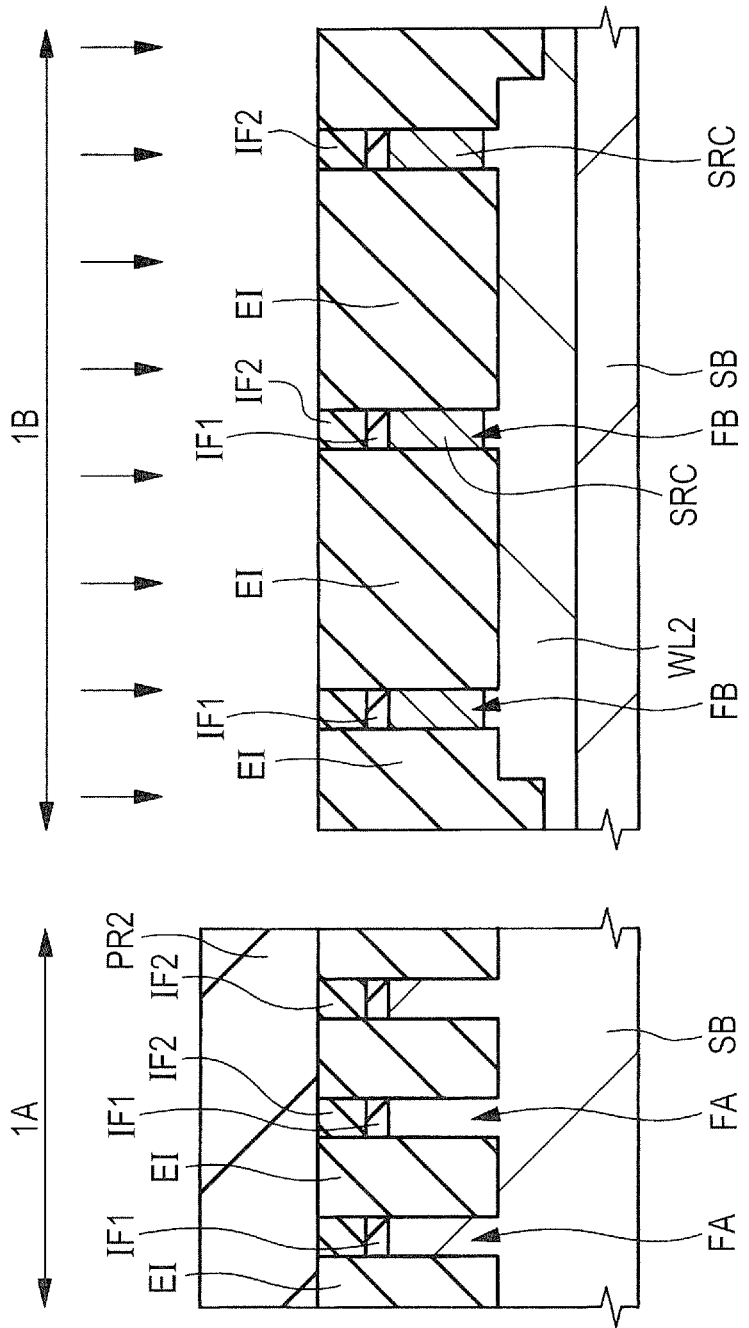
FIG. 42 is a sectional view of the semiconductor device of the first modification of the third embodiment of the invention during a manufacturing process of the semiconductor device.
Figure 43:
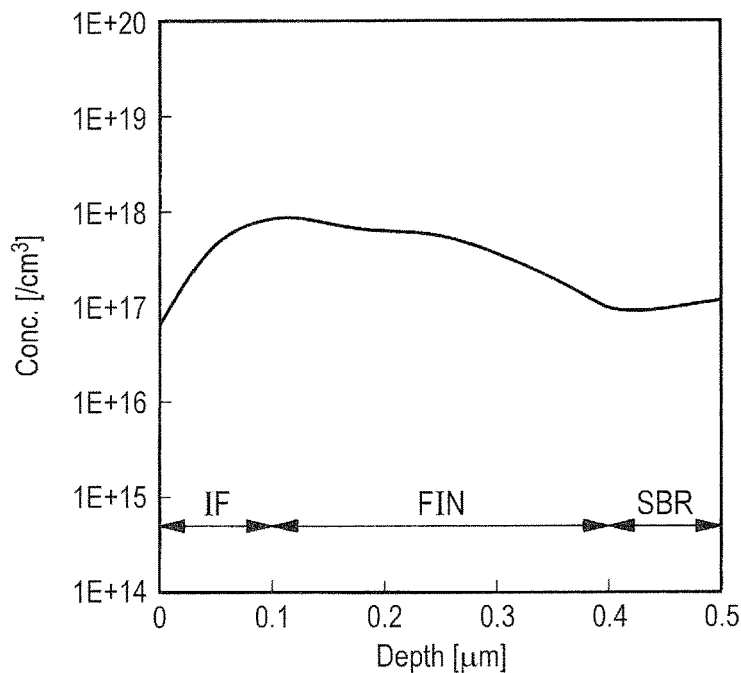
FIG. 43 is a graph showing an impurity concentration in a semiconductor substrate according to the first modification of the third embodiment of the invention.

A semiconductor device of a first modification and a method of manufacturing the semiconductor device are described below with reference to FIGS. 40 to 44. FIGS. 40 and 41 are each a sectional view of the semiconductor device of the first modification. FIG. 42 is a sectional view of the semiconductor device of the first modification during a manufacturing process of the semiconductor device. FIG. 43 is a graph showing an impurity concentration in the semiconductor substrate of the first modification. FIG. 40 is a sectional view along the longitudinal direction of the fin as in FIG. 3, and FIG. 41 is a sectional view along the lateral direction of the fin as in FIG. 4.

Described is a case where a relationship of H4/W4<0.5 exists between the width W4 and the height H4 unlike the semiconductor device described with reference to FIGS. 35 to 38. Specifically, the height of the fin FB illustrated in FIGS. 40 and 41 and the distance between the adjacent fins FB are in a relationship where the height of the fin FB is relatively low, and the distance between the adjacent fins FB is relatively large.

The semiconductor device of the first modification is different from the semiconductor device of the first embodiment in that in the high-withstand-voltage transistor QH, the concentration of the p-type impurity (for example, boron (B)) in the channel region in each of the upper end portion and the middle portion of the fin FB is higher than that in the channel region in each of the lower end portion of the fin FB and the planar portion.

Specifically, a semiconductor region SRC having a higher p-type impurity concentration than the well WL2 is provided in the semiconductor substrate SB in each of the upper end portion and the middle portion of the fin FB. The semiconductor region SRC is provided in the top of the fin FB, but is not provided in each of the lower end portion of the fin FB and the planar portion and also in the low-withstand-voltage transistor region 1A. The semiconductor region SRC may be provided only in the upper end portion including the top of the fin FB while being not provided in the middle portion.

Such a semiconductor region SRC can be formed by an ion implantation step performed to form the channel region as with the step described with reference to FIG. 37. In the ion implantation, the implantation energy is controlled to be relatively low to prevent the impurity ions from being introduced into the lower end portion of the fin FB and into the planar portion. Subsequent steps are performed in the same way as the steps described with reference to FIGS. 12 to 29, thereby the semiconductor device of the first modification illustrated in FIGS. 40 and 41 is substantially completed.

FIG. 43 shows a graph showing a relationship between the depth (horizontal axis) and the concentration (vertical axis) of the p-type impurity in a predetermined region of the semiconductor device of the first modification. The graph of FIG. 43 shows distribution of the p-type impurity immediately after formation of the semiconductor region SRC illustrated in FIG. 42.

As illustrated in FIG. 43, the uppermost portion of the fin FB has a highest p-type impurity concentration in the semiconductor substrate SB including the inside of the fin FB, and the p-type impurity concentration gradually decreases from the upper end of the fin FB to the planar portion. That is, the upper end portion and the middle portion of the fin FB each have a particularly high p-type impurity concentration in the semiconductor substrate SB including the inside of the fin FB. In other words, each of the average (first concentration) of the impurity concentration of the upper end portion of the fin FB and the average (second concentration) of the impurity concentration of the middle portion of the fin FB are higher than each of the average (third concentration) of the impurity concentration of the lower end portion of the fin FB and the average (fourth concentration) of the impurity concentration of the planar portion. Such concentration distribution of the impurity in the semiconductor substrate SB is given not only during the manufacturing process illustrated in FIG. 42 but also in the completed semiconductor device.

Figure 44:
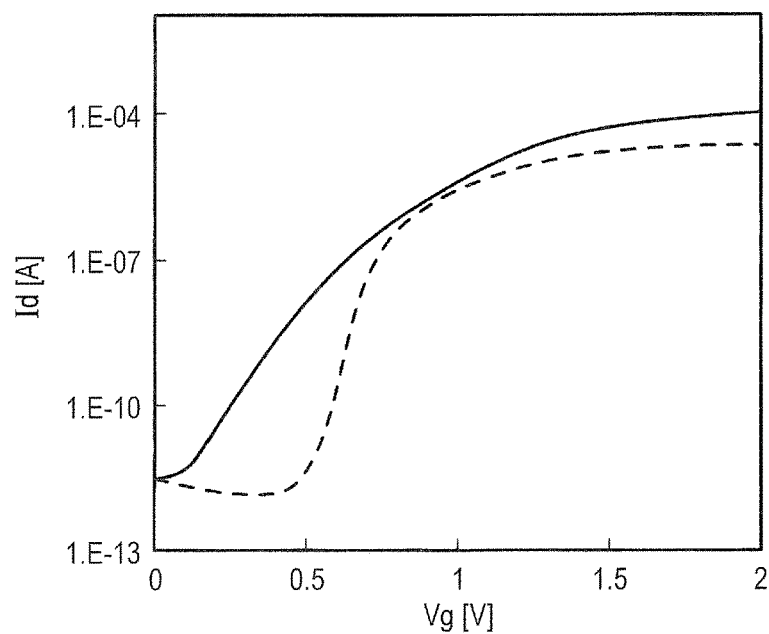
FIG. 44 includes graphs each showing a relationship between a gate voltage and a drain current of a high-withstand-voltage transistor of the first modification of the third embodiment of the invention.

Effects of the first modification are now described with reference to FIG. 44. FIG. 44 includes graphs each showing a relationship between a gate voltage (horizontal axis) applied to the high-withstand-voltage transistor QH (see FIG. 40) as the semiconductor device of the first modification, and a drain current (vertical axis) flowing through the high-withstand-voltage transistor QH.

FIG. 44 shows a graph of the current-voltage characteristics of the high-withstand-voltage transistor QH of the first modification by a solid line. FIG. 44 further shows, by a broken line, a graph of the current-voltage characteristics of one high-withstand-voltage transistor QH having a channel region including only the surface of the fin FB.

In the high-withstand-voltage transistor QH of the first modification, a relationship between the width W4 between the adjacent fins FB and the height H4 of the fin FB is given by an expression of H4/W4<0.5. In other words, the height H4 is smaller than the value of a half of the width W4. That is, the distance between the fins FB is large and the height of the fin FB is relatively low. In the high-withstand-voltage transistor QH, therefore, a large current flows through the planar portion, and a small current flows through the fin FB.

Specifically, only a small current, which is a part of the total current flowing through the entire high-withstand-voltage transistor QH, flows through the channel region in the surface of the fin FB. Hence, when the threshold voltage of the transistor having the channel region including the surface of the fin FB is increased, it is possible to prevent performance of the high-withstand-voltage transistor QH from being greatly deteriorated and to easily suppress occurrence of the kink phenomenon. In other words, since the current flowing through the entire high-withstand-voltage transistor QH is dominated by the current flowing through the planar portion, it is possible to prevent deterioration of the threshold characteristics of the entire high-withstand-voltage transistor QH by increasing the threshold voltage of the transistor having the channel region including the surface of the fin FB rather than the transistor having the channel region including the planar portion.

In the first modification, as described with reference to FIGS. 40 to 43, the semiconductor region SRC having an impurity concentration higher than that of the well WL2 in the planar portion is formed to increase the threshold voltage of the transistor having the channel region including the planar portion. As illustrated in FIG. 44, this increases the value of the turn-on voltage (threshold voltage) of the transistor having the channel region including the surface of the fin FB, in particular the upper end portion and the middle portion of the fin FB. Hence, the graph of the broken line in FIG. 44 can be entirely shifted to the right side of the drawing. It is therefore possible to prevent the graph of the solid line from intersecting with the graph of the broken line, i.e., to prevent occurrence of the kink phenomenon.

Although the threshold voltage of the transistor having the channel region including the surface of the fin FB is increased due to formation of the semiconductor region SRC illustrated in FIG. 40, the current flowing through the high-withstand-voltage transistor QH is not greatly decreased during the on state of that transistor. Hence, the effect described in the first embodiment can also be given in the first modification. That is, the high-withstand-voltage transistor QH having the channel region including the planar portion and the surface of the fin FB is formed to increase the effective gate width so that a size of the semiconductor device is reduced.

Second Modification

Figure 45:
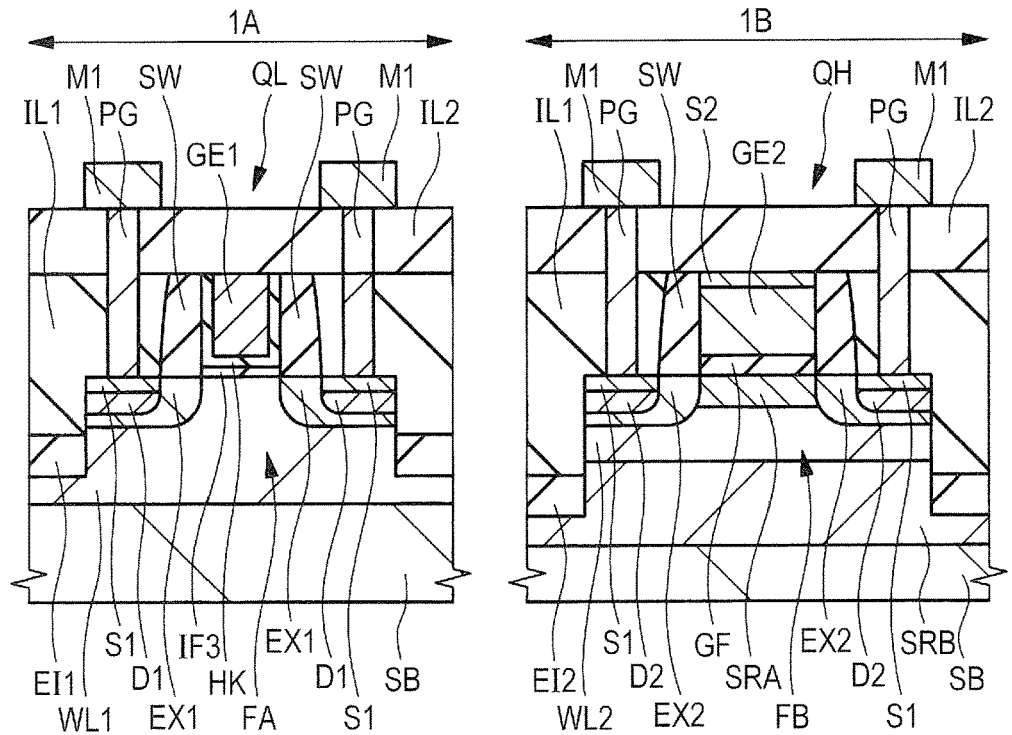
FIG. 45 is a sectional view of a semiconductor device of a second modification of the third embodiment of the invention.
Figure 46:
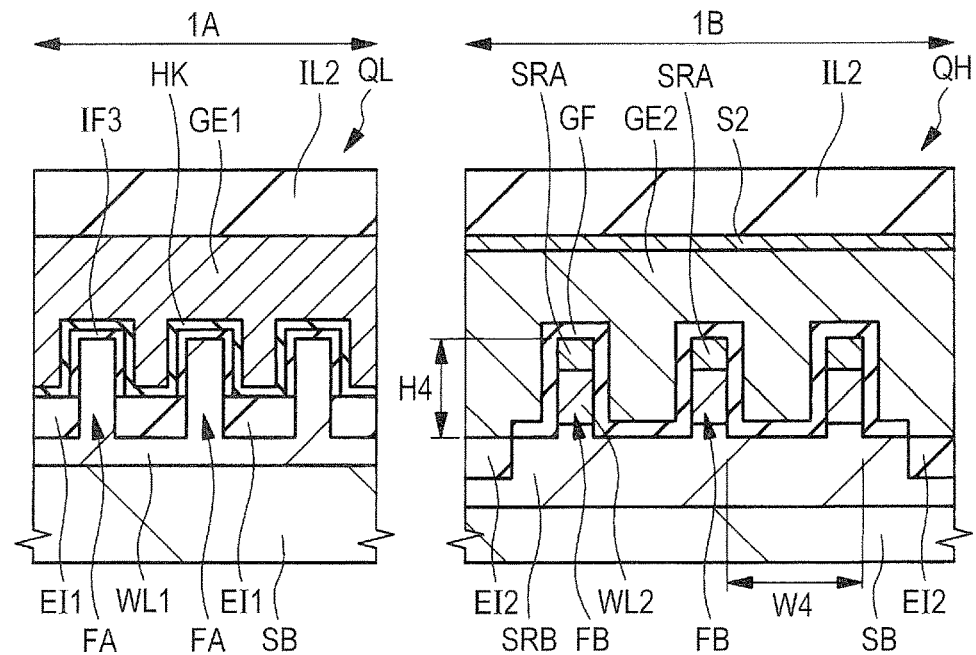
FIG. 46 is a sectional view of the semiconductor device of the second modification of the third embodiment of the invention.
Figure 47:
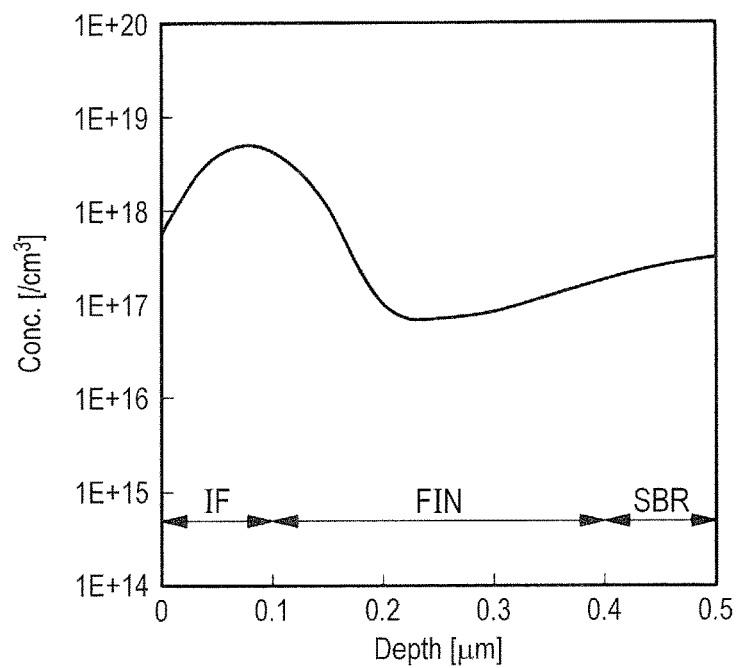
FIG. 47 is a graph showing an impurity concentration in the semiconductor substrate of the second modification of the third embodiment of the invention.

The semiconductor device described with reference to FIGS. 35 to 38 may be combined with the semiconductor device of the second embodiment. A case where the semiconductor device described with reference to FIGS. 35 to 38 is combined with the semiconductor device of the second embodiment is described below with reference to FIGS. 45 to 47. FIGS. 45 and 46 are each a sectional view of the semiconductor device of the second modification. FIG. 47 is a graph showing an impurity concentration in the semiconductor substrate of the second modification. FIG. 45 is a sectional view along the longitudinal direction of the fin as in FIG. 3, and FIG. 46 is a sectional view along the lateral direction of the fin as in FIG. 4.

As illustrated in FIGS. 45 and 46, a relationship H4/W4>0.5 exists between the width W4 and the height H4 in the high-withstand-voltage transistor QH of the second modification. Specifically, the height of the fin FB and the distance between the adjacent fins FB are in a relationship where the height of the fin FB is relatively high, and the distance between the adjacent fins FB is relatively small.

The high-withstand-voltage transistor QH of the second modification is different from the semiconductor device of the first embodiment in that the concentration of the p-type impurity (for example, boron (B)) in the channel region in each of the upper end portion of the fin, the lower end portion of the fin FB, and the planar region is higher than that in the middle portion of the fin FB. That is, a semiconductor region SRA having a higher p-type impurity concentration than the well WL2 in the middle portion of the fin FB is provided in the semiconductor substrate SB in the upper end portion of the fin FB. A semiconductor region SRB having a higher p-type impurity concentration than the well WL2 in the middle portion of the fin FB is provided in the semiconductor substrate SB in the lower end portion of the fin FB and in the planar portion.

Such a semiconductor region SRA or SRB can be formed by anion implantation step performed to form the channel region as described with reference to FIG. 12. Specifically, a plurality of ion implantations are performed, and implantation energy in each implantation step is controlled to prevent the impurity ions from being introduced into the middle portion of the fin FB. Subsequent steps are performed in the same way as the steps described with reference to FIGS. 12 to 29, thereby the semiconductor device of the second modification illustrated in FIGS. 45 and 46 is substantially completed.

FIG. 47 shows a graph showing a relationship between the depth (horizontal axis) and the concentration (vertical axis) of the p-type impurity in a predetermined region of the semiconductor device of the second modification. The graph of FIG. 47 shows distribution of the p-type impurity immediately after formation of the semiconductor regions SRA and SRB.

As illustrated in FIG. 47, the upper end portion and the lower end portion of the fin FB and the planar portion of the semiconductor substrate SB each have a particularly high p-type impurity concentration in the semiconductor substrate SB including the inside of the fin FB. In other words, the average (first concentration) of the impurity concentration of the upper end portion of the fin FB, the average (third concentration) of the impurity concentration of the lower end portion of the fin FB, and the average (fourth concentration) of the impurity concentration of the planar portion are each higher than the average (second concentration) of the impurity concentration of the middle portion of the fin FB. Such concentration distribution of the impurity in the semiconductor substrate SB is given not only immediately after formation of the semiconductor regions SRA and SRB by the ion implantation step but also in the completed semiconductor device.

A graph of the current-voltage characteristics of the high-withstand-voltage transistor QH of the second modification has a shape as shown by a solid line in FIG. 39, for example. As illustrated in FIG. 46, in the high-withstand-voltage transistor QH, the width W4 between the adjacent fins FB and the height H4 of the fin FB are in a relationship given by an expression of H4/W4>0.5, and thus the distance between the fins FB is small and the height of the fin FB is relatively high. Hence, a small current flows through the planar portion, and a large current flows through the fin FB.

In addition, as described in the second embodiment, since an electric field tends to be concentrated at the upper end of the fin FB, a transistor having the channel including the upper end (top) of the fin FB has a low threshold voltage. In the second modification, therefore, as described with reference to FIGS. 45 to 47, the high-concentration semiconductor region SRA is formed in the upper end portion of the fin FB to suppress electric field concentration at the upper end portion of the fin FB, and increase the threshold voltage of the transistor having the channel region including the upper end portion of the fin FB. Consequently, occurrence of the kink phenomenon is prevented. In addition, the high-concentration semiconductor region SRB is formed in the lower end portion of the fin FB and in the planar portion, thereby the threshold voltage of the transistor having the channel region including the planar portion is increased.

As a result, the characteristics of the current flowing through the entire high-withstand-voltage transistor QH approaches the current characteristics of the transistor having the channel region including the surface of the fin FB, particularly the side surfaces in the middle portion of the fin FB. Consequently, it is possible to prevent occurrence of the kink phenomenon due to the low threshold voltage of each of the transistors, i.e., the transistor having the channel region including the upper end portion of the fin FB and the transistor having the channel region including the planar portion.

Even if the threshold voltage of a partial transistor configuring the high-withstand-voltage transistor QH is increased in this way, the current flowing through the high-withstand-voltage transistor QH is not greatly decreased during the on state of that transistor. Hence, the effect described in the first embodiment can also be given in the second modification. That is, the high-withstand-voltage transistor QH, which has the channel region including the surface of the fin FB and the planar portion, is formed to increase an effective gate width so that a size of the semiconductor device is reduced.

Third Modification

Figure 48:
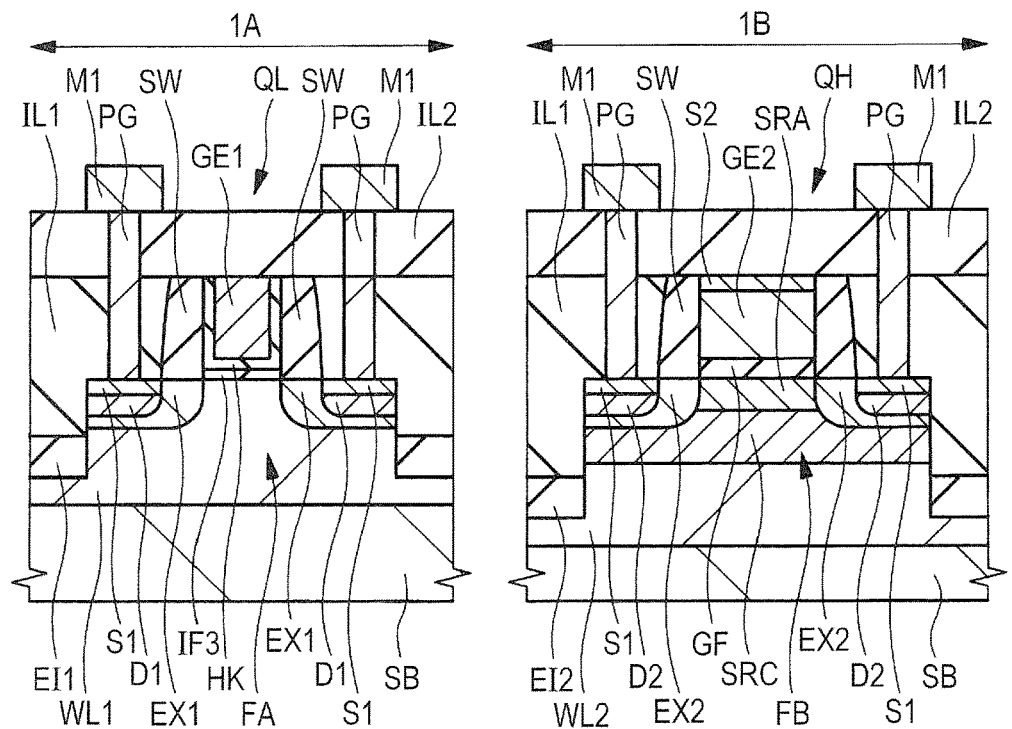
FIG. 48 is a sectional view of a semiconductor device of a third modification of the third embodiment of the invention.
Figure 49:
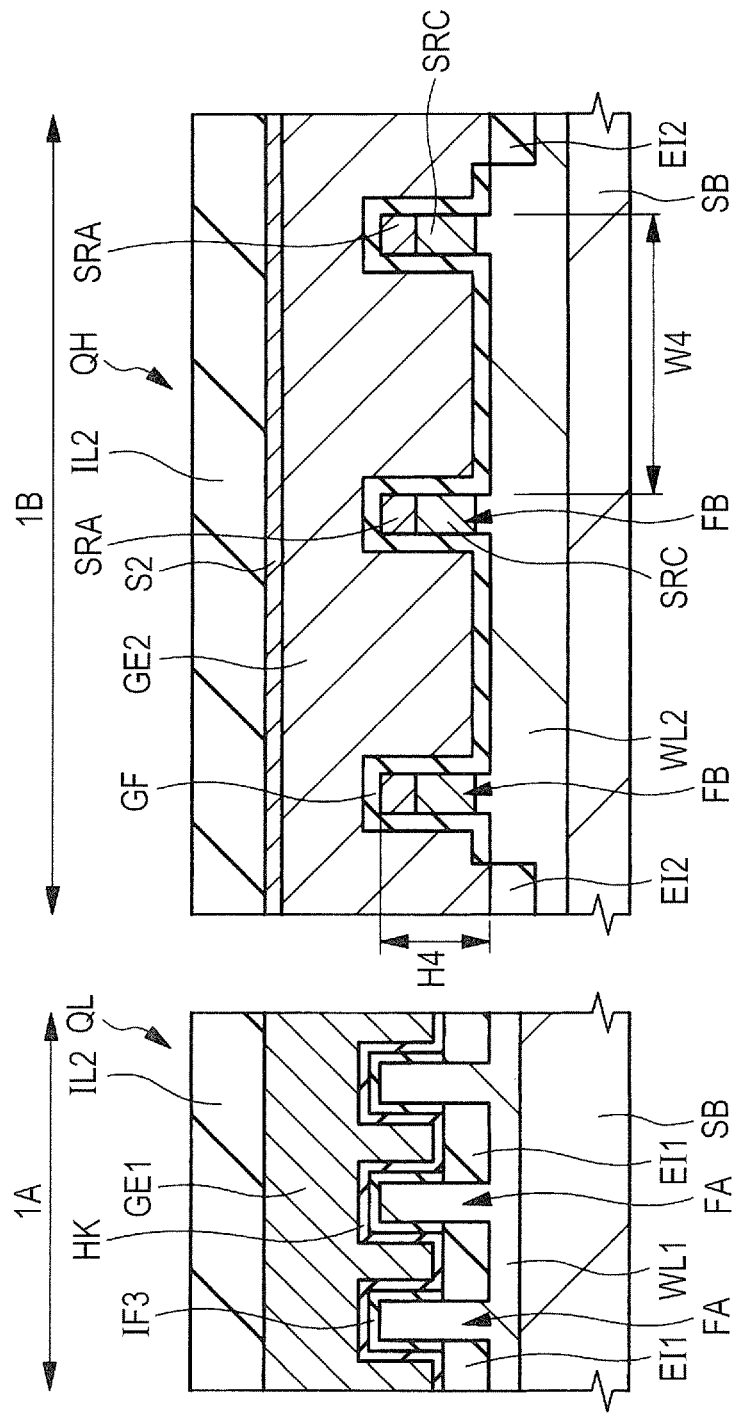
FIG. 49 is a sectional view of the semiconductor device of the third modification of the third embodiment of the invention.

The semiconductor device of the first modification may be combined with the semiconductor device of the second embodiment. A case where the semiconductor device described with reference to FIGS. 40 to 43 is combined with the semiconductor device of the second embodiment is described below with reference to FIGS. 48 and 49. FIGS. 48 and 49 are each a sectional view of the semiconductor device of the third modification. FIG. 48 is a sectional view along the longitudinal direction of the fin as in FIG. 3, and FIG. 49 is a sectional view along the lateral direction of the fin as in FIG. 4.

A case where a relationship of H4/W4<0.5 exists between the width W4 and the height H4 is now described. Specifically, the height of the fin FB and the distance between the adjacent fins FB as illustrated in FIGS. 48 and 49 are in a relationship where the height of the fin FB is relatively low, and the distance between the adjacent fins FB is relatively large.

The semiconductor device of the third modification is different from the semiconductor device of the first embodiment in that in the high-withstand-voltage transistor QH, the concentration of the p-type impurity (for example, boron (B)) in the channel region in each of the upper end portion and the middle portion of the fin FB is higher than that in the channel region in each of the lower end portion of the fin FB and the planar portion.

Specifically, a semiconductor region SRC having a higher p-type impurity concentration than the well WL2 is provided in the semiconductor substrate SB in the middle portion of the fin FB. A semiconductor region SRA having a higher p-type impurity concentration than the semiconductor region SRC is provided in the semiconductor substrate SB in the upper end portion of the fin FB. The semiconductor region SRA is provided in the top of the fin FB, the semiconductor regions SRA and SRC are not provided in each of the lower end portion of the fin FB and the planar portion and also in the low-withstand-voltage transistor region 1A.

Such a semiconductor region SRC can be formed by a plurality of ion implantations by an ion implantation step performed to form the channel region as with the step described with reference to FIG. 37. In the ion implantation, the implantation energy is controlled to be relatively low to prevent the impurity ions from being introduced into the lower end portion of the fin FB and into the planar portion. Subsequent steps are performed in the same way as the steps described with reference to FIGS. 12 to 29, thereby the semiconductor device of the third modification illustrated in FIGS. 48 and 49 is substantially completed.

A graph, which shows a relationship between the depth (horizontal axis) and the concentration (vertical axis) of the p-type impurity in a predetermined region of the semiconductor device of the third modification, has a shape similar to that of the graph of FIG. 43. Specifically, the p-type impurity concentration is highest at the uppermost portion of the fin FB in the semiconductor substrate SB including the inside of the fin FB, and gradually decreases from the upper end of the fin FB to the planar portion. That is, the upper end portion of the fin FB has a p-type impurity concentration that is particularly high in the semiconductor substrate SB including the inside of the fin FB, the middle portion of the fin FB has a p-type impurity concentration that is lower than that of the upper end portion but higher than that of each of the lower end of the fin FB and the planar portion.

In other words, the average (first concentration) of the impurity concentration of the upper end portion of the fin FB is higher than the average (second concentration) of the impurity concentration of the middle portion of the fin FB, the second concentration is higher than each of the average (third concentration) of the impurity concentration of the lower end portion of the fin FB and the average (fourth concentration) of the impurity concentration of the planar portion.

A graph showing a relationship between a gate voltage (horizontal axis) applied to the high-withstand-voltage transistor QH (see FIG. 48) of the second modification and a drain current (vertical axis) flowing through the high-withstand-voltage transistor QH has a shape similar to the solid line graph illustrated in FIG. 44.

In the third modification, the high-concentration semiconductor region SRA is formed in the upper end portion of the fin FB, at which an electric field tends to be concentrated, to increase the threshold voltage of the transistor having the channel region including the upper end portion. In addition, the high-concentration semiconductor region SRC is formed to increase the threshold voltage of the transistor having the channel region including the planar portion. Consequently, occurrence of the kink phenomenon can be prevented.

Although the threshold voltage of the transistor having the channel region including the surface of the fin FB is increased due to formation of the semiconductor regions SRA and SRC, the current flowing through the high-withstand-voltage transistor QH is not greatly decreased during the on state of that transistor. Hence, the effect described in the first embodiment can also be given in the third modification. That is, the high-withstand-voltage transistor QH having the channel region including the planar portion and the surface of the fin FB is formed to increase the effective gate width so that a size of the semiconductor device is reduced.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:
1. A semiconductor device, comprising:
a semiconductor substrate having a first region and a second region in a top of the semiconductor substrate;
a plurality of first protrusions that are part of the semiconductor substrate, protrude from the top of the semiconductor substrate in the first region, extend in a first direction along the top of the semiconductor substrate, and are arranged in a second direction orthogonal to the first direction;
a plurality of second protrusions that are part of the semiconductor substrate, protrude from the top of the semiconductor substrate in the second region, extend in a third direction along the top of the semiconductor substrate, and are arranged in a fourth direction orthogonal to the third direction;
a first element isolation film filling between the first protrusions adjacent to each other and having a top located below a top of each of the first protrusions,
a second element isolation film that exposes the top of the semiconductor substrate between the second protrusions adjacent to each other, and is embedded in a trench formed in the top of the semiconductor substrate around the second protrusions,
a first gate electrode that covers the top and the side surfaces in the second direction of each of the first protrusions with a first insulating film in between;
a second gate electrode that covers the top and the side surfaces in the fourth direction of each of the second protrusions and the top of the semiconductor substrate between the second protrusions adjacent to each other with a second insulating film in between;
a first source region and a first drain region formed in a surface of each first protrusion so as to sandwich the first gate electrode in planar view; and
a second source region and a second drain region formed in a surface of each second protrusion and in the top of the semiconductor substrate between the second protrusions adjacent to each other so as to sandwich the second gate electrode in planar view, wherein the first gate electrode, each first source region, and each first drain region configure a respective first field effect transistor, wherein the second gate electrode, each second source region, and each second drain region together configure a second field effect transistor, and wherein a top of the second element isolation film is located below the top of the first element isolation film in cross-sectional view.

2. The semiconductor device according to claim 1, wherein the top of the second element isolation film is located below a bottom of the first element isolation film in cross-sectional view.

3. The semiconductor device according to claim 1, wherein a width of each first protrusion in the second direction is 50 nm or less, and a width of each second protrusion in the fourth direction is 50 nm or less.

4. The semiconductor device according to claim 1,
wherein each second source region and each second drain region have a first conductivity type, and
wherein in the semiconductor substrate directly below the second gate electrode, concentration of an impurity of a second conductivity type different from the first conductivity type gradually decreases from the top of each second protrusion to a bottom side of said second protrusion opposite to the top of the semiconductor substrate.

5. The semiconductor device according to claim 1, wherein the second field effect transistor operates at a higher voltage than each first field effect transistor.

6. The semiconductor device according to claim 1,
wherein each second source region and each second drain region have a first conductivity type,
wherein each second protrusion includes:
an upper end portion including the top of the respective second protrusion,
a lower end portion, and
a middle portion between the upper end portion and the lower end portion,
wherein concentration of an impurity of a second conductivity type different from the first conductivity type in the upper end portion of each second protrusion is higher than concentration of the impurity of the second conductivity type in the top of the semiconductor substrate between the respective second protrusion and an adjacent one of the second protrusions,
wherein, for each adjacent pair of the second protrusions, one of the adjacent pair has a first side surface and a second side surface on a side opposite to the first side surface,
wherein the other of the adjacent pair has a third side surface and a fourth side surface on a side opposite to the third side surface,
wherein the second side surface and the third side surface are opposed to each other, and
wherein a height from the lower end to the upper end of each second protrusion is larger than a half of a width between the first side surface of the respective second protrusion and the third side surface of the other of the corresponding adjacent pair in the second direction.

7. The semiconductor device according to claim 6, wherein concentration of the impurity of the second conductivity type in the middle portion of each second protrusion is higher than the concentration of the impurity of the second conductivity type in the top of the semiconductor substrate between the respective second protrusion and the adjacent one of the second protrusions.

8. The semiconductor device according to claim 1,
wherein each second source region and each second drain region have a first conductivity type,
wherein each second protrusion includes:
an upper end portion including the top of the respective second protrusion,
a lower end portion, and
a middle portion between the upper end portion and the lower end portion,
wherein concentration of an impurity of a second conductivity type different from the first conductivity type in the top of the semiconductor substrate between one of the second protrusions and an adjacent one of the second protrusions is higher than concentration of the impurity of the second conductivity type in the upper end portion of the respective second protrusion,
wherein, for each adjacent pair of the second protrusions, one of the adjacent pair has a first side surface and a second side surface on a side opposite to the first side surface,
wherein the other of the adjacent pair has a third side surface and a fourth side surface on a side opposite to the third side surface,
wherein the second side surface and the third side surface are opposed to each other, and
wherein a height from the lower end to the upper end of each second protrusion is smaller than a half of a width between the first side surface of the respective second protrusion and the third side surface of the other of the corresponding adjacent pair in the second direction.

9. The semiconductor device according to claim 1,
wherein each second source region and each second drain region have a first conductivity type,
wherein each second protrusion includes:
an upper end portion including the top of the respective second protrusion,
a lower end portion, and
a middle portion between the upper end portion and the lower end portion,
wherein concentration of an impurity of a second conductivity type different from the first conductivity type in the top of the semiconductor substrate between one of the second protrusions and an adjacent one of the second protrusion and concentration of the impurity of the second conductivity type in the upper end portion of the respective second protrusion are each higher than concentration of the impurity of the second conductivity type in the middle portion of the respective second protrusion,
wherein, for each adjacent pair of the second protrusions, one of the adjacent pair has a first side surface and a second side surface on a side opposite to the first side surface,
wherein the other of the adjacent pair has a third side surface and a fourth side surface on a side opposite to the third side surface,
wherein the second side surface and the third side surface are opposed to each other, and
wherein a height from the lower end to the upper end of each second protrusion is smaller than a half of a width between the first side surface of the respective second protrusion and the third side surface of the other of the corresponding adjacent pair in the second direction.

10. The semiconductor device according to claim 1, wherein the second field effect transistor has a channel region that is continuously provided over the surfaces of the second protrusions and the top of the semiconductor substrate between the second protrusions adjacent to each other.

11. The semiconductor device according to claim 1, wherein a thickness of the second insulating film is larger than a thickness of the first insulating film.

12. A method of manufacturing a semiconductor device, the method comprising:
- (a) providing a semiconductor substrate having a first region and a second region in a top of the semiconductor substrate;
- (b) retracting a part of the top of the semiconductor substrate, thereby forming:
  - a plurality of first protrusions in the first region, the first protrusions being part of the semiconductor substrate, protruding from the part of the top of the semiconductor substrate, extending in a first direction along the top of the semiconductor substrate, and arranged in a second direction orthogonal to the first direction, and
  - a plurality of second protrusions in the second region, the second protrusions being part of the semiconductor substrate, protruding from the part of the top of the semiconductor substrate, extending in a third direction along the top of the semiconductor substrate, and arranged in a fourth direction orthogonal to the third direction;
- (c) forming a trench in the top of the semiconductor substrate around the second protrusions in the second region;
- (d) forming a first element isolation film that fills between the first protrusions adjacent to each other and has a top located below a top of each of the first protrusions, and forming a second element isolation film that is embedded in the trench and exposes the top of the semiconductor substrate between the second protrusions adjacent to each other;
- (e) forming a first gate electrode that covers the top and side surfaces of each of the first protrusions with a first insulating film in between;
- (f) forming a second gate electrode that covers the top and the side surfaces of each of the second protrusions and the top of the semiconductor substrate between the second protrusions adjacent to each other with a second insulating film in between; and
- (g) forming a first source region and a first drain region in a surface of each of the first protrusions, and forming a second source region and a second drain region in the surface of each of the second protrusions and in the top of the semiconductor substrate between the second protrusions adjacent to each other;

wherein the first gate electrode, each first source region, and each first drain region configure a respective first field effect transistor, wherein the second gate electrode, each second source region, and each second drain region configure a respective second field effect transistor, and wherein a top of the second element isolation film is located below the top of the first element isolation film in cross-sectional view.

13. The method according to claim 12, wherein the top of the second element isolation film is located below a bottom of the first element isolation film in cross-sectional view.

14. The method according to claim 12, wherein (d) includes:
- (d1) forming a third insulating film filling between the first protrusions adjacent to each other and between the second protrusions adjacent to each other;
- (d2) retracting a top of the third insulating film in the first region, thereby forming the first element isolation film from the third insulating film; and
- (d3) after (d2), retracting a top of the third insulating film in the second region, thereby forming the second element isolation film from the third insulating film.

15. The method according to claim 12, wherein the second field effect transistor operates at a higher voltage than each first field effect transistor.

* * * * *